(12) United States Patent
Lu et al.

(10) Patent No.: US 12,193,241 B2
(45) Date of Patent: *Jan. 7, 2025

(54) FERROELECTRIC MEMORY DEVICE AND METHOD OF FORMING THE SAME

(71) Applicant: Taiwan Semiconductor Manufacturing Company, Ltd., Hsin-Chu (TW)

(72) Inventors: Chun-Chieh Lu, Taipei (TW); Sai-Hooi Yeong, Zhubei (TW); Bo-Feng Young, Taipei (TW); Yu-Ming Lin, Hsinchu (TW); Chih-Yu Chang, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/336,105

(22) Filed: Jun. 16, 2023

(65) Prior Publication Data

US 2023/0328997 A1 Oct. 12, 2023

Related U.S. Application Data

(62) Division of application No. 17/117,570, filed on Dec. 10, 2020, now Pat. No. 11,729,986.

(Continued)

(51) Int. Cl.
  *H10B 51/20* (2023.01)
  *H01L 21/02* (2006.01)
  (Continued)

(52) U.S. Cl.
  CPC ....... *H10B 51/20* (2023.02); *H01L 21/02565* (2013.01); *H01L 29/24* (2013.01); *H10B 51/30* (2023.02)

(58) Field of Classification Search
  CPC .... H10B 51/20; H10B 51/30; H01L 21/02565
  See application file for complete search history.

(56) References Cited

U.S. PATENT DOCUMENTS 6,204,158 B1   3/2001  Hendrix et al.
9,847,342 B2 * 12/2017  Nagashima ............ H10B 41/10
(Continued)

FOREIGN PATENT DOCUMENTS

KR   20180059271 A   6/2018
KR   20190036077 A   4/2019
(Continued)

OTHER PUBLICATIONS

Non-Final Office Action dated Aug. 16, 2022 for U.S. Appl. No. 17/117,570.

(Continued)

*Primary Examiner* — Vincent Wall
(74) *Attorney, Agent, or Firm* — Eschweiler & Potashnik, LLC

(57) ABSTRACT

The present disclosure, in some embodiments, relates to a ferroelectric memory device. The ferroelectric memory device includes a multi-layer stack disposed on a substrate. The multi-layer stack has a plurality of conductive layers and a plurality of dielectric layers stacked alternately. A channel layer penetrates through the plurality of conductive layers and the plurality of dielectric layers. A ferroelectric layer is disposed between the channel layer and both of the plurality of conductive layers and the plurality of dielectric layers. A plurality of oxygen scavenging layers are disposed along sidewalls of the plurality of conductive layer. The plurality of oxygen scavenging layers laterally separate the ferroelectric layer from the plurality of conductive layers.

20 Claims, 53 Drawing Sheets

Related U.S. Application Data

(60) Provisional application No. 63/031,045, filed on May 28, 2020.

(51) Int. Cl.
   *H01L 29/24* (2006.01)
   *H10B 51/30* (2023.01)

(56) References Cited

U.S. PATENT DOCUMENTS

| | | | |
|---|---|---|---|
| 10,367,003 | B2 | 7/2019 | Kang et al. |
| 10,727,243 | B1* | 7/2020 | Lue .............. H10B 41/40 |
| 2016/0071860 | A1* | 3/2016 | Kai .............. H10B 43/10 |
| | | | 257/321 |
| 2018/0130823 | A1* | 5/2018 | Kim .............. H01L 29/495 |
| 2018/0286920 | A1* | 10/2018 | Wicklein .............. H10B 63/845 |
| 2018/0350837 | A1* | 12/2018 | Yoo .............. H01L 29/6684 |
| 2019/0326308 | A1* | 10/2019 | Pu .............. H01L 29/7926 |
| 2020/0075631 | A1* | 3/2020 | Dong .............. H01L 29/7827 |
| 2020/0091171 | A1 | 3/2020 | Tokuhira et al. |
| 2020/0212068 | A1* | 7/2020 | Lee .............. H01L 29/66666 |
| 2020/0227727 | A1 | 7/2020 | Li |
| 2021/0066348 | A1* | 3/2021 | Prasad .............. H01L 21/02189 |
| 2021/0074727 | A1* | 3/2021 | Prasad .............. H01L 29/78391 |
| 2021/0082955 | A1* | 3/2021 | Rajashekhar .......... H10B 51/10 |
| 2021/0082956 | A1* | 3/2021 | Suzuki .............. H10B 51/30 |
| 2021/0375930 | A1* | 12/2021 | Lu .............. H01L 21/383 |
| 2021/0375931 | A1* | 12/2021 | Lu .............. H01L 29/517 |
| 2021/0375933 | A1* | 12/2021 | Lu .............. H01L 21/02565 |
| 2021/0375934 | A1* | 12/2021 | Lu .............. H10B 51/10 |
| 2021/0375935 | A1* | 12/2021 | Ling .............. H10B 51/10 |
| 2021/0375936 | A1* | 12/2021 | Chiang .............. H01L 29/40111 |
| 2022/0285396 | A1* | 9/2022 | Huang .............. H01L 29/516 |
| 2022/0367515 | A1* | 11/2022 | Lu .............. H10B 51/20 |

FOREIGN PATENT DOCUMENTS

| | | |
|---|---|---|
| TW | I673831 B | 10/2019 |
| WO | 2019125352 A1 | 6/2019 |

OTHER PUBLICATIONS

Final Office Action dated Jan. 18, 2023 for U.S. Appl. No. 17/117,570.
Notice of Allowance dated Mar. 23, 2023 for U.S. Appl. No. 17/117,570.

* cited by examiner

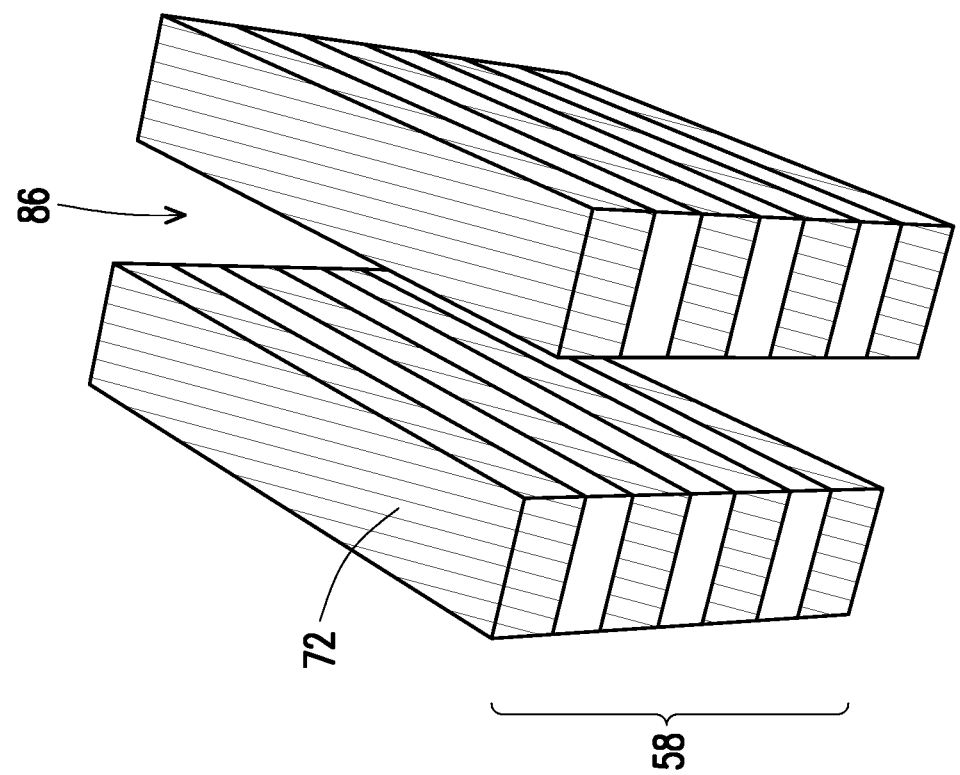

FERROELECTRIC MEMORY DEVICE AND METHOD OF FORMING THE SAME

REFERENCE TO RELATED APPLICATIONS

This Application is a Divisional of U.S. application Ser. No. 17/117,570, filed on Dec. 10, 2020, which claims the benefit of U.S. Provisional Application No. 63/031,045, filed on May 28, 2020. The contents of the above-referenced Patent Applications are hereby incorporated by reference in their entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11, 12, 13, 14, 15A, 15B, 16A, 16B, 17A, 17B, 18A, 18B, 19A, 19B, 20A, 20B, 21A, 21B, 22, 23, 24, 25A, 25B, 26A, 26B, 27A, 27B, 28A, 28B, 29A, 29B, 30A, 30B, 30C, 30D, 30E, 30F, 30G, 30H and 30I illustrate varying views of manufacturing a ferroelectric memory device in accordance with some embodiments.

DETAILED DESCRIPTION

Figure 1A:
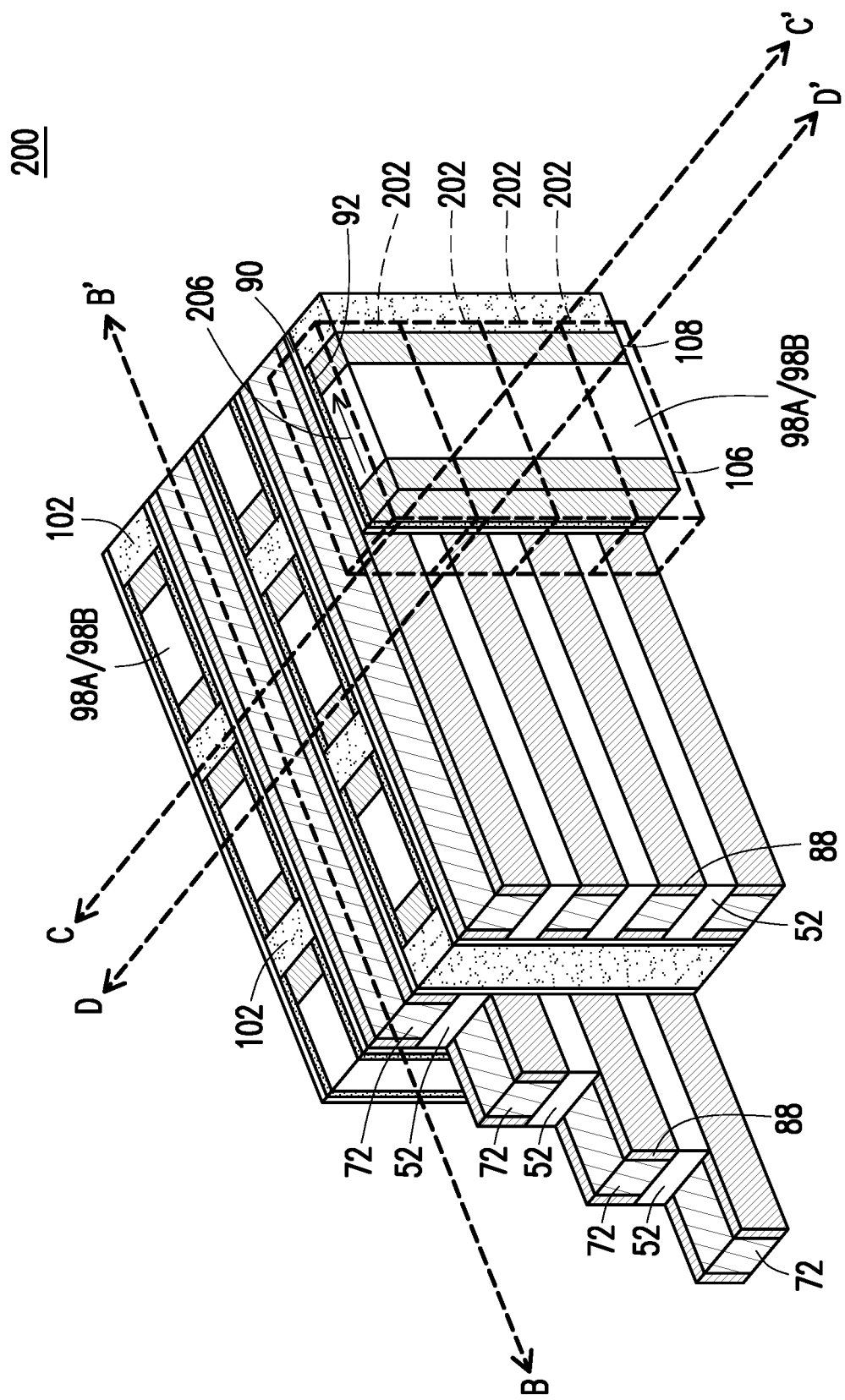
FIGS. 1A, 1B, and 1C illustrate a simplified perspective view, a circuit diagram, and a top down view of a ferroelectric memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory device such as a 3D memory array. In some embodiments, the 3D memory array is a ferroelectric field effect transistor (FeFET) memory circuit including a plurality of vertically stacked memory cells. In some embodiments, each memory cell is regarded as a FeFET that includes a word line region acting as a gate electrode, a bit line region acting as a first source/drain electrode, and a source line region acting as a second source/drain electrode, a ferroelectric material as a gate dielectric, and an oxide semiconductor (OS) as a channel region. In some embodiments, each memory cell is regarded as a transistor, for example, a thin film transistor (TFT).

Figure 1B:
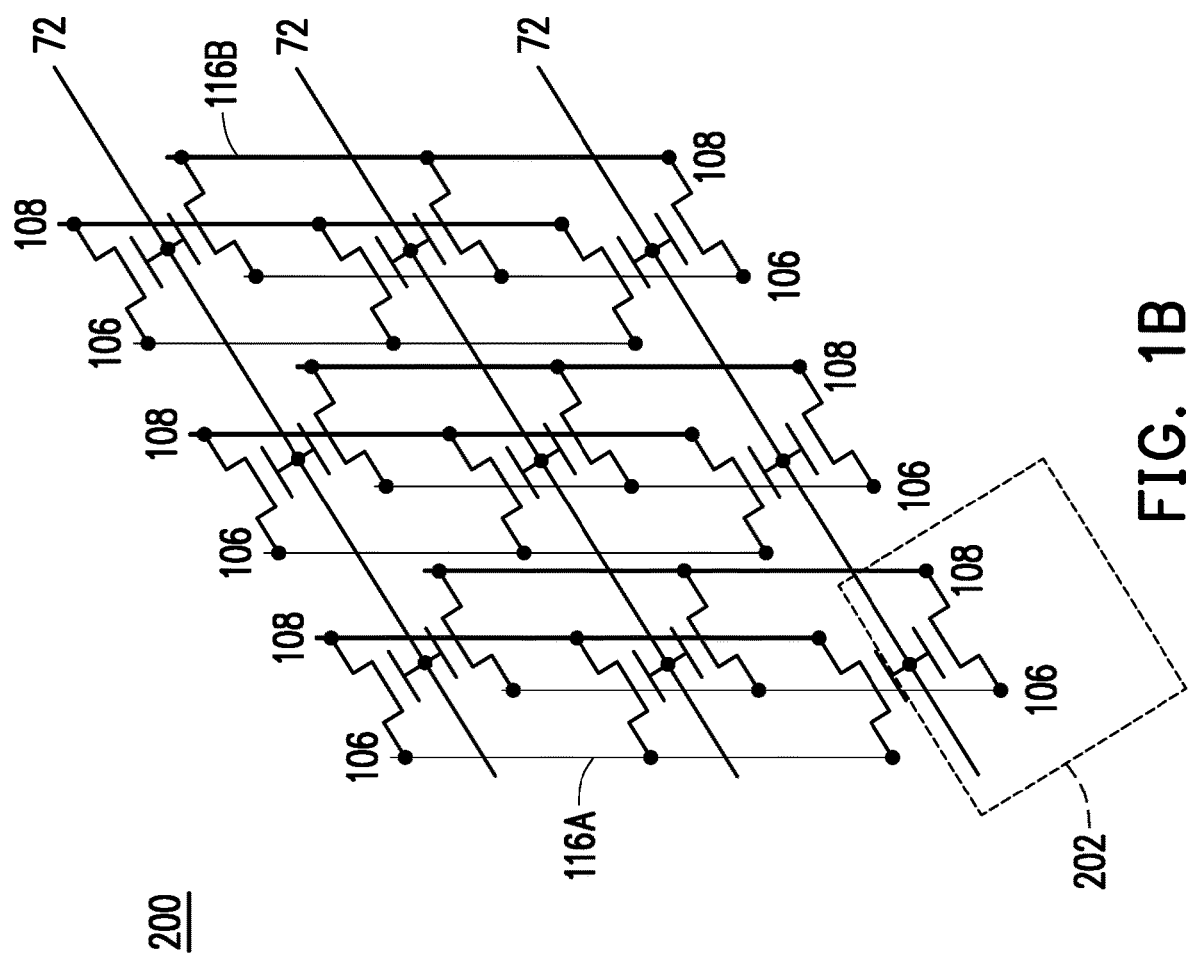
Figure 1C:
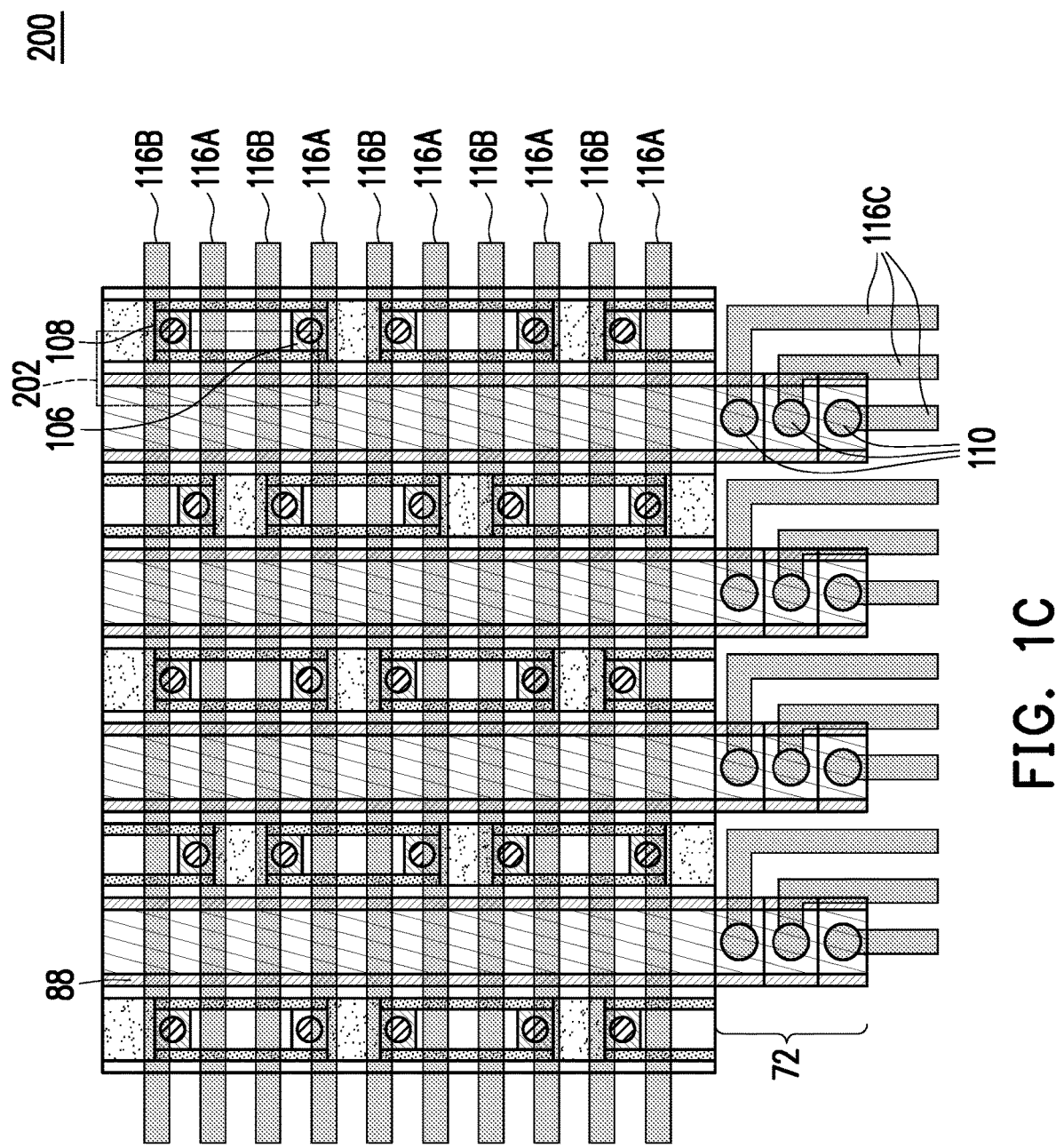

FIGS. 1A, 1B, and 1C illustrate examples of a memory array according to some embodiments. FIG. 1A illustrates an example of a portion of a simplified ferroelectric memory device 200 in a partial three-dimensional view; FIG. 1B illustrates a circuit diagram of the ferroelectric memory device 200; and FIG. 1C illustrates a top down view of the ferroelectric memory device 200 in accordance with some embodiments. The ferroelectric memory device 200 includes a plurality of memory cells 202, which may be arranged in a grid of rows and columns. The memory cells 202 may further stacked vertically to provide a three dimensional memory array, thereby increasing device density. The ferroelectric memory device 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the ferroelectric memory device 200 is a flash memory array, such as a NOR memory array, or the like. In some embodiments, a gate of each memory cell 202 is electrically coupled to a respective word line (e.g., conductive line 72), a first source/drain region of each memory cell 202 is electrically coupled to a respective bit line (e.g., conductive line 116B), and a second source/drain region of each memory cell 202 is electrically coupled to a respective source line (e.g., conductive line 116A), which electrically couples the second source/drain region to ground. The memory cells 202 in a same horizontal row of the ferroelectric memory device 200 may share a common word line while the memory cells 202 in a same vertical column of the ferroelectric memory device 200 may share a common source line and a common bit line.

The ferroelectric memory device 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with a topmost one of the conductive lines 72 being the shortest and a bottommost one of the conductive lines 72 being the longest. Respective lengths of the conductive lines 72 may increase in a direction towards the underlying substrate. In this manner, a portion of each of the conductive lines 72 may be accessible from above the ferroelectric memory device 200, and conductive contacts may be made to contact exposed portions of the conductive lines 72, respectively.

The ferroelectric memory device 200 further includes conductive pillars 106 (e.g., electrically connected to bit lines) and conductive pillars 108 (e.g., electrically connected to source lines) arranged alternately. The conductive pillars 106 and 108 may each extend in a direction perpendicular to the conductive lines 72. A dielectric material 98A/98B is disposed between and isolates adjacent ones of the conductive pillars 106 and the conductive pillars 108.

Pairs of the conductive pillars 106 and 108 along with an intersecting conductive line 72 define boundaries of each memory cell 202, and an isolation pillar 102 is disposed between and isolates adjacent pairs of the conductive pillars 106 and 108. In some embodiments, the conductive pillars 108 are electrically coupled to ground. Although FIG. 1A illustrates a particular placement of the conductive pillars 106 relative the conductive pillars 108, it should be appreciated that the placement of the conductive pillars 106 and 108 may be exchanged in other embodiments.

In some embodiments, the ferroelectric memory device 200 may also include an oxide semiconductor (OS) material as a channel layer 92. The channel layer 92 may provide channel regions for the memory cells 202. For example, when an appropriate voltage (e.g., higher than a respective threshold voltage (Vth) of a corresponding memory cell 202) is applied through a corresponding conductive line 72, a region of the channel layer 92 that intersects the conductive line 72 may allow current to flow from the conductive pillars 106 to the conductive pillars 108 (e.g., in the direction indicated by arrow 206).

In some embodiments, a ferroelectric layer 90 is disposed between the channel layer 92 and each of the conductive lines 72 and the dielectric layers 52, and the ferroelectric layer 90 may serve as a gate dielectric for each memory cell 202. In some embodiments, the ferroelectric layer 90 includes a ferroelectric material, such as a hafnium oxide, hafnium zirconium oxide, silicon-doped hafnium oxide, or the like.

The ferroelectric layer 90 may be polarized in one of two different directions, and the polarization direction may be changed by applying an appropriate voltage differential across the ferroelectric layer 90 and generating an appropriate electric field. The polarization may be relatively localized (e.g., generally contained within each boundaries of the memory cells 202), and a continuous region of the ferroelectric layer 90 may extend across a plurality of memory cells 202. Depending on a polarization direction of a particular region of the ferroelectric layer 90, a threshold voltage of a corresponding memory cell 202 varies, and a digital value (e.g., 0 or 1) can be stored. For example, when a region of the ferroelectric layer 90 has a first electrical polarization direction, the corresponding memory cell 202 may have a relatively low threshold voltage, and when the region of the ferroelectric layer 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

In some embodiments, due to high-temperature annealing or thermal processes in different stages of forming a memory array, the channel layer (e.g., oxide semiconductor layer) and the ferroelectric layer (e.g., metal oxide layer) may have an undesired interfacial layer (e.g., oxygen-rich metal oxide layer) formed therebetween. In some embodiments, the interfacial layer may completely cover a surface of the ferroelectric layer that faces the channel layer. The quality of such interfacial layer may have lots of defects and impact the device performance, e.g., Vth shifting and lower endurance. The oxygen in the interfacial layer can be absorbed by an oxygen scavenging layer 88 disposed between the ferroelectric layer 90 (e.g., metal oxide layer) and each conductive line 72 (e.g., metal layer). The oxygen scavenging layer 88 may absorb the oxygen in the interfacial layer through a "direct scavenging mechanism" or a "remote scavenging mechanism", which will be described in details below, see FIG. 30C and FIG. 30D. Accordingly, an interfacial-layer-free memory device can be achieved and the oxide semiconductor surface channel quality can be improved.

In some embodiments, the oxygen scavenging layer 88 may cover sidewalls of the conductive lines 72. In some such embodiments, the oxygen scavenging layer 88 may comprise discrete segments that are vertically separated from one another by the dielectric layers 52. In some embodiments, the discrete segments are disposed along opposing sidewalls of respective ones of the conductive lines 72. In some embodiments, the ferroelectric layer 90 may continuously and vertically extend past upper and lower surfaces of one or more of the discrete segments of the oxygen scavenging layer 88, while the discrete segments of the oxygen scavenging layer 88 may laterally extend past opposing sides of one or more of the conductive pillars 106 and 108.

To perform a write operation on a memory cell 202 in such embodiments, a write voltage is applied across a portion of the ferroelectric layer 90 corresponding to the memory cell 202. In some embodiments, the write voltage is applied, for example, by applying appropriate voltages to a corresponding conductive line 72 (e.g., the word line) and the corresponding conductive pillars 106/108 (e.g., the bit line/source line). In such embodiments, the conductive line 72 is configured to act as a gate electrode layer. By applying the write voltage across the portion of the ferroelectric layer 90, a polarization direction of the region of the ferroelectric layer 90 can be changed. As a result, the corresponding threshold voltage of the corresponding memory cell 202 can also be switched from a low threshold voltage to a high threshold voltage or vice versa, and a digital value can be stored in the memory cell 202. Because the conductive lines 72 intersect the conductive pillars 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the world line). Depending on the polarization direction of the corresponding region of the ferroelectric layer 90, the memory cell 202 may or may not be turned on. As a result, the conductive pillar 106 may or may not be discharged through the conductive pillar 108 (e.g., a source line that is coupled to ground), and the digital value stored in the memory cell 202 can be determined. Because the conductive lines 72 intersect the conductive pillars 106 and 108, individual memory cells 202 may be selected for the read operation.

FIG. 1A further illustrates reference cross-sections of the ferroelectric memory device 200 that are used in later figures. Cross-section B-B' is along a longitudinal axis of conductive lines 72 and in a direction, for example, parallel to the direction of current flow of the memory cells 202. Cross-section C-C' is perpendicular to cross-section B-B' and extends through the dielectric materials 98A/98B and the isolation pillars 102. Cross-section D-D' is perpendicular to cross-section B-B' and extends through the dielectric materials 98A/98B and the conductive pillars 106. Subsequent figures refer to these reference cross-sections for clarity.

Figure 2:
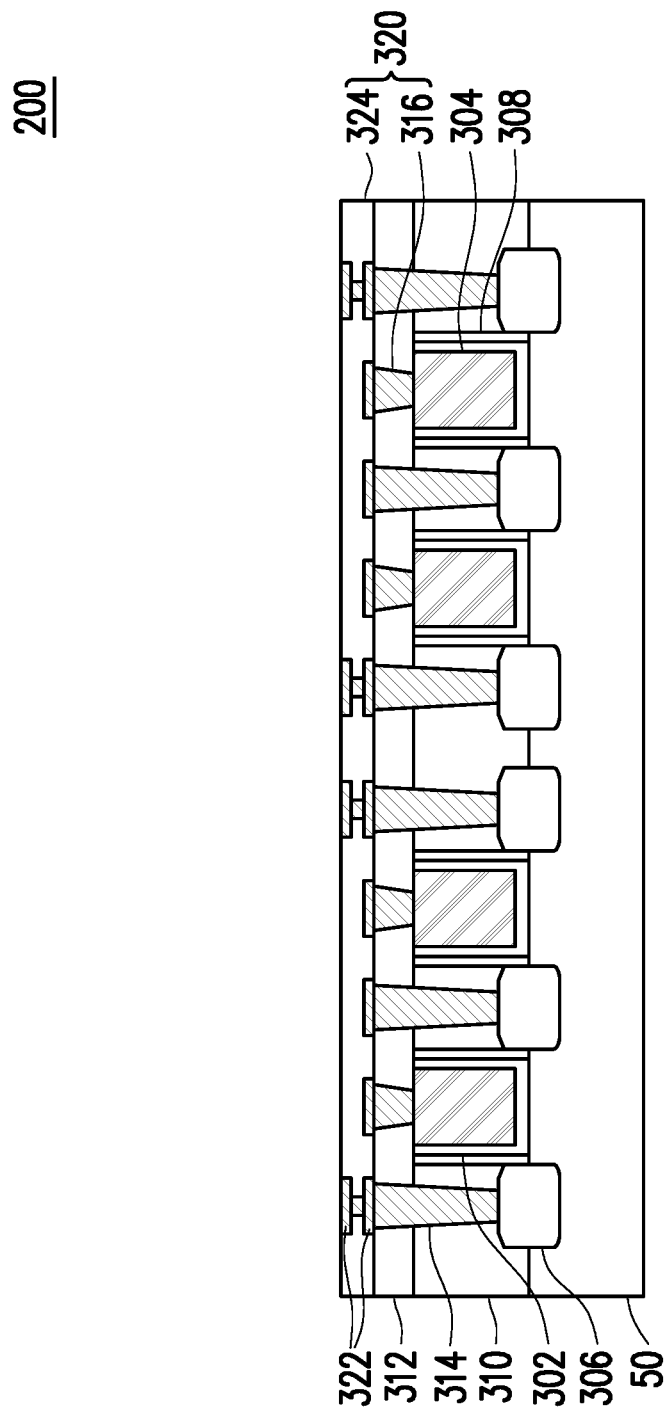

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETs (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306. Gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3:
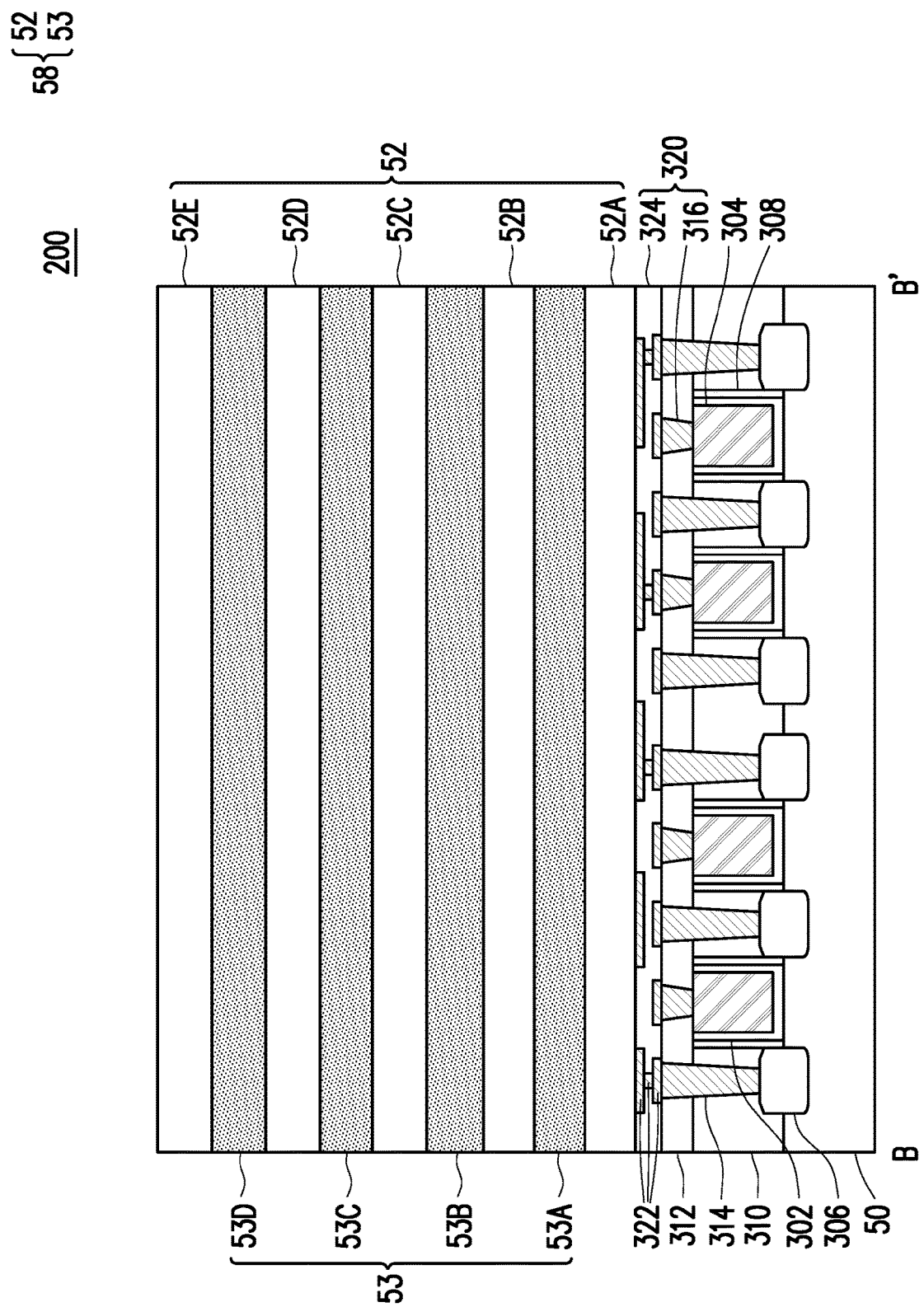

In FIG. 3, a multi-layer stack 58 is formed over the structure of FIG. 2. The substrate 50, the transistors, the ILDs, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more interconnect layers including conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the ferroelectric memory device 200 (see FIGS. 1A and 1B). In some embodiments, one or more interconnect layers including conductive features in insulting layers (e.g., low-k dielectric layers) may be disposed over the multi-layer stack 58.

In FIG. 3, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent stages to define conductive lines 72 (e.g., the word lines). The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIG. 3 illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIGS. 4 through 12 are views of intermediate stages in the manufacturing a staircase structure of the ferroelectric memory device 200, in accordance with some embodiments. FIGS. 4 through 12 are illustrated along reference cross-section B-B' illustrated in FIG. 1A.

Figure 4:
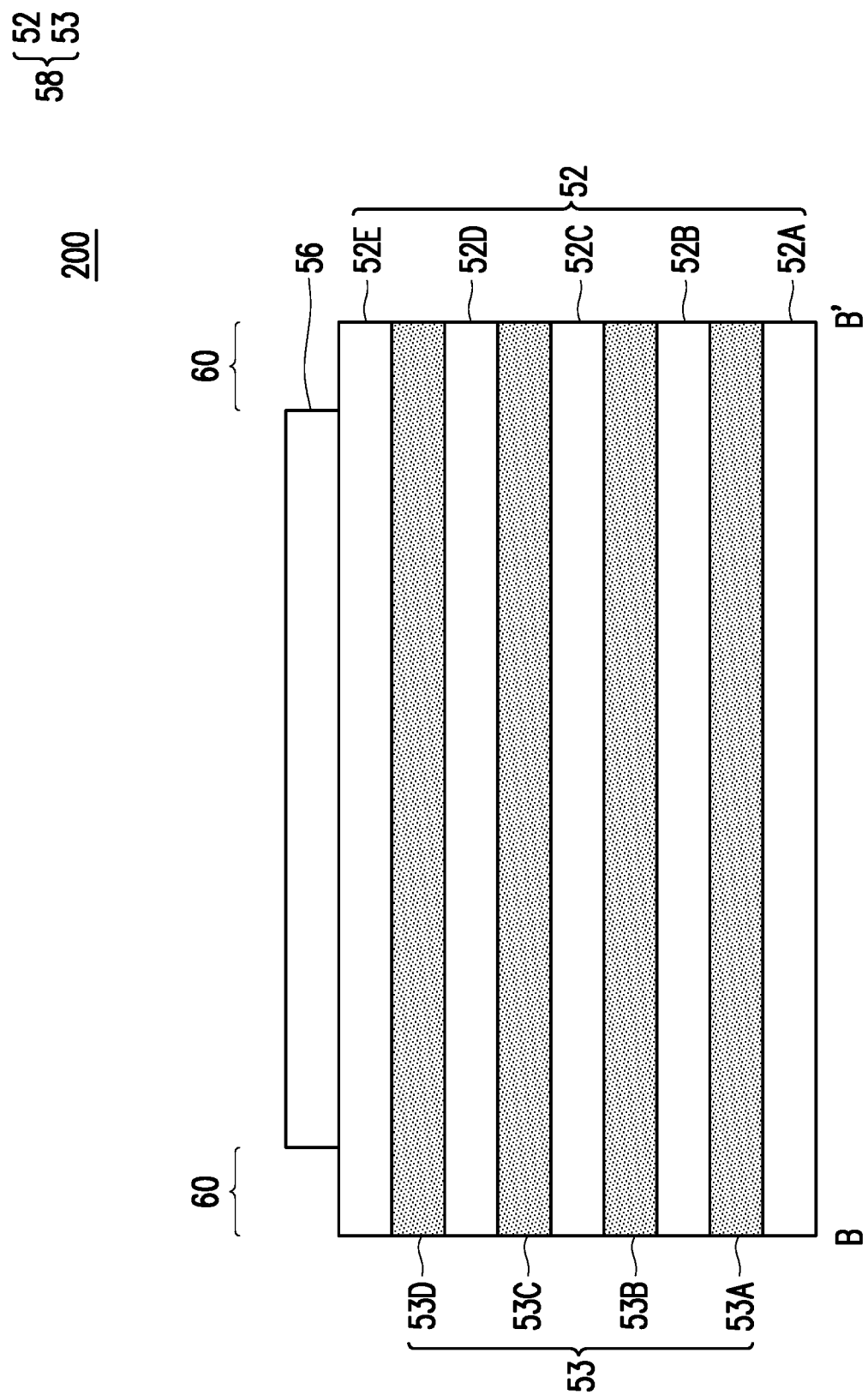

In FIG. 4, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) may be exposed in the regions 60.

Figure 5:
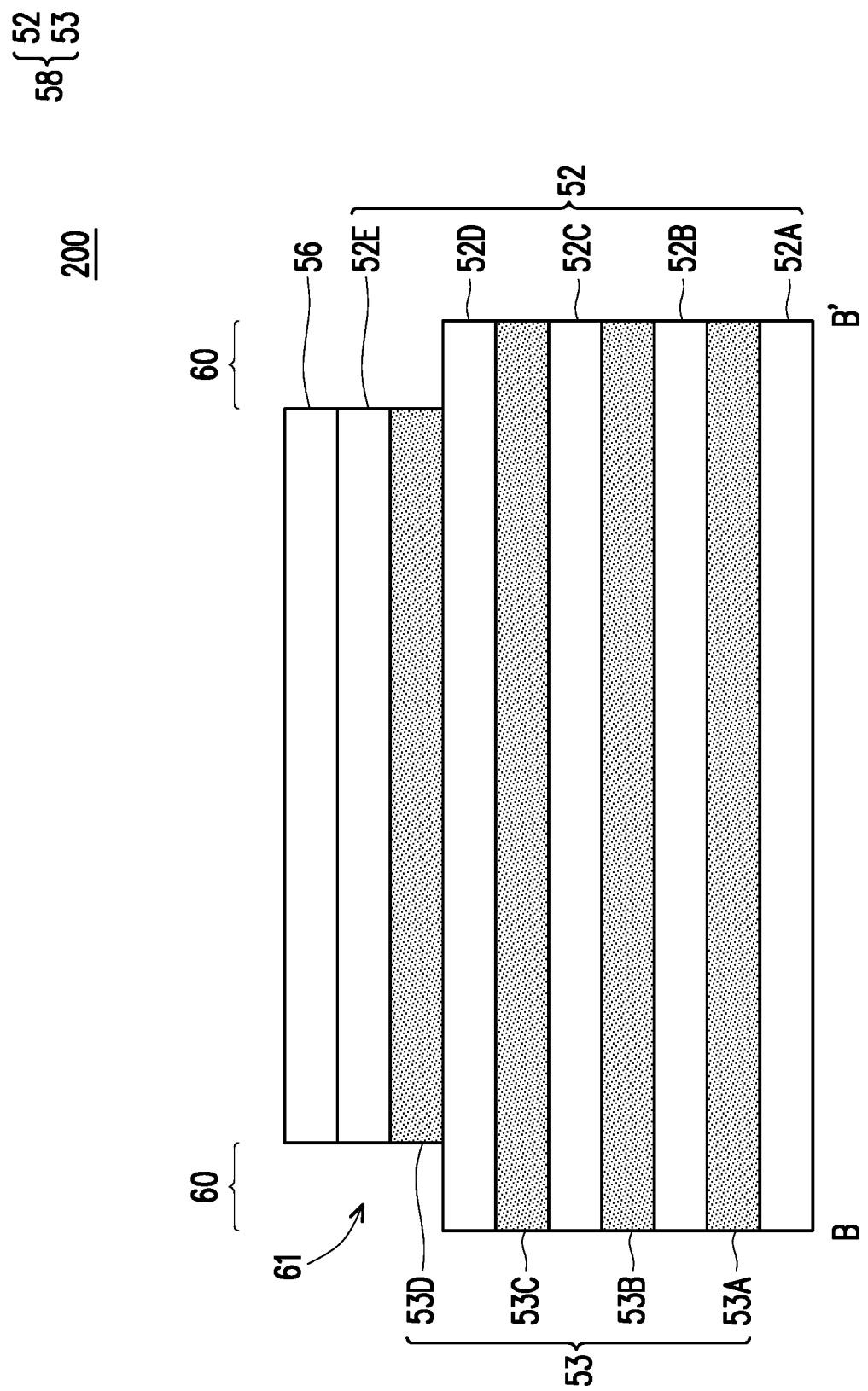

In FIG. 5, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 6:
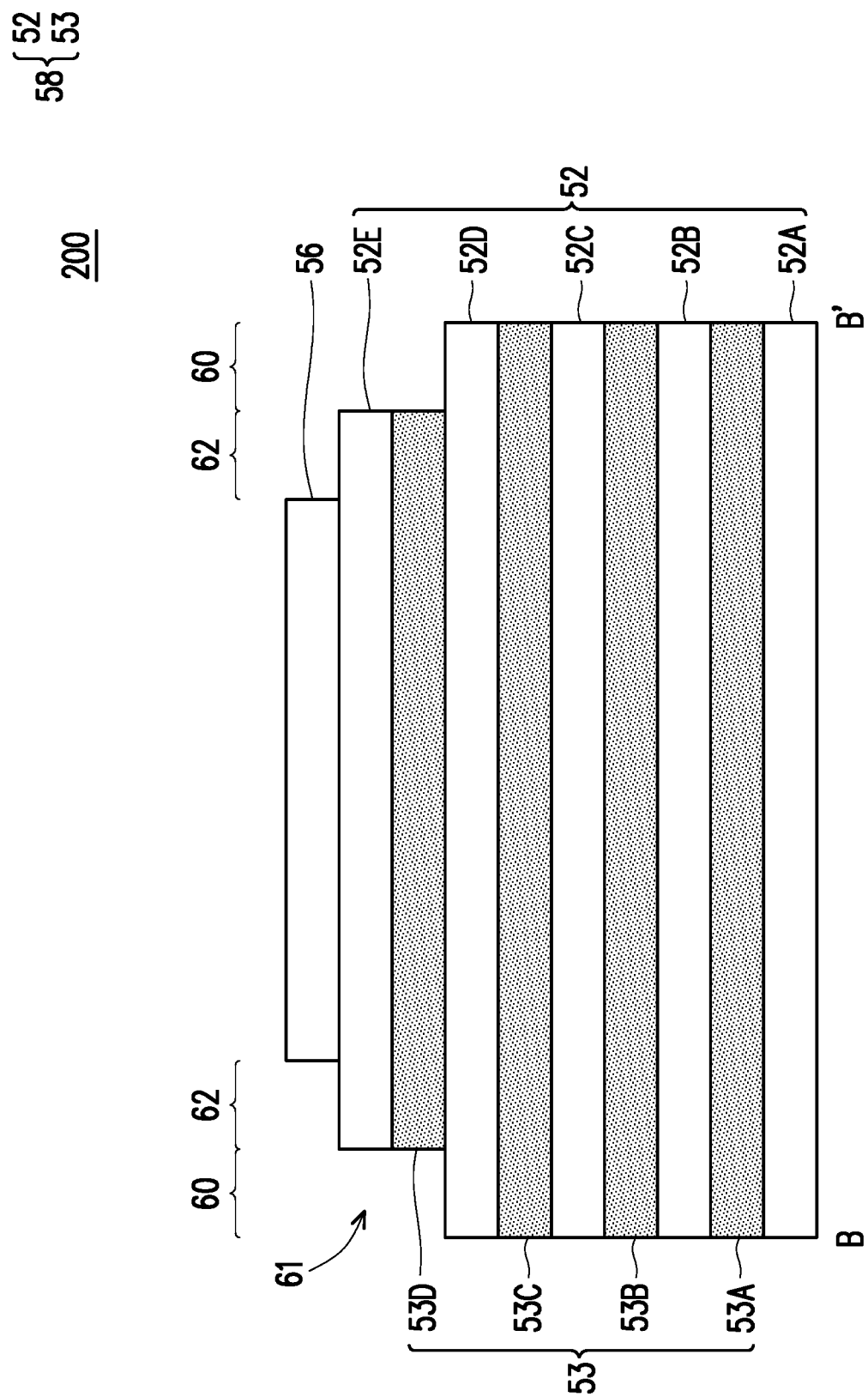

In FIG. 6, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 7:
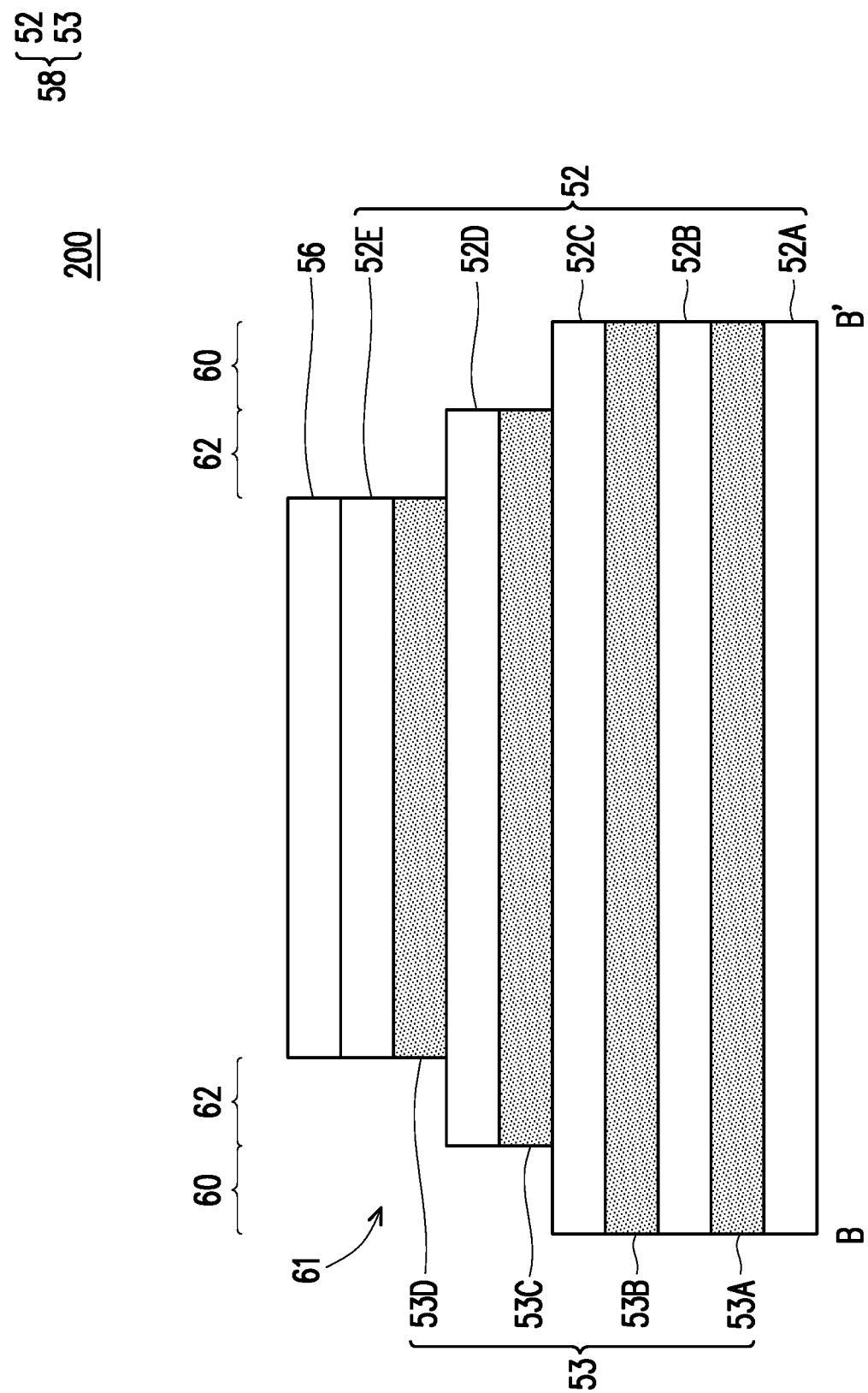

In FIG. 7, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 8:
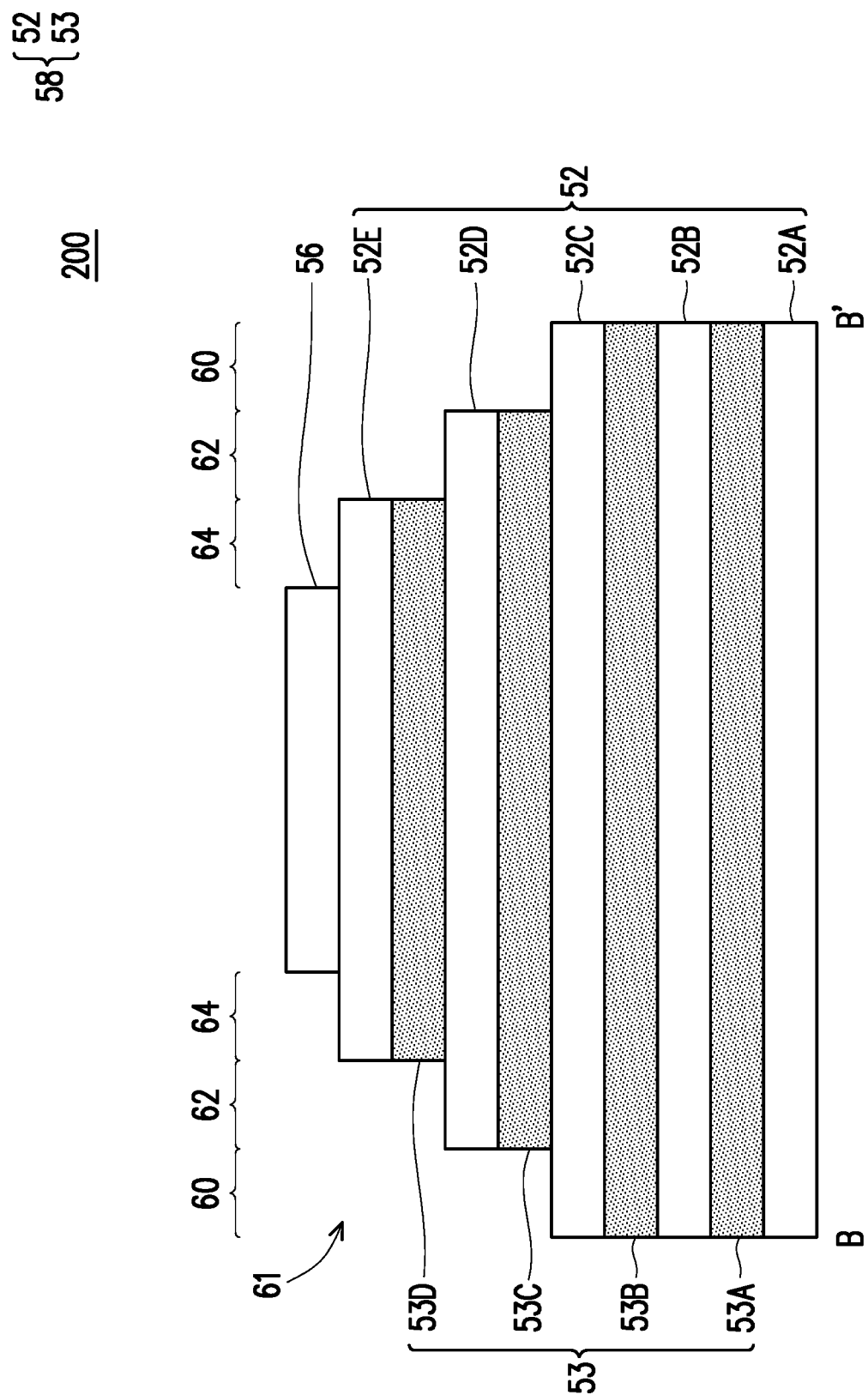

In FIG. 8, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C may be exposed in the regions 60; top surfaces of the dielectric layer 52D may be exposed in the regions 62; and top surfaces of the dielectric layer 52E may be exposed in the regions 64.

Figure 9:
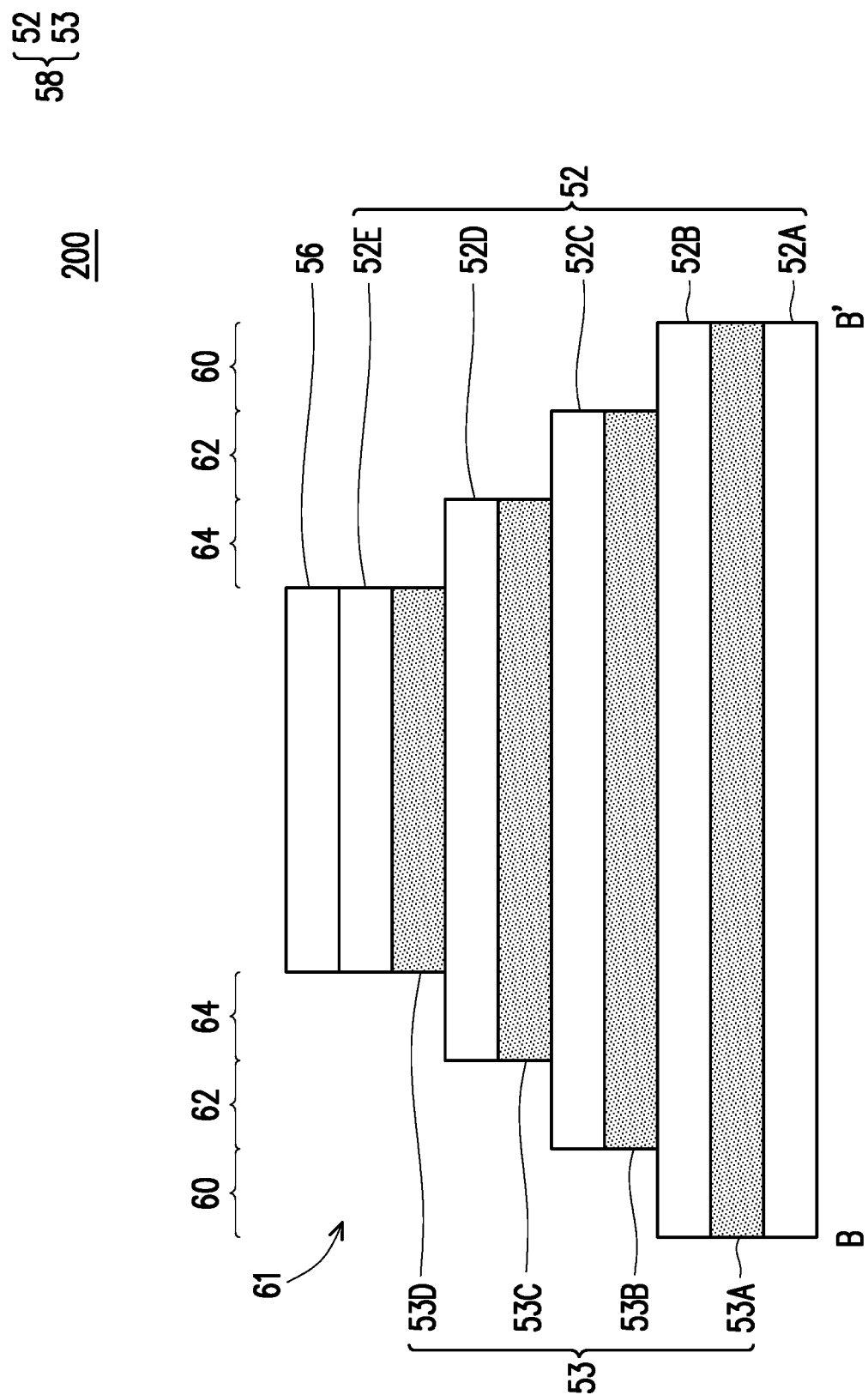

In FIG. 9, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 10:
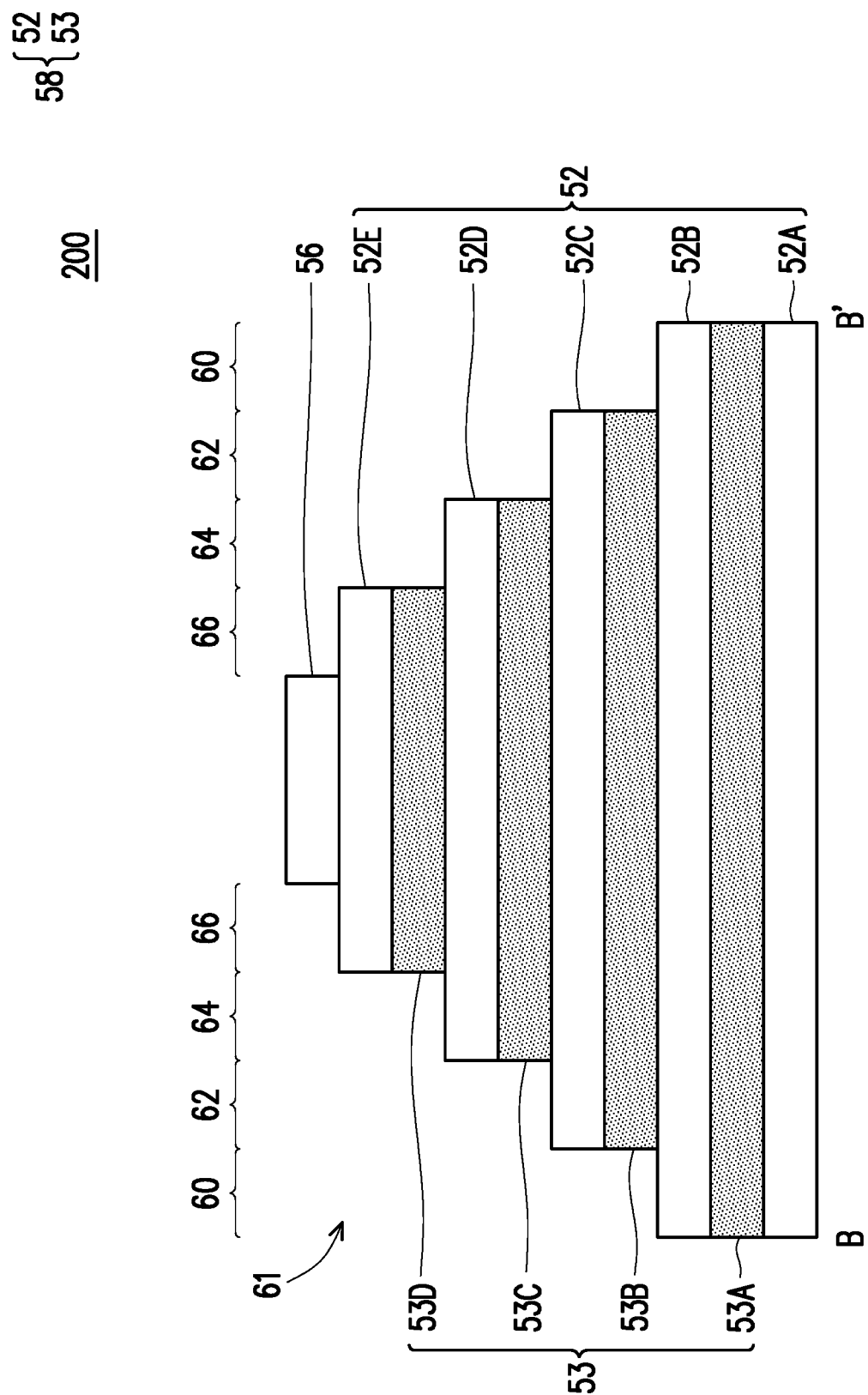

In FIG. 10, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 may be exposed. For example, top surfaces of the dielectric layer 52B may be exposed in the regions 60; top surfaces of the dielectric layer 52C may be exposed in the regions 62; and top surfaces of the dielectric layer 52D may be exposed in the regions 64; and top surfaces of the dielectric layer 52E may be exposed in the regions 66.

Figure 11:
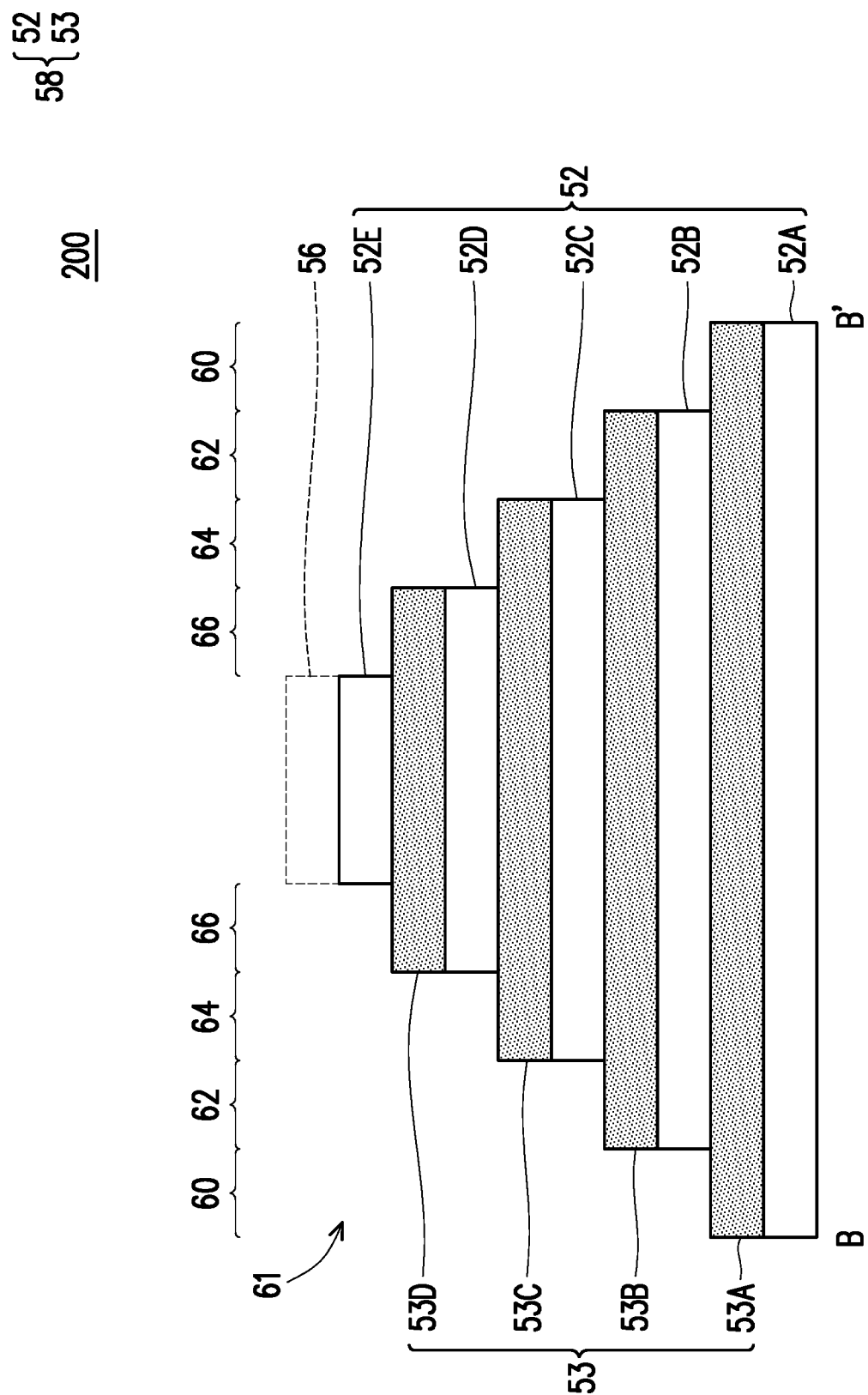

In FIG. 11, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C, 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 12:
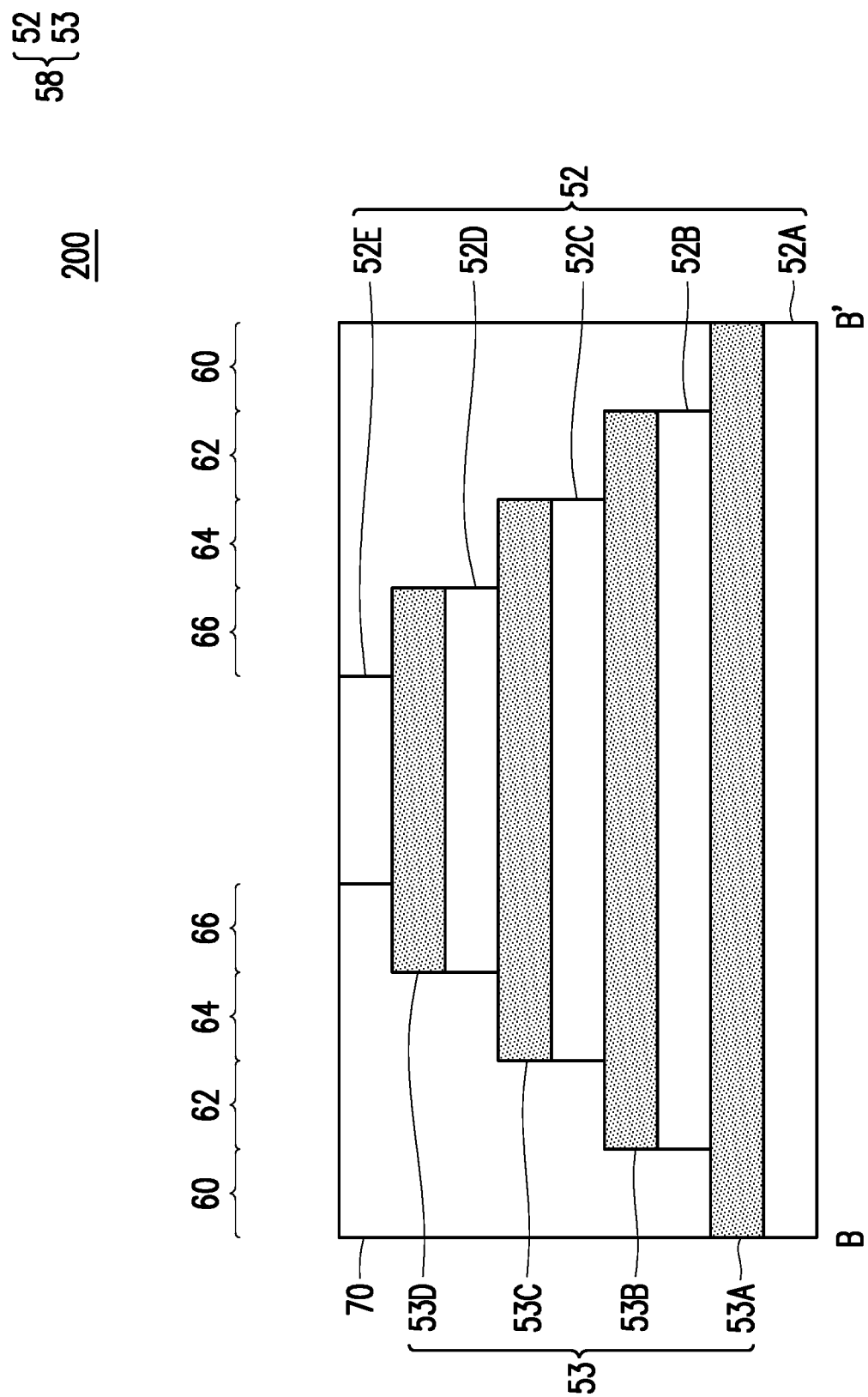

In FIG. 12, an inter-metal dielectric (IMD) 70 is deposited over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may include an oxide (e.g., silicon oxide or the like), a nitride (e.g., silicon nitride or the like), a combination thereof or the like. Other dielectric materials formed by any acceptable process may be used. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

Thereafter, a removal process is applied to the IMD 70 to remove excess dielectric material over the multi-layer stack 58. In some embodiments, the removal process may be a planarization process, such as a chemical mechanical polish (CMP), an etch-back process, combinations thereof, or the like. The planarization process exposes the multi-layer stack 58 such that top surfaces of the multi-layer stack 58 and IMD 70 are level after the planarization process is completed.

As shown in FIG. 12, an intermediate and bulk staircase structure is thus formed. The intermediate staircase structure includes alternating layers of sacrificial layers 53 and dielectric layers 52. The sacrificial layers 53 are subsequently replaced with conductive lines 72, which will be described in details in FIGS. 16A and 16B. Lower conductive lines 72 are longer and extend laterally past upper conductive lines 72, and a width of each of the conductive lines 72 increases in a direction towards the substrate 50 (see FIG. 1A).

FIGS. 13 through 16B are views of intermediate stages in the manufacturing of a memory region of the ferroelectric memory device 200, in accordance with some embodiments. In FIGS. 13 through 16B, the bulk multi-layer stack 58 is patterned to form trenches 86 therethrough, and sacrificial layers 53 are replaced with conductive materials to define the conductive lines 72. The conductive lines 72 may correspond to word lines in the ferroelectric memory device 200, and the conductive lines 72 may further provide gate electrodes for the resulting memory cells of the ferroelectric memory device 200. FIGS. 13, 14, 15B and 16B are illustrated along reference cross-section C-C' illustrated in FIG. 1A. FIGS. 15A and 16A are illustrated in a partial three-dimensional view.

Figure 13:
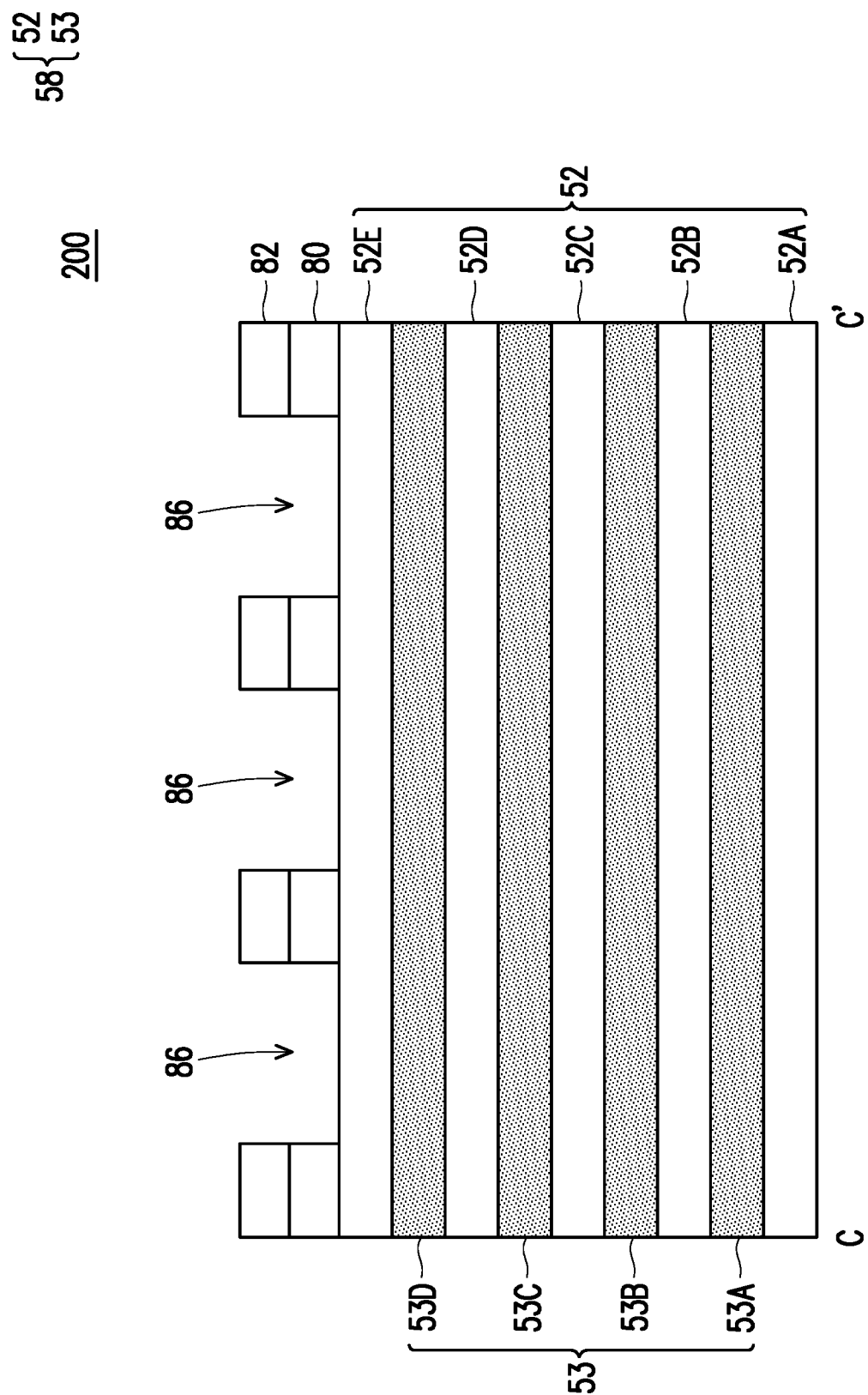

In FIG. 13, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresists is patterned by an acceptable photolithography technique, for example. The patterns of the photoresist patterns 82 are then transferred to the hard mask layer to form hard mask patterns 80 by using an acceptable etching process, such as by a dry etch (e.g., RIE, NBE, the like), a wet etch, the like, or a combination thereof.

The etching may be anisotropic. Thus, trenches 86 are formed extending through the hard mask layer. Thereafter, the photoresist patterns 82 may be optionally removed by an ashing process, for example.

Figure 14:
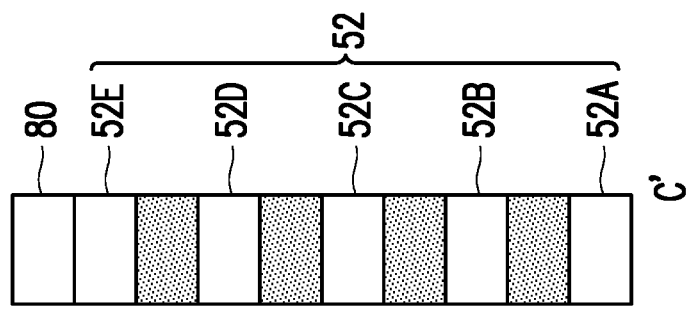
Figure 14:
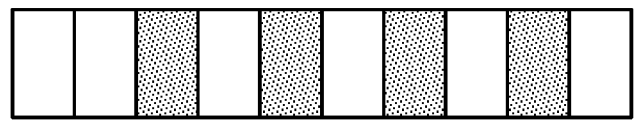
Figure 14:
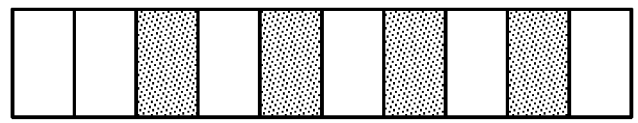
Figure 14:
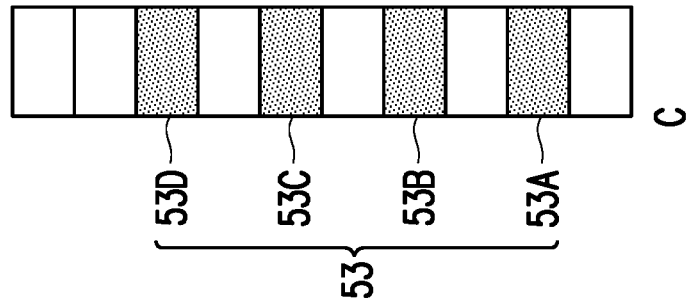
Figure 15A:
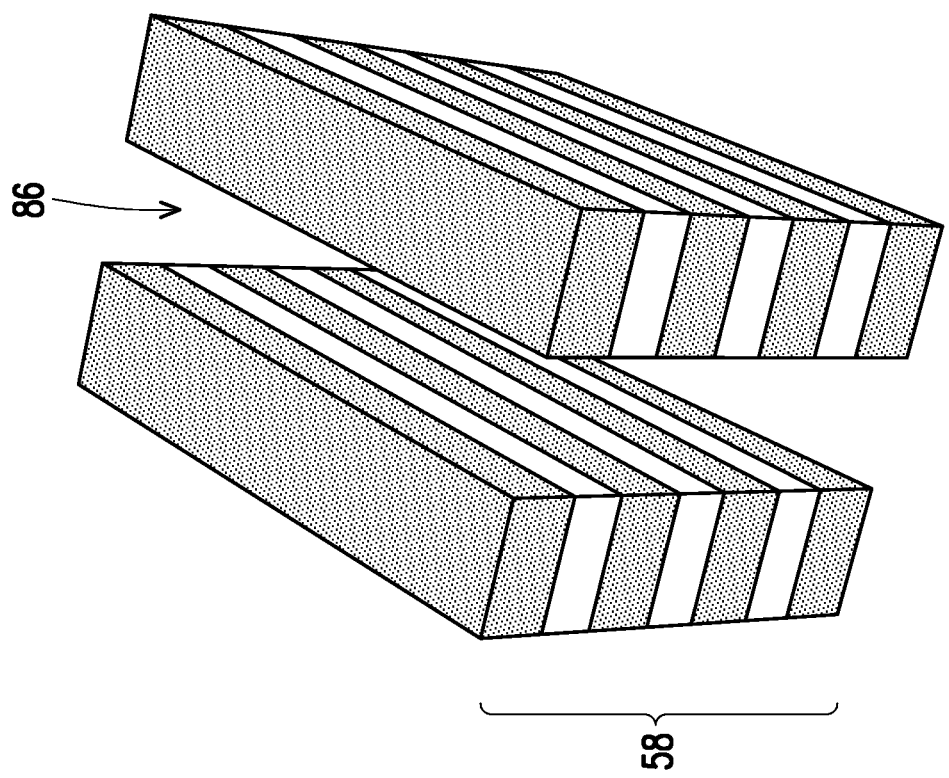
Figure 15B:
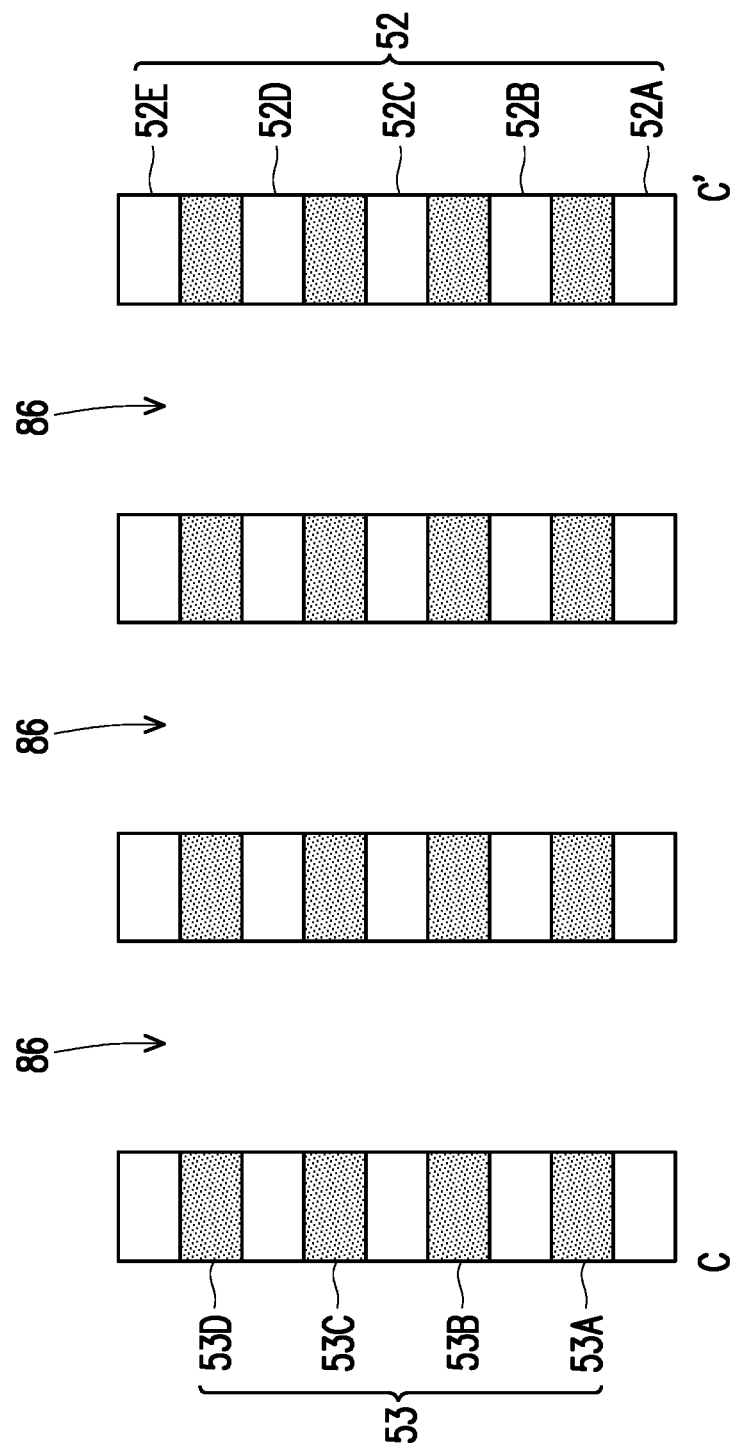

In FIGS. 14 to 15B, the patterns of the hard mask patterns 80 are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 86 extend through the bulk multi-layer stack 58, and strip-shaped sacrificial layers 53 and strip-shaped dielectric layers 52 are accordingly defined. In some embodiments, the trenches 86 extend through the bulk staircase structure, and strip-shaped staircase structures are accordingly defined. The hard mask patterns 80 may be then removed by an acceptable process, such as a wet etching process, a dry etching process, a planarization process, combinations thereof, or the like.

Figure 16B:
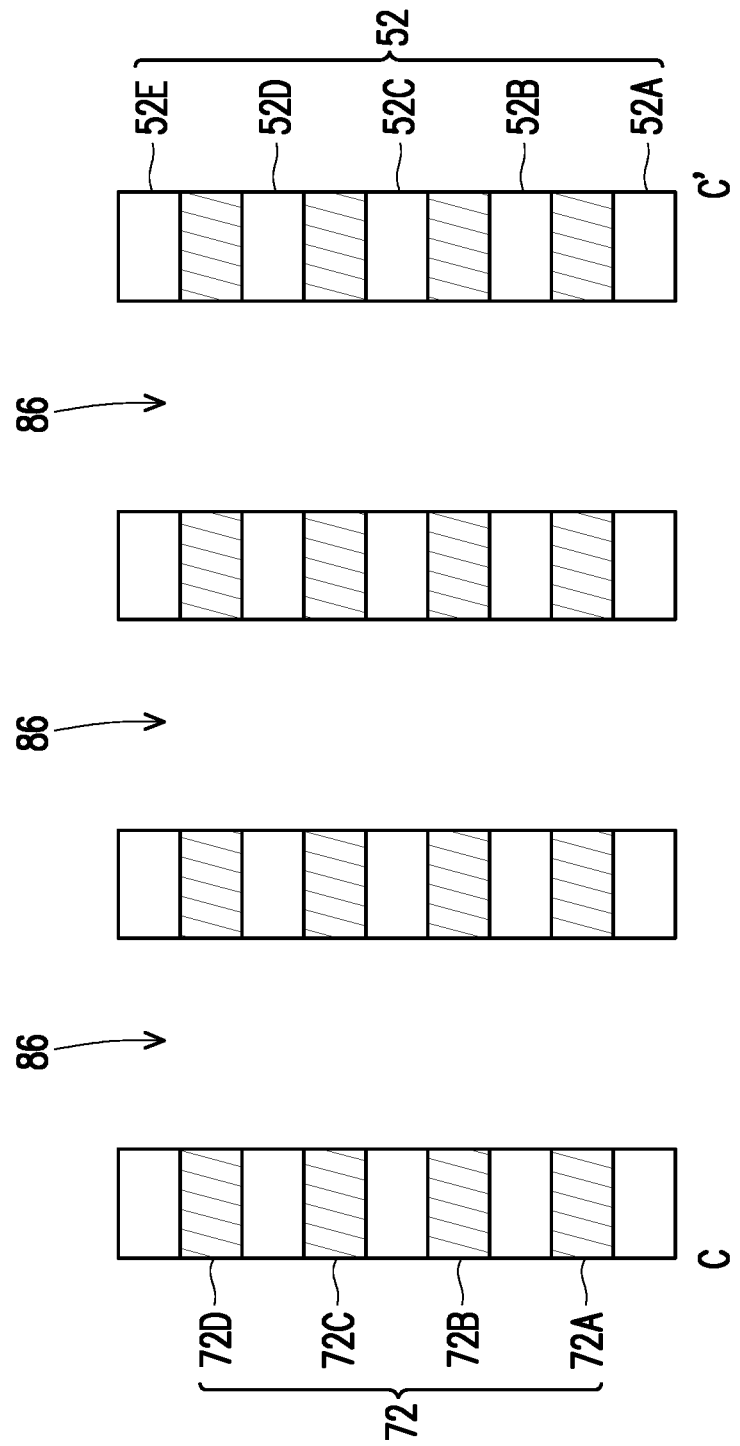

In FIGS. 15 to 16B, the sacrificial layers 53A-53D (collectively referred to as sacrificial layers 53) are replaced with conductive lines 72A-72D (collectively referred to as conductive lines 72). In some embodiments, the sacrificial layers 53 are removed by an acceptable process, such as a wet etching process, a dry etching process or both. Thereafter, conductive lines 72 are filled into the space between adjacent dielectric layers 52. In some embodiments, each of the conductive lines 72 is made by a single material. For example, the conductive lines 72 includes metal nitride, such as titanium nitride (TiN), tantalum nitride (TaN), molybdenum nitride, zirconium nitride, hafnium nitride, or the like. In other embodiments, each of the conductive lines 72 includes different materials. For example, each conductive line 72 includes two liners (e.g., Ti, TiN, Ta, TaN, etc.) and a metal layer (e.g., W, Ru, Co, Cu, Al, Ni, Au, Ag etc.) between the liners, and one of the liners is between the metal layer and the adjacent dielectric layer. In some embodiments, a conductive material is formed in the horizontal openings between adjacent dielectric layers 52, on the sidewalls of the multi-layer stack 58 and fills in the trenches 86. The conductive material may be formed by an acceptable deposition process such as CVD, PVD, ALD, PECVD, or the like. Thereafter, the conductive material in the trenches 86 is removed by an etching back process. An acceptable etch back process may be performed to remove the excess material from the sidewalls of the dielectric layers 52 and the bottom surfaces of the trenches 86. The acceptable etch back process includes a dry etch (e.g., RIE, NBE, the like), a wet etch, the like, or a combination thereof. The acceptable etch back process may be anisotropic.

In some embodiments, upon the replacement process, the sacrificial layers 53 of the strip-shaped staircase structures are subsequently replaced with conductive lines 72 (see FIG. 1A).

Figure 17A:
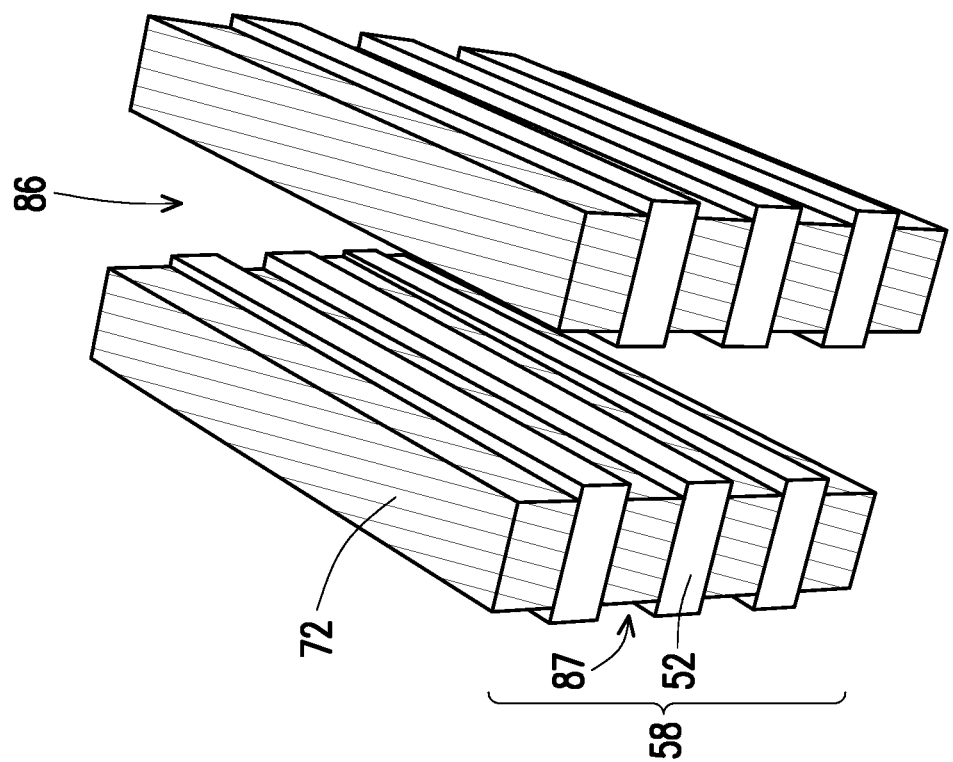
Figure 17B:
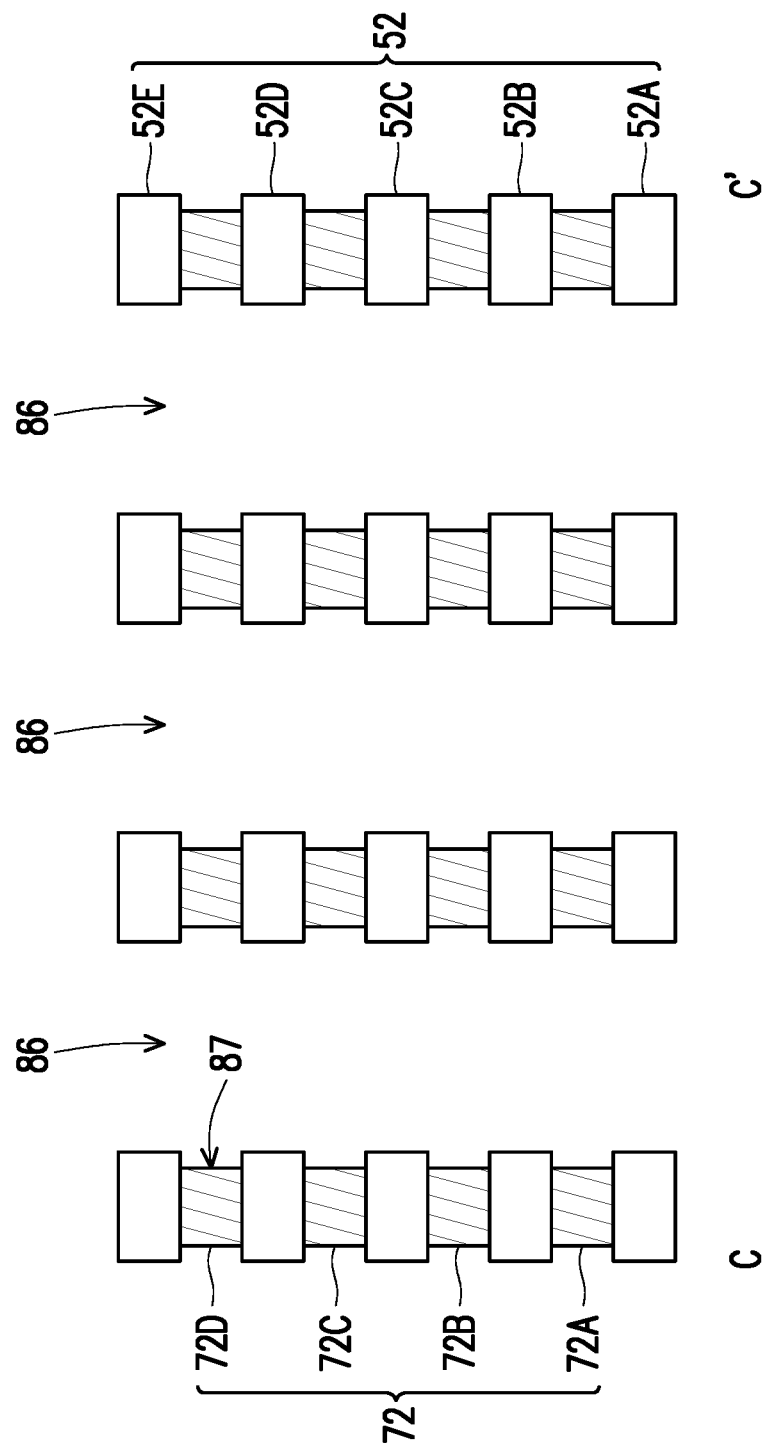
Figure 18A:
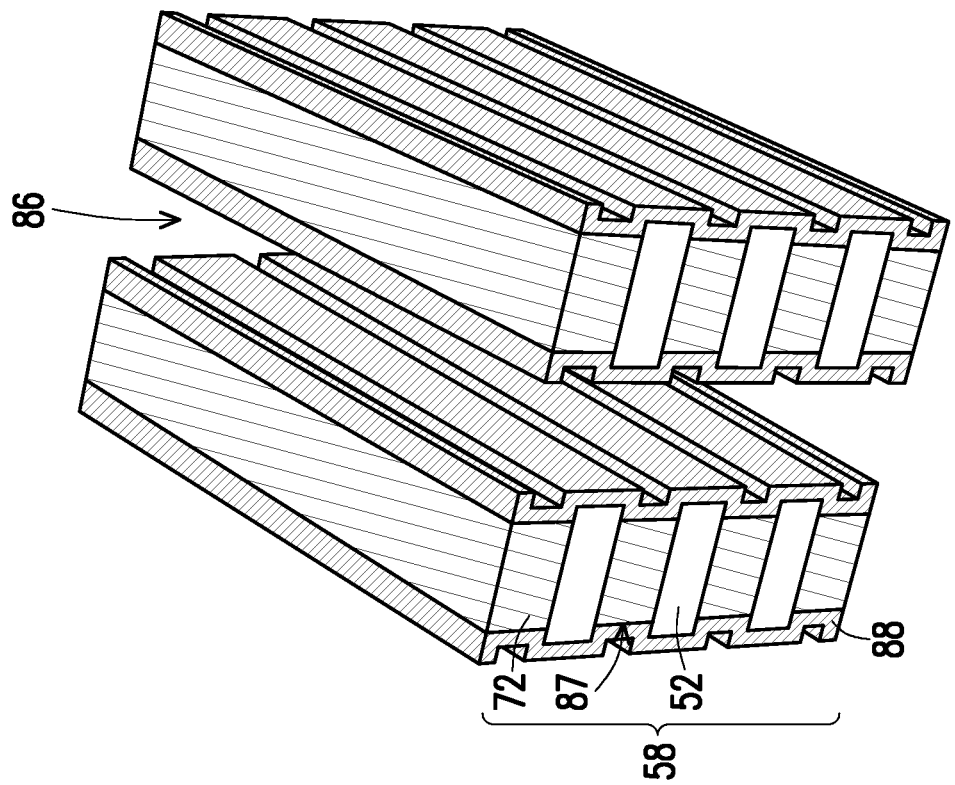
Figure 18B:
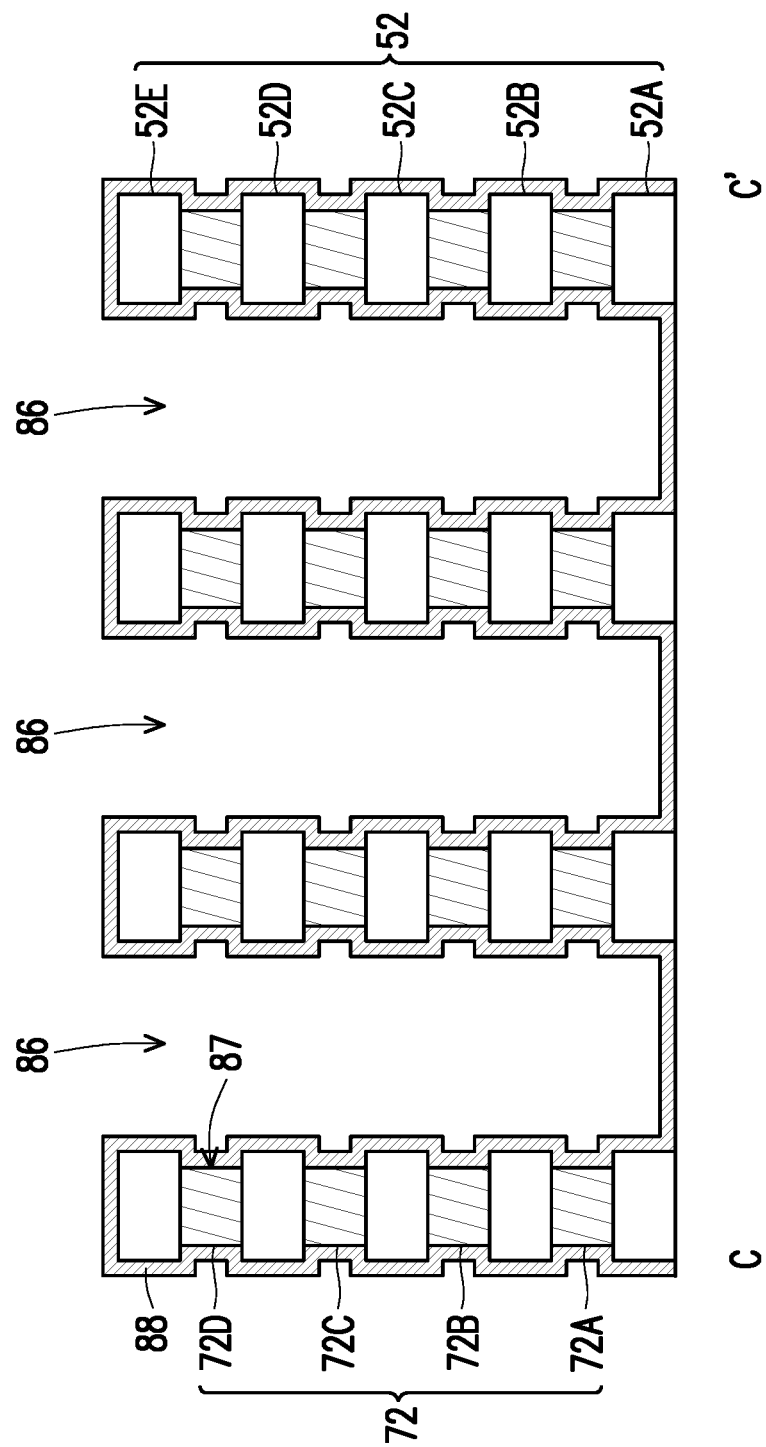
Figure 19A:
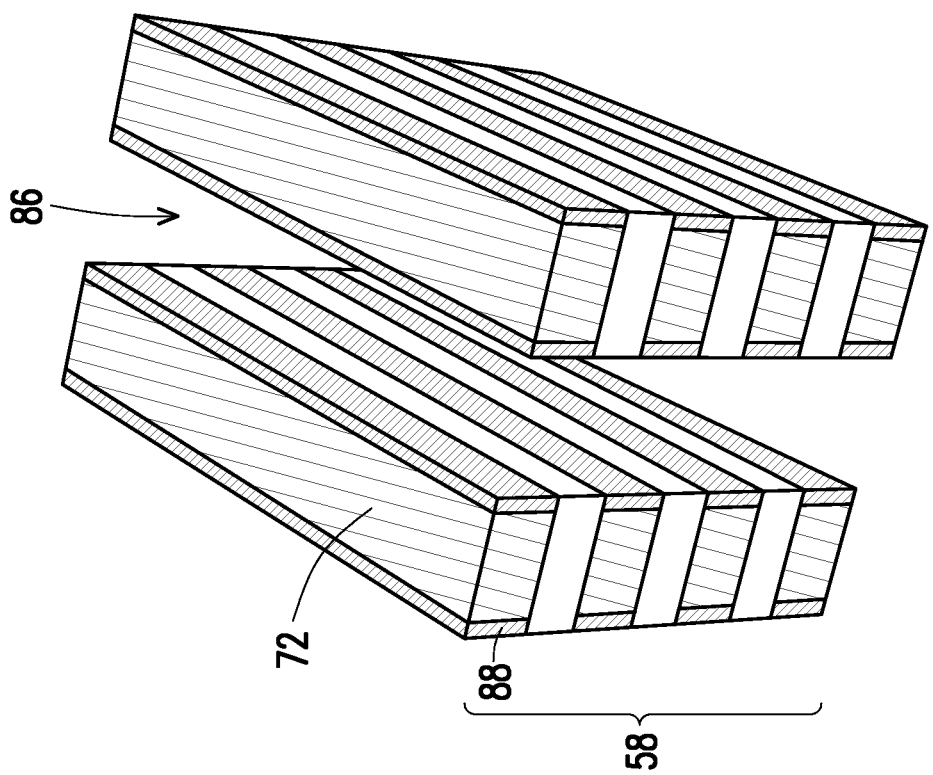
Figure 19B:
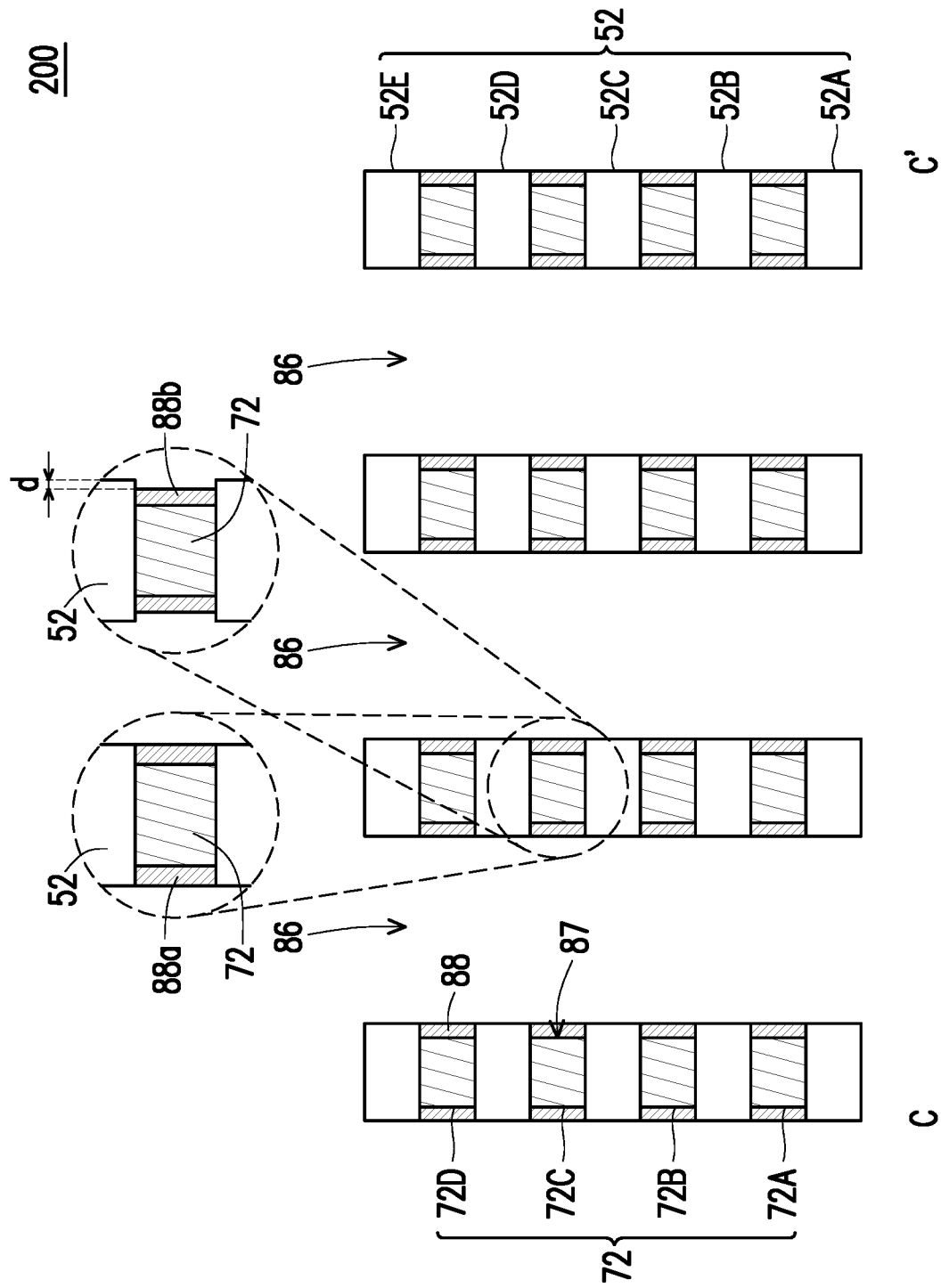

FIGS. 17A through 19B illustrate forming oxygen scavenging layers 88 on sidewalls of the conductive layers 72 of the multi-layer stack 58. FIGS. 17A, 18A and 19A are illustrated in a partial three-dimensional view. In FIGS. 17B, 18B and 19B, cross-sectional views are provided along line C-C' of FIG. 1A.

In FIGS. 17A and 17B, the conductive layers 72 of the multi-layer stack 58 are recessed, so that a recess 87 is formed between the two adjacent dielectric layers 52. The recesses 87 are connected to (e.g., in spatial communication with) the corresponding trench 86. Specifically, ends of the conductive lines 72 are recessed, by about 1-10 nm with respect to ends of the dielectric layers 52 exposed by the trench 86. In some embodiments, the conductive lines 72 of the multi-layer stack 58 are trimmed by using an acceptable removing technique such as a lateral etching. The etching may include a dry etch (e.g., RIE, NBE, the like), a wet etch, the like, or a combination thereof. The etching may be anisotropic. In some embodiments, the recessing process includes an etching gas that contains $CF_4$, $O_2$, Ar or a combination thereof, a gas flow of about 100 to 1,000 sccm, a power of 50 to 500 W, and a chamber pressure of about 0.1 to 700 torr. Upon the recessing process, the multi-layer stack 58 has a curvy sidewall. Specifically, the ends of the dielectric layers 52 are protruded from the ends of the remaining conductive lines 72.

In FIG. 18A and FIG. 19B, an oxygen scavenging layer 88 is formed within each of the recesses 87. Herein, the oxygen scavenging layer of the disclosure is configured to prevent the undesired interfacial layer from generation between the oxide semiconductor channel layer and the ferroelectric layer. The oxygen scavenging layer of the discourse is also referred to as an "oxygen gettering layer", an "oxygen trapping layer", or an "oxygen absorbing layer", in some examples. The oxygen scavenging layer 88 may absorb the oxygen from the undesired interfacial layer and therefore mitigate unwanted oxygen in the undesired interfacial layer through a "direct scavenging mechanism" or a "remote scavenging mechanism", which will be described in details below, see FIG. 30C and FIG. 30D. In some embodiments, in the direct scavenging mechanism, the oxygen scavenging layer 88 includes Hf, La, Al or a combination thereof. In other embodiments, in the remote scavenging mechanism, the oxygen scavenging layer 88 includes TiSiN (TSN), TiAl, Ti or a combination thereof.

In some embodiments, the oxygen scavenging layer 88 is conformally and continuously formed on the top and the sidewall of the multi-layer stack 58. Specifically, the oxygen scavenging layer 88 is deposited conformally in the trenches 86 along sidewalls of the conductive lines 72 and the dielectric layers 52 and fills in the recesses 87, along top surfaces of the dielectric layer 52E, and along the bottom surfaces of the trenches 86. In some embodiments, the method of forming the oxygen scavenging layer 88 includes performing a suitable deposition technique, such as CVD, PVD, ALD, PECVD, or the like.

In some embodiments, the oxygen scavenging layer 88 has a thickness of about 1-10 nm. Other thickness ranges (e.g., more than 10 nm) may be applicable. In some embodiments, the oxygen scavenging layer 88 is a single layer. In alternative embodiments, the oxygen scavenging layer 88 has a multi-layer structure. For example, the oxygen scavenging layer 88 includes an inner oxygen scavenging layer (e.g., Hf, La, Al) in contact with the corresponding conductive line 72 and an outer oxygen scavenging layer (e.g., TiSiN, TiAl, Ti) outside of the inner oxygen scavenging layer. The multi-layer structure may enable scavenging of oxygen via in different ways (e.g., by direct scavenging of oxygen into the oxygen scavenging layer 88 and by indirect scavenging into an adjacent layer), and thereby can increase oxygen scavenging.

In FIG. 19A and FIG. 19B, an etching back process is performed to the continuous oxygen scavenging layer 88. An acceptable etch back process may be performed to remove the excess material from the sidewalls of the dielectric layers 52 and/or the bottom surfaces of the trenches 86. The acceptable etch back process includes a dry etch (e.g., RIE, NBE, the like), a wet etch, the like, or a combination thereof. The etching may be anisotropic. In some embodiments, the etching back process includes an etching gas that contains $CF_4$, $O_2$, Ar or a combination thereof, a gas flow of about 100 to 1,000 sccm, a power of 50 to 500 W, and a chamber pressure of about 0.1 to 700 torr.

Upon the etching back process, the continuous oxygen scavenging layer of FIG. 18B is divided into a plurality of separate or discrete oxygen scavenging layers 88 in FIG. 19B. The separate oxygen scavenging layers 88 are embedded in the recesses 87, respectively. In some embodiments, the separate oxygen scavenging layers 88 are referred to as a discontinuous oxygen scavenging layer, and portions of the oxygen scavenging layer are embedded in the recesses 87, respectively. In some embodiments, as shown in the local enlarged view on the left-top of FIG. 19B, the sidewall of each oxygen scavenging layer 88a is substantially level with the sidewalls of the adjacent dielectric layers 52. In some embodiments, as shown in the local enlarged view on the right-top of FIG. 19B, the sidewall of each oxygen scavenging layer 88b is slightly recessed from the sidewalls of the adjacent dielectric layers 52 by a non-zero distance d. The non-zero distance d ranges from about 1-5 nm, for example. In some additional embodiments (not shown), the oxygen scavenging layer 88 may have a greater thickness along top and bottom surfaces of respective ones of the separate oxygen scavenging layers 88 (e.g., along surfaces of the separate oxygen scavenging layers 88 that contact the dielectric layers 52) than vertically between the top and bottom surfaces.

Figure 20A:
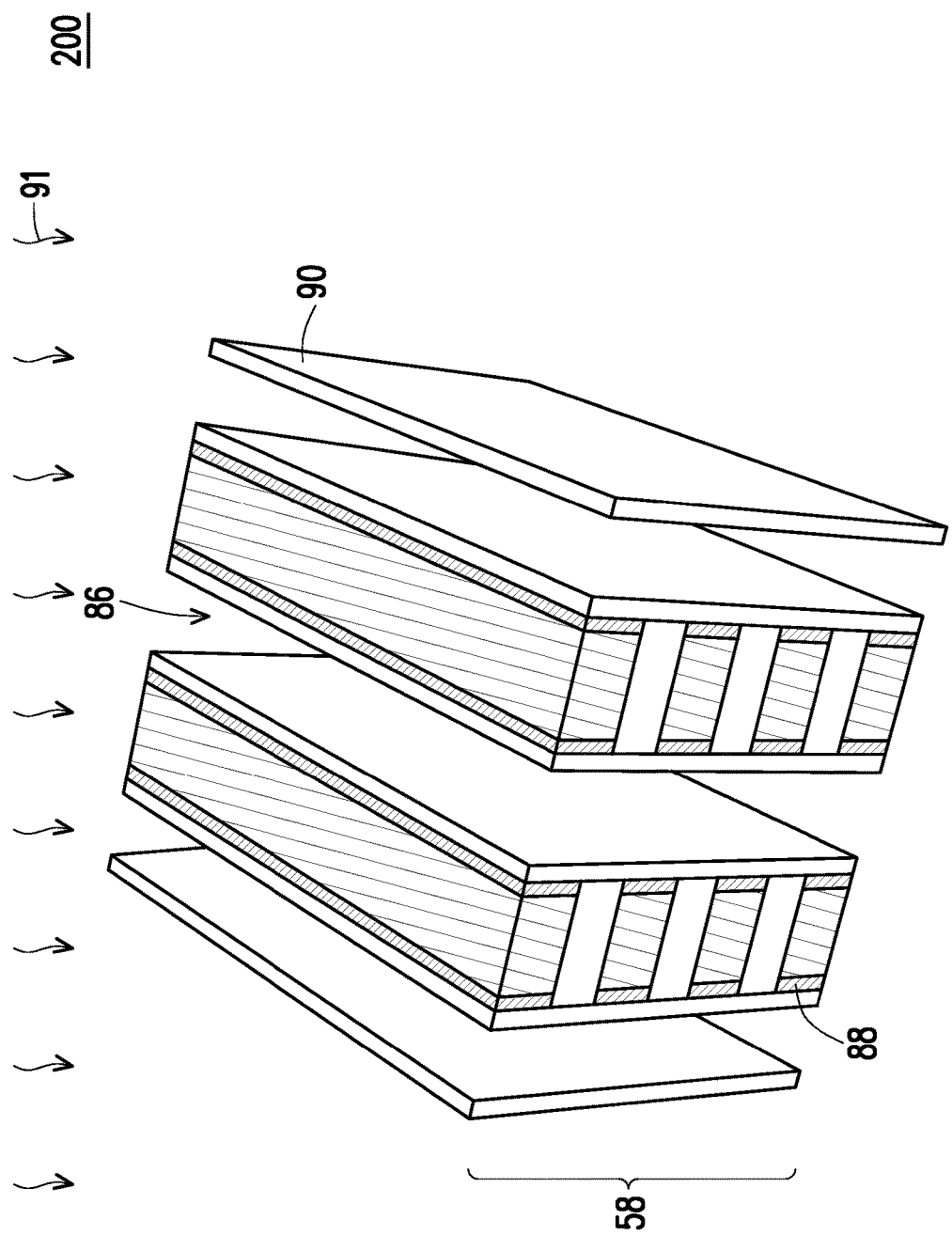

FIGS. 20A through 25B illustrate forming and patterning channel regions for the memory cells 202 (see FIG. 1A) in the trenches 86. FIGS. 20A, 21A and 25A are illustrated in a partial three-dimensional view. In FIGS. 20B, 21B, 22, 23, 24 and 25B cross-sectional views are provided along line C-C' of FIG. 1A.

In some embodiments, the oxygen scavenging layer of FIG. 18B is further formed on the IMD 70 and along the sidewall of each strip-shaped staircase structure, and the etching back process of FIG. 19B is further performed to the oxygen scavenging layer in the staircase region. Accordingly, each of the conductive steps of the staircase structure includes a conductive line 72 and two oxygen scavenging layers 88 beside the conductive line 72, as shown in FIG. 1A.

In FIGS. 20A through 23, a ferroelectric layer 90, a channel layer 92, and a dielectric material 98A are deposited in the trenches 86.

Figure 20B:
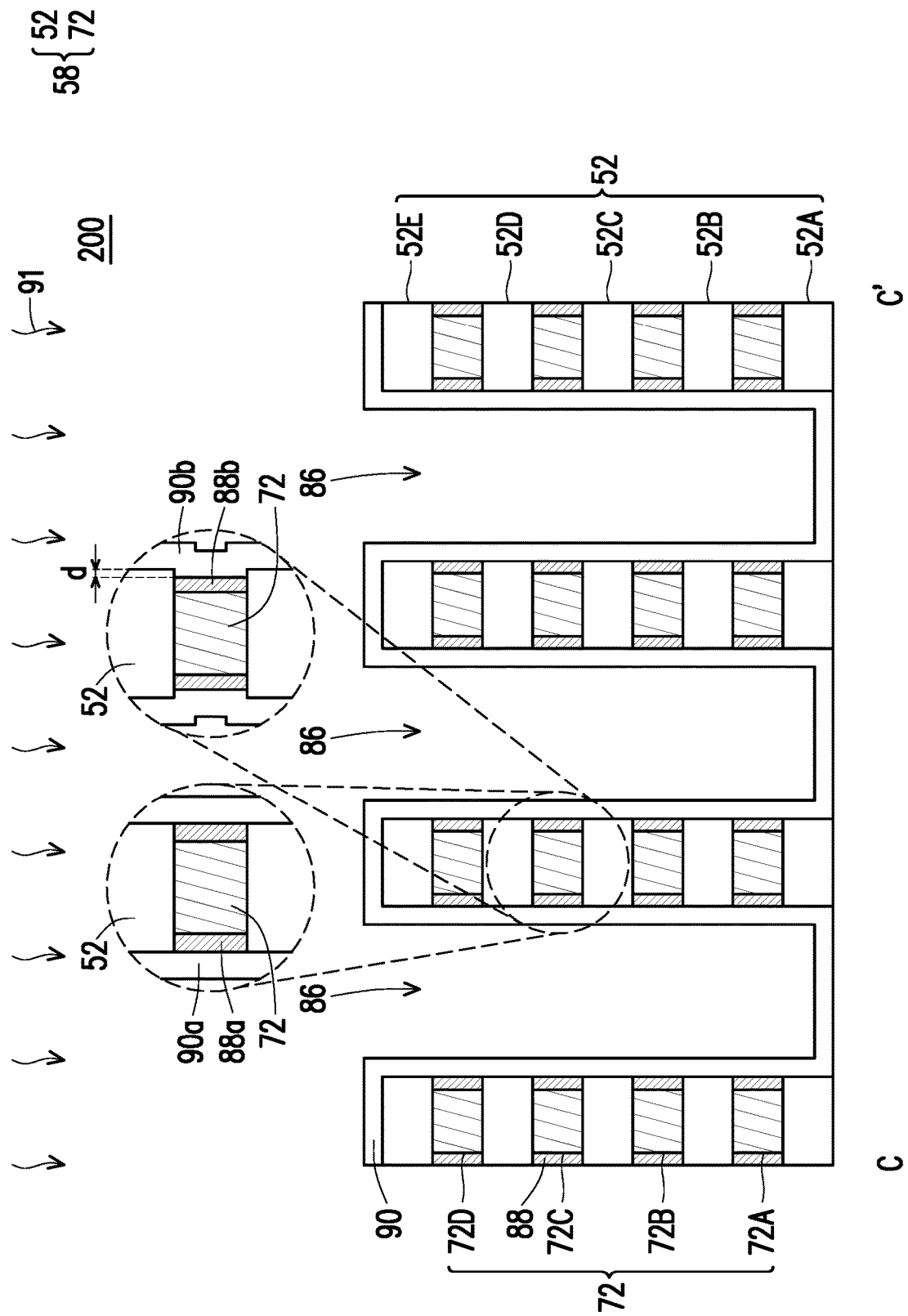

In FIGS. 20A and 20B, a ferroelectric layer 90 may be deposited conformally in the trenches 86 along sidewalls of the dielectric layers 52 and the oxygen scavenging layers 88, along top surfaces of the dielectric layer 52E, and along the bottom surfaces of the trenches 86. In some embodiments, a ferroelectric layer 90 may be further deposited on the IMD 70 and along the sidewall of each step of the staircase structure in the staircase region. The ferroelectric layer 90 may include materials that are capable of switching between two different polarization directions by applying an appropriate voltage differential across the ferroelectric layer 90. For example, the ferroelectric layer 90 includes a high-k dielectric material, such as a hafnium (Hf) based dielectric materials or the like. In some embodiments, the ferroelectric layer 90 includes hafnium oxide, hafnium zirconium oxide, silicon-doped hafnium oxide, or the like.

In some embodiments, the ferroelectric layer 90 may include barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_xO$), or the like. Specifically, the ferroelectric layer 90 includes HfZrO, HfAlO, HfLaO, HfCeO, HfO, HfGdO, HfSiO or a combination thereof. In some embodiments, the method of forming the ferroelectric layer 90 includes performing a suitable deposition technique, such as CVD, PECVD, metal oxide chemical vapor deposition (MOCVD), ALD, RPALD, PEALD, MBD or the like.

In some embodiments, the ferroelectric layer 90 has a thickness of about 1-20 nm, such as 5-10 nm. Other thickness ranges (e.g., more than 20 nm or 5-15 nm) may be applicable. In some embodiments, the thickness ratio of the ferroelectric layer 90 to the oxygen scavenging layer 88 ranges from about 1:1 to 20:1. In some embodiments, the ferroelectric layer 90 is formed in a fully amorphous state. In alternative embodiments, the ferroelectric layer 90 is formed in a partially crystalline state; that is, the ferroelectric layer 90 is formed in a mixed crystalline-amorphous state and having some degree of structural order. In yet alternative embodiments, the ferroelectric layer 90 is formed in a fully crystalline state. In some embodiments, the ferroelectric layer 90 is a single layer. In alternative embodiments, the ferroelectric layer 90 has a multi-layer structure.

In some embodiments, as shown in the local enlarged view on the left-top of FIG. 20B, the ferroelectric layer 90a is conformally formed on the sidewall of the multi-layer stack 58 and therefore has a substantially smooth sidewall profile. In some embodiments, the opposite surfaces of the ferroelectric layer 90a close to the oxygen scavenging layer 88a and away from the oxygen scavenging layer 88a are substantially straight, as shown in the local enlarged view on the left-top of FIG. 20B.

In some embodiments, as shown in the local enlarged view on the right-top of FIG. 20B, the ferroelectric layer 90b is conformally formed on the sidewall of the multi-layer stack 58 and therefore has an uneven and wavy sidewall profile. In some embodiments, the opposite surfaces of the ferroelectric layer 90b close to the oxygen scavenging layer 88b and away from the oxygen scavenging layer 88b are uneven and wavy, as shown in the local enlarged view on the right-top of FIG. 20B. In some embodiments (not shown), the surface of the ferroelectric layer 90b close to the oxygen scavenging layer 88b is wavy while the surface of the ferroelectric layer 90b away from the oxygen scavenging layer 88b is substantially straight.

Thereafter, an annealing process 91 is performed to the ferroelectric layer 90. The temperature range of the annealing process 91 ranges from about 350° C. to about 450° C. (e.g., 400° C.) in an ambient containing $N_2$, $H_2$, Ar or a combination thereof, so as to achieve a desired crystalline lattice structure for the ferroelectric layer 90. In some embodiments, upon the annealing process 91, the ferroelectric layer 90 is transformed from an amorphous state to a partially or fully crystalline state. In alternative embodiments, upon the annealing ferroelectric layer 90 is transformed from a partially crystalline state to a fully crystalline state.

Figure 21A:
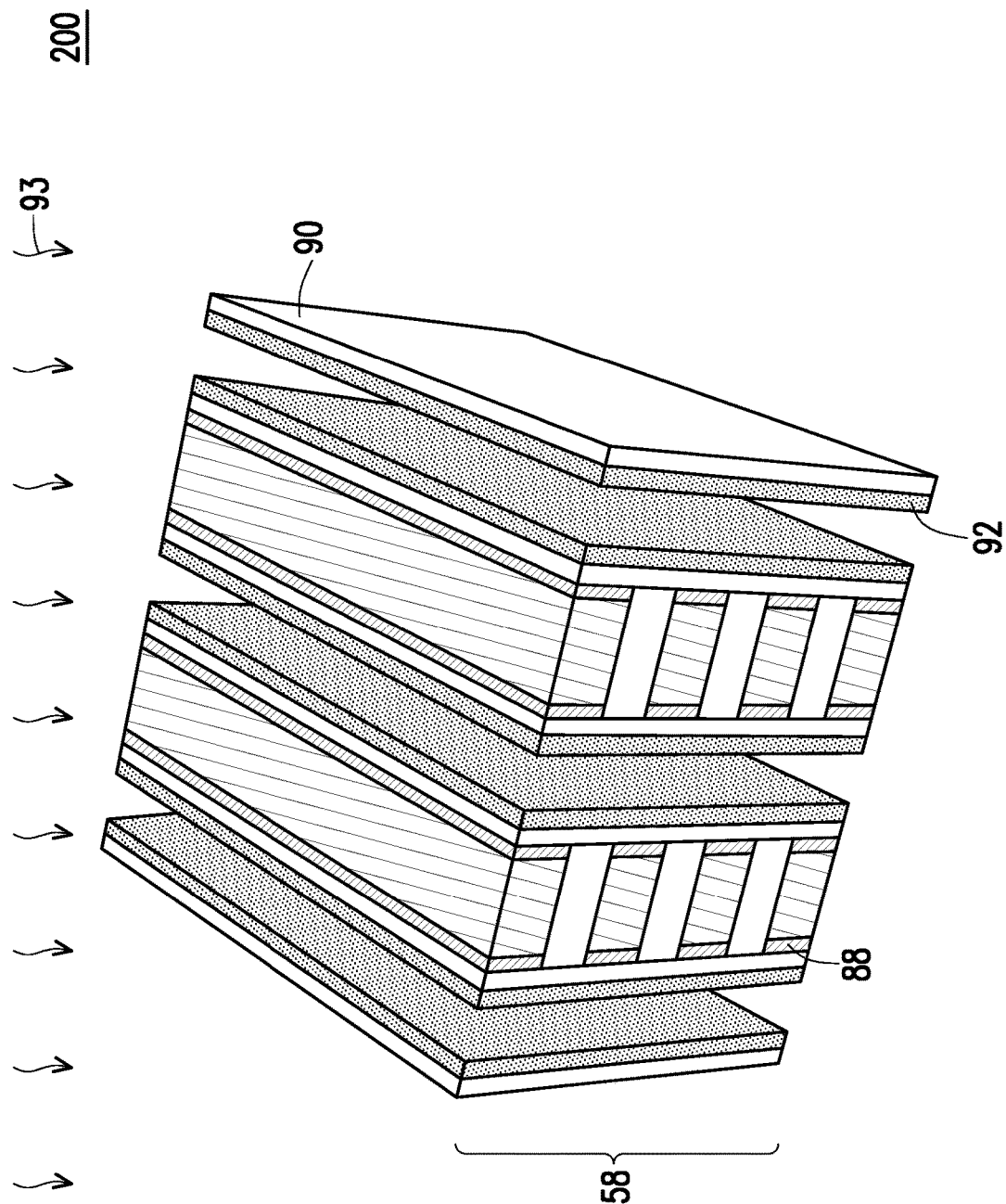
Figure 21B:
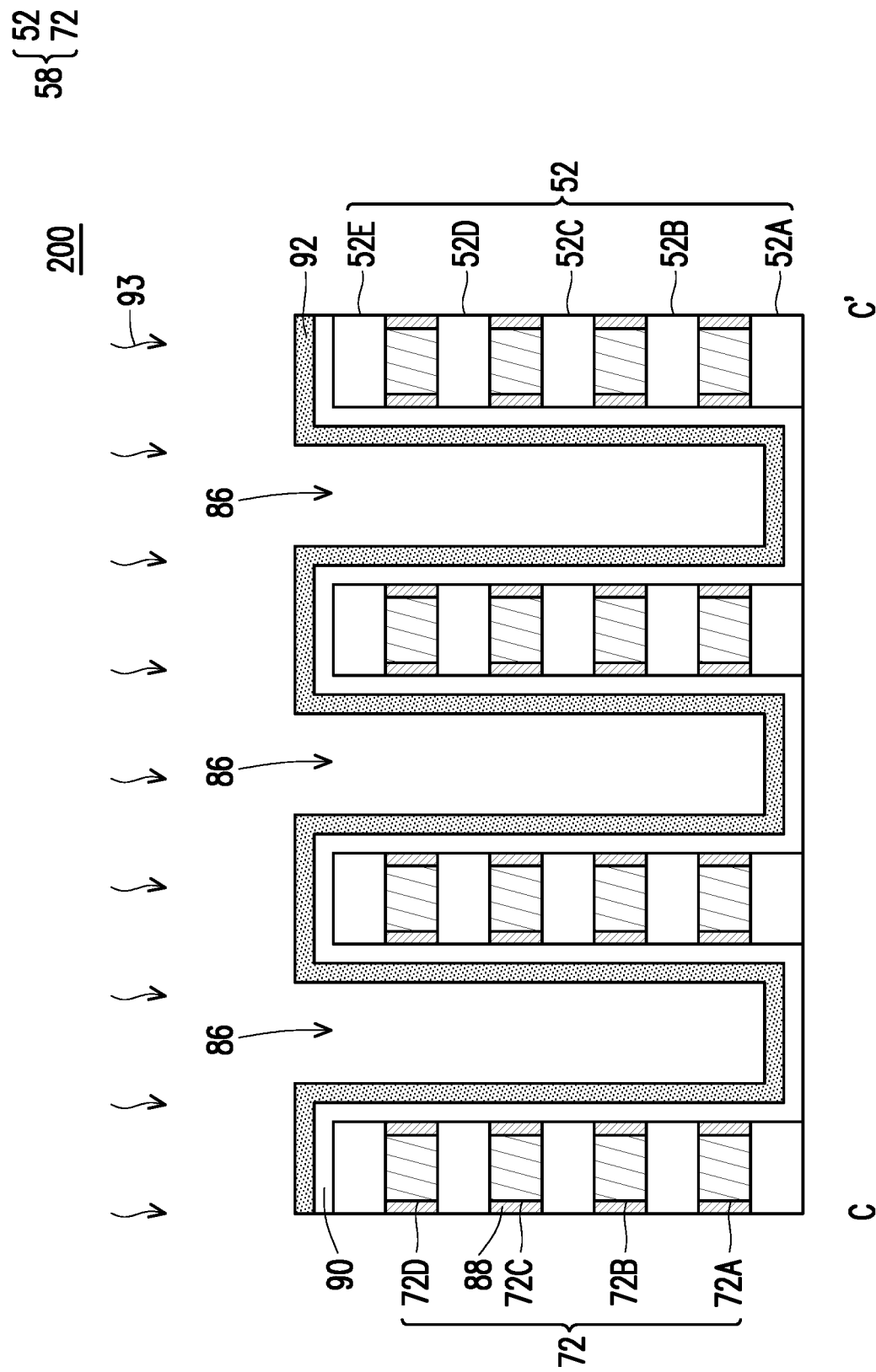

In FIGS. 21A and 21B, a channel layer 92 is conformally deposited in the trenches 86 over the ferroelectric layer 90. The channel layer 92 includes materials suitable for providing channel regions for the memory cells 202 (see FIG. 1A). For example, the channel layer 92 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. The channel layer 92 may be deposited by CVD, PVD, ALD, PECVD, or the like. The channel layer 92 may extend along sidewalls and bottom surfaces of the trenches 86 over the ferroelectric layer 90. In some embodiments, the channel layer 92 may be further deposited on the IMD 70 and along the sidewall of each step of the staircase structure in the staircase region.

After the channel layer 92 is deposited, an annealing process 93 is performed to the channel layer 92. In some embodiments, the annealing process 93 is performed at a temperature of about 300° C. to about 450° C. in oxygen-related ambient, so as to activate the charge carriers of the channel layer 92.

Figure 22:
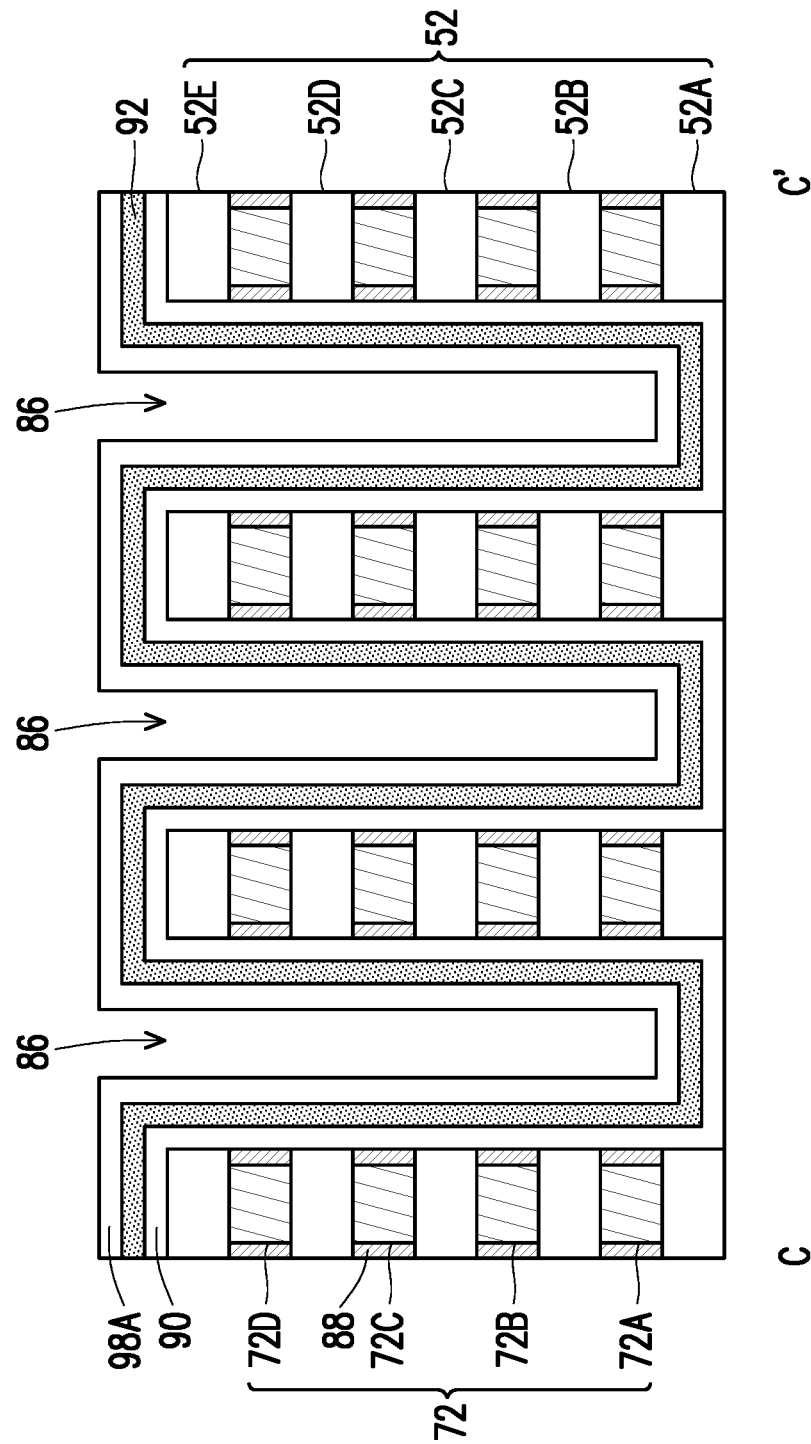

In FIG. 22, a dielectric material 98A is deposited in the trenches 86 over the channel layer 92. In some embodiments, the dielectric material 98A includes silicon oxide, silicon nitride, silicon oxynitride, or the like, which may be deposited by CVD, PVD, ALD, PECVD, or the like. The dielectric material 98A may extend along sidewalls and bottom surfaces of the trenches 86 over the channel layer 92. In some embodiments, the dielectric material 98A is optional and may be omitted as needed.

Figure 23:
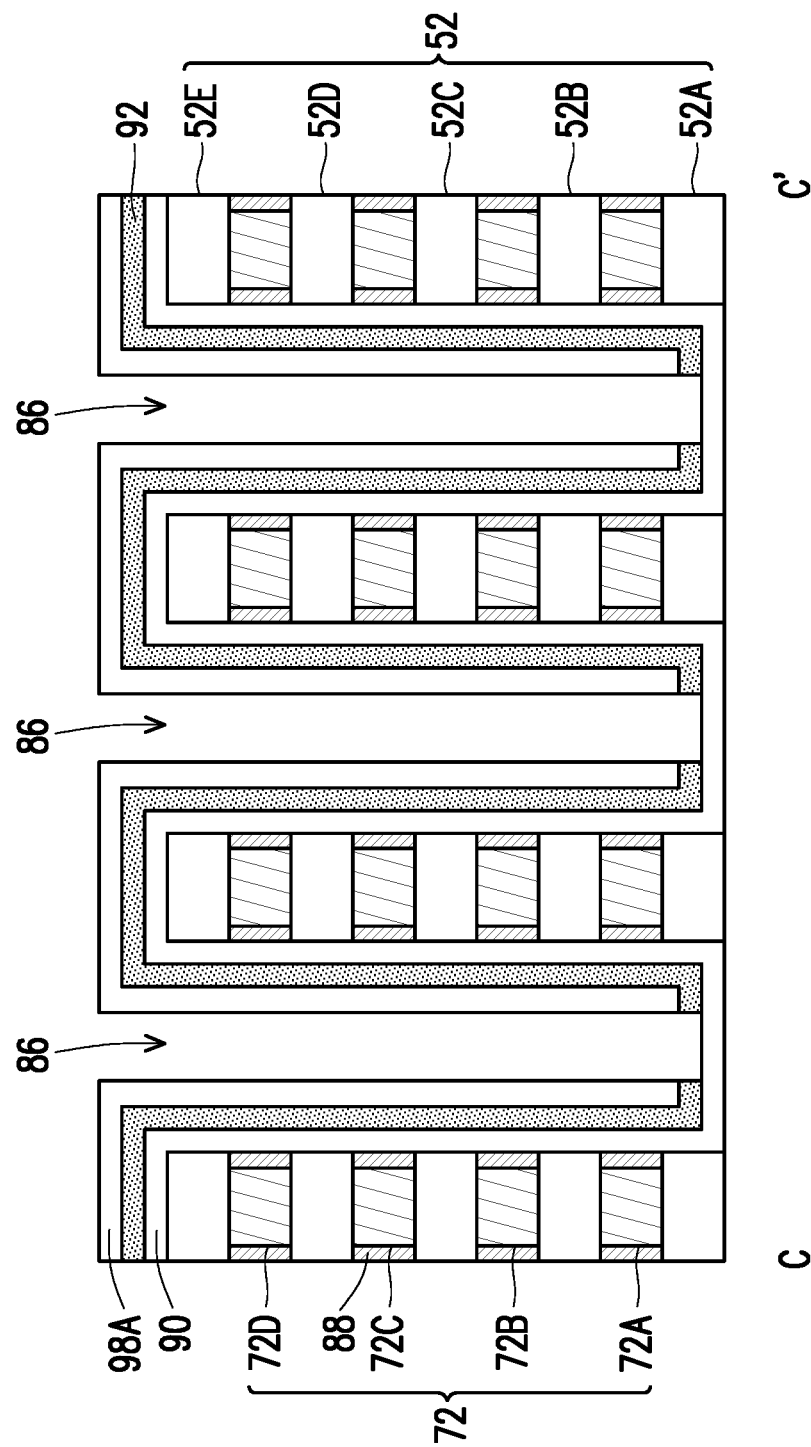

In FIG. 23, bottom portions of the dielectric material 98A and the channel layer 92 are removed in the trenches 86. The removal process includes an acceptable etching process, such as a dry etch (e.g., RIE, NBE, the like), a wet etch, the like, or a combination thereof. The etching may be anisotropic. In some embodiments, the top portions of the dielectric material 98A and the channel layer 92 are removed from the multi-layer stack 58. In some embodiments, removal process includes a combination of photolithography and etching.

Accordingly, the remaining dielectric material 98A and the channel layer 92 may expose portions of the ferroelectric layer 90 on bottom surfaces of the trenches 86. Thus, portions of the channel layer 92 on opposing sidewalls of the trenches 86 may be separated from each other, which improves isolation between the memory cells 202 of the memory array 200 (see FIG. 1A).

Figure 24:
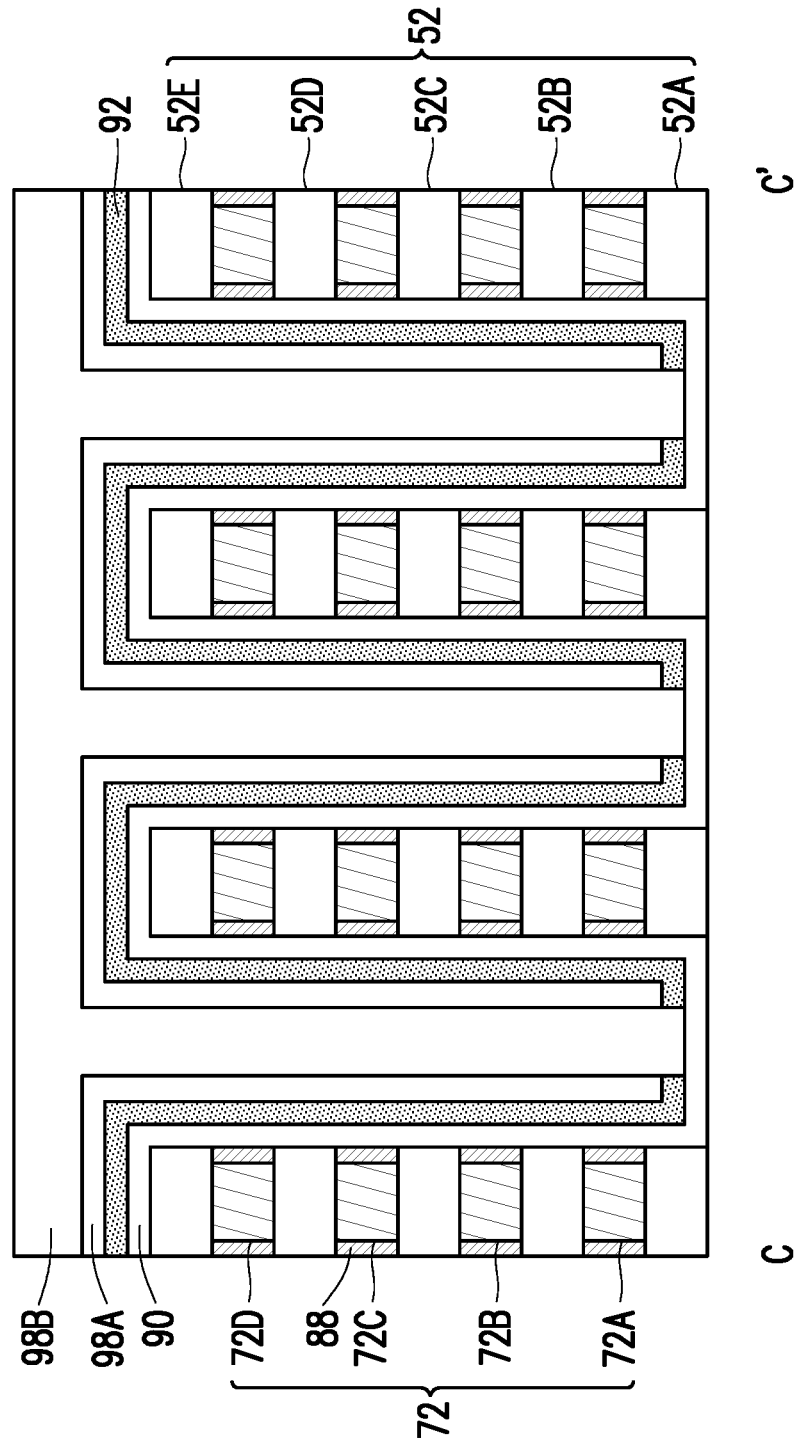

In FIG. 24, a dielectric material 98B is deposited to completely fill the trenches 86. The dielectric material 98B may be formed of one or more materials and by processes the same as or similar to those of the dielectric material 98A. In some embodiments, the dielectric material 98A and dielectric material 98B may be formed by a same process (e.g., a single process). In other embodiments, the dielectric material 98A and the dielectric material 98B may be formed by separate processes. In some embodiments, the dielectric material 98B and the dielectric material 98A include different materials. In some embodiments, the dielectric material 98B and the dielectric material 98A include one or more same materials.

Figure 25A:
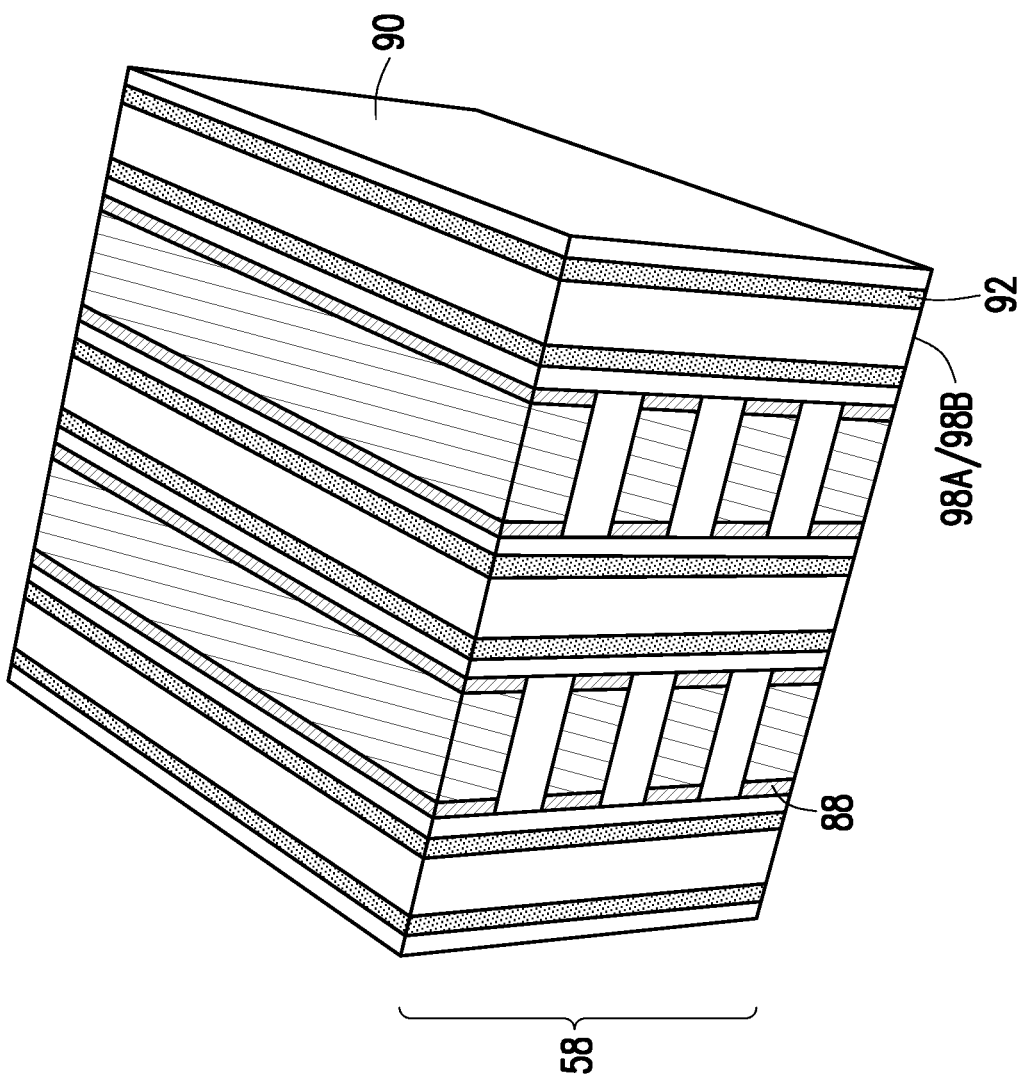
Figure 25B:
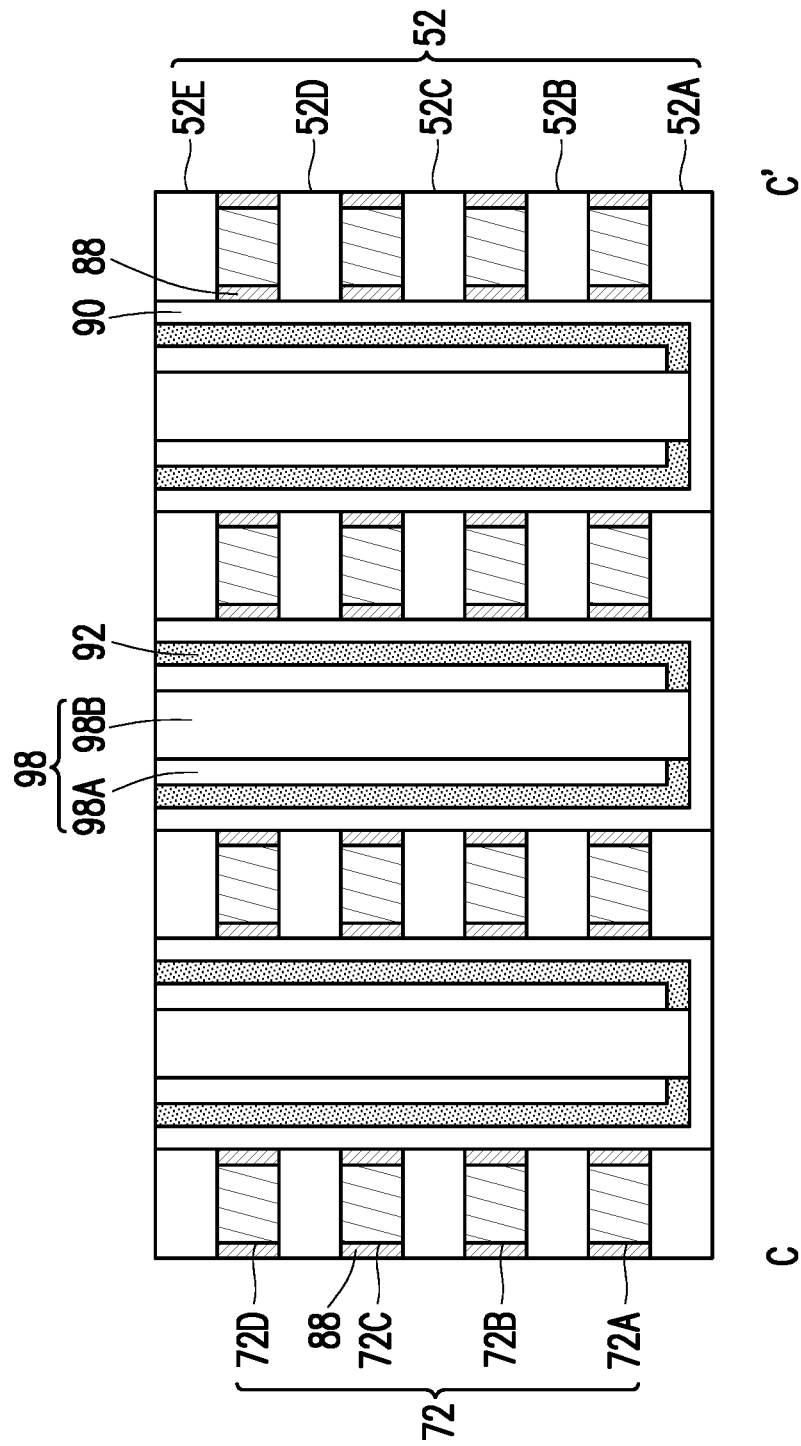

In FIGS. 25A and 25B, a removal process is applied to the dielectric materials 98A/98B, the channel layer 92, and the ferroelectric layer 90 to remove excess materials over the multi-layer stack 58. In some embodiments, a planarization process such as a CMP, an etch-back process, combinations thereof, or the like may be utilized. The planarization process exposes the multi-layer stack 58 such that top surfaces of the multi-layer stack 58 (e.g., the dielectric layer 52E), the ferroelectric layer 90, the channel layer 92, the dielectric materials 98A/98B, and the IMD 70 are level after the planarization process is complete.

Figure 27A:
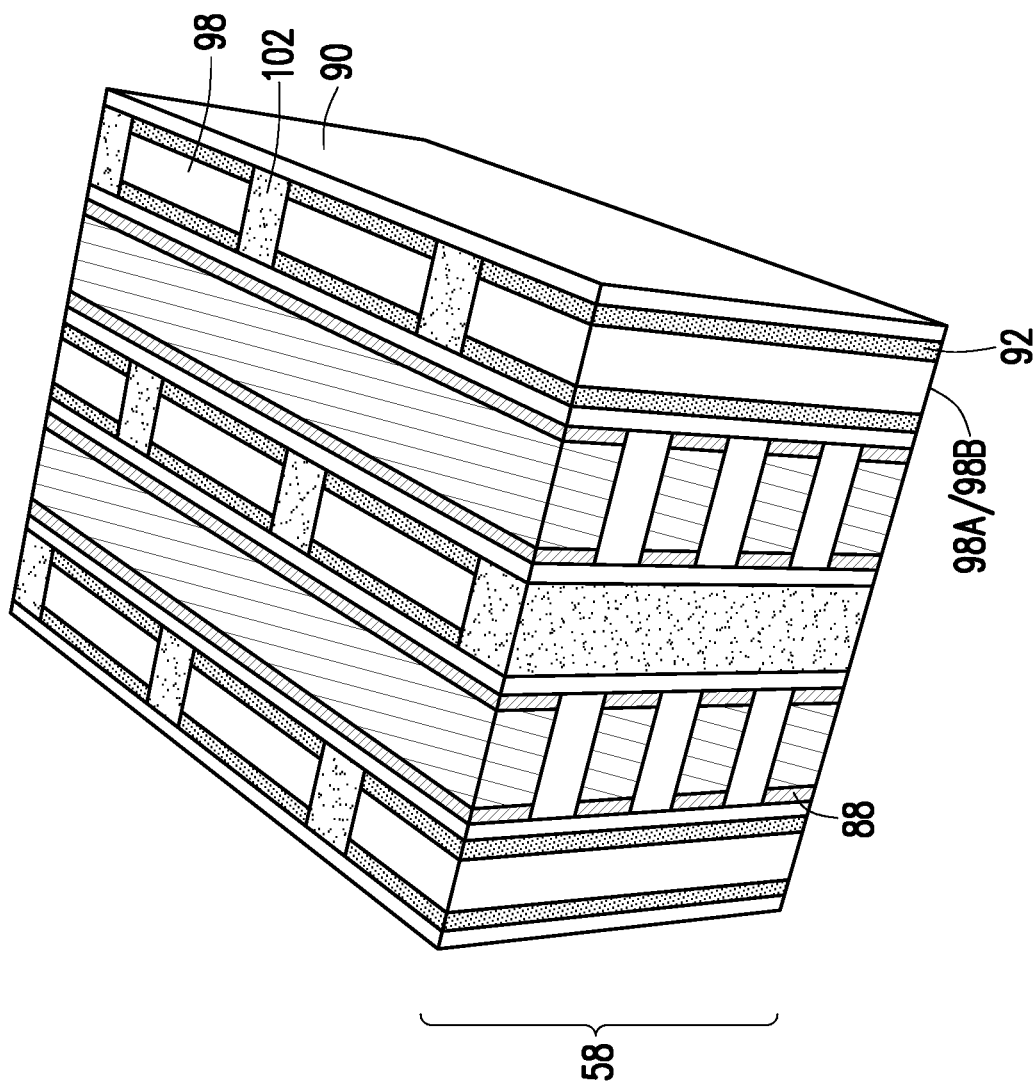
Figure 27B:
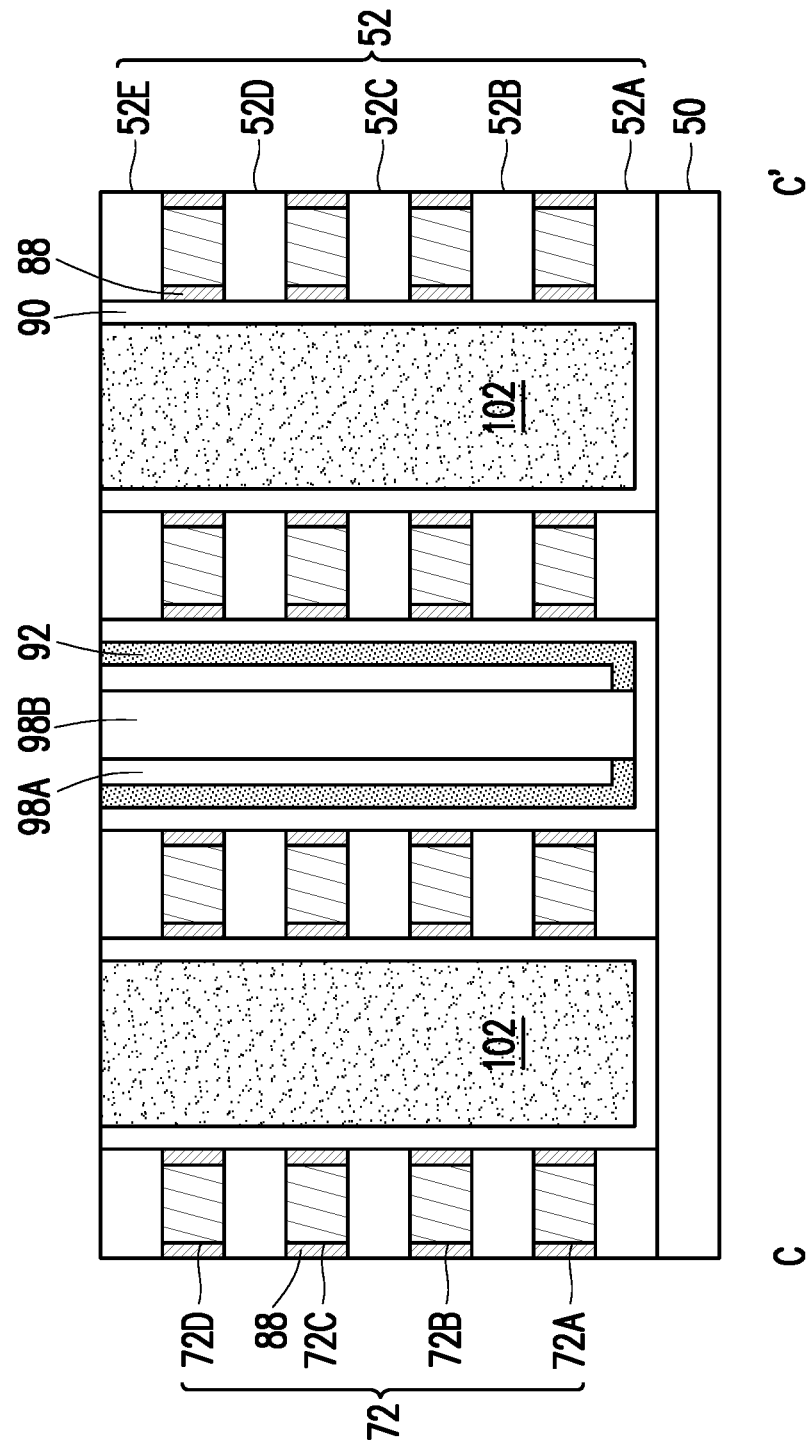
Figure 28A:
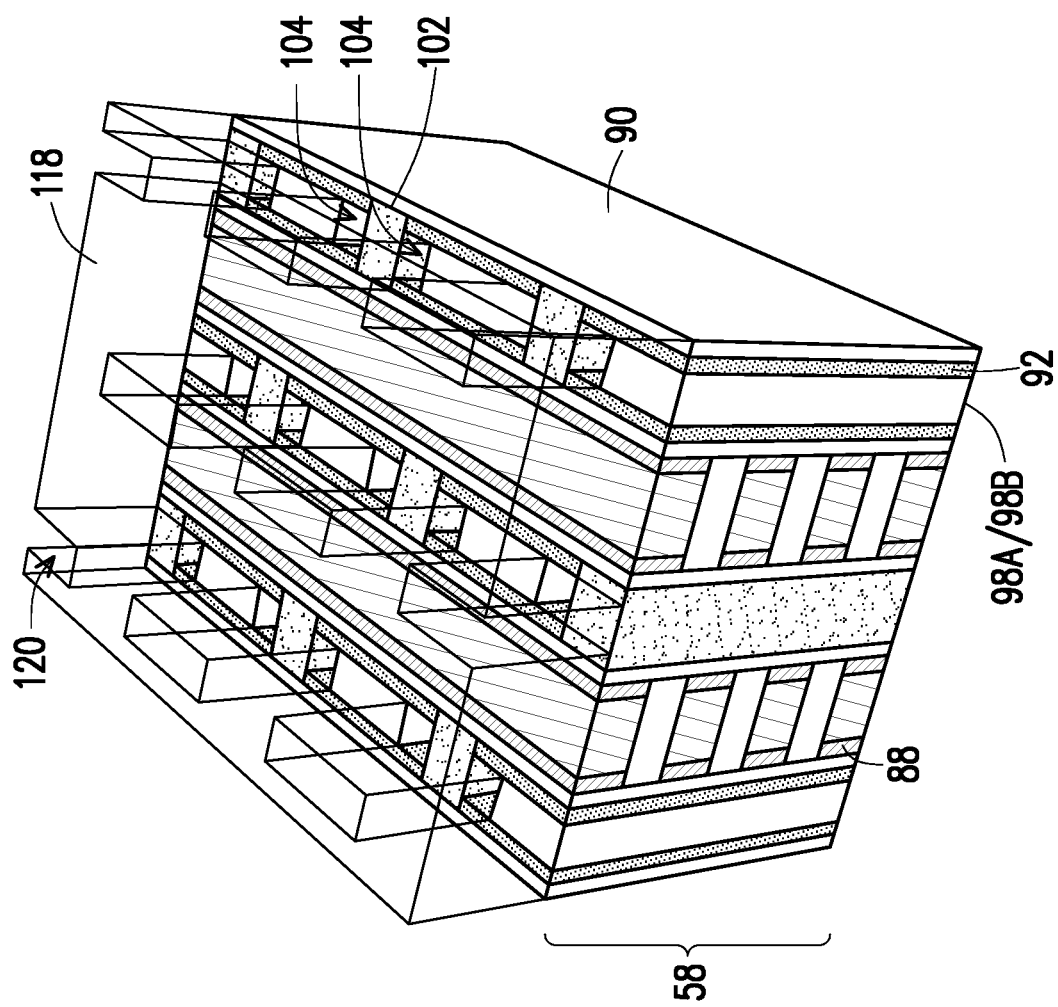
Figure 28B:
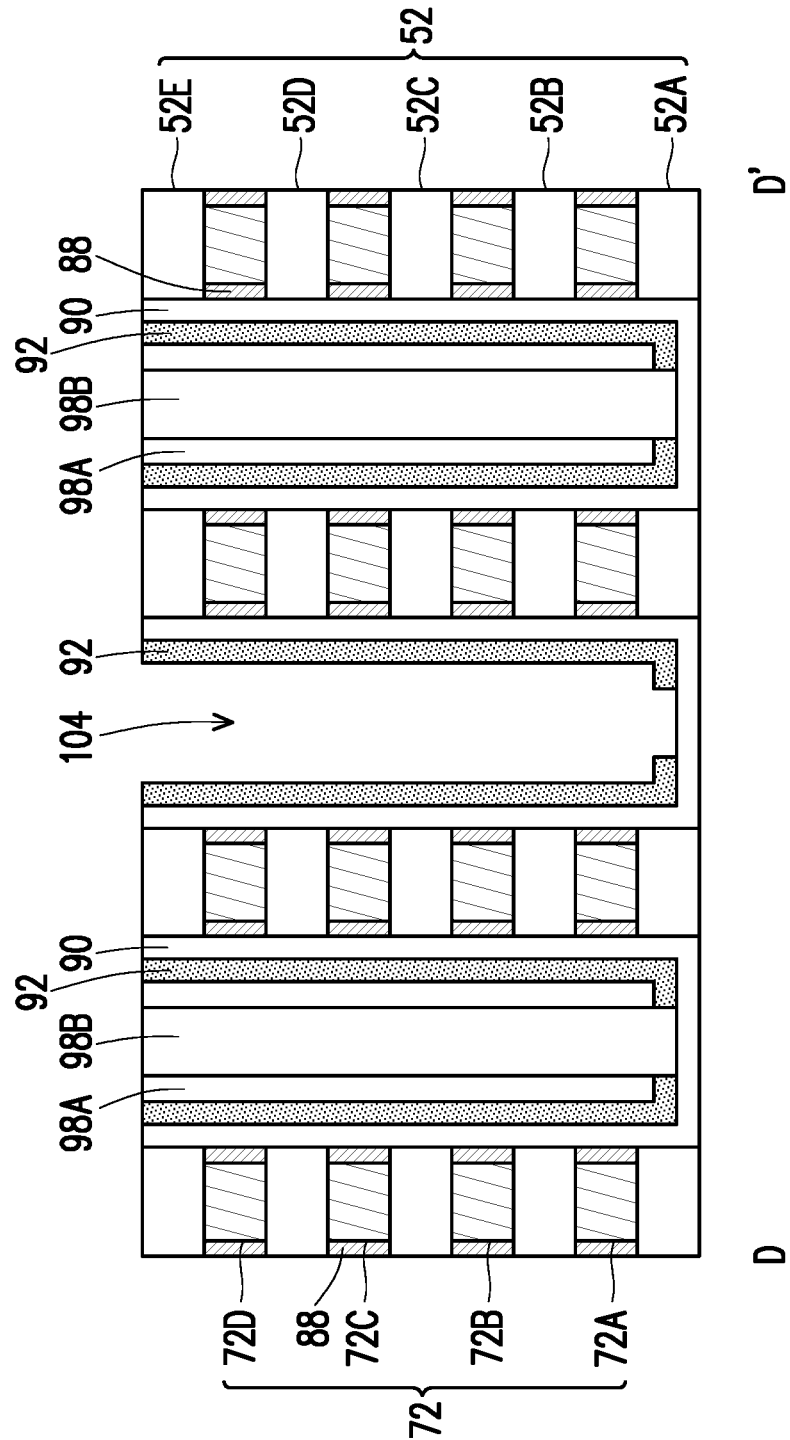
Figure 29A:
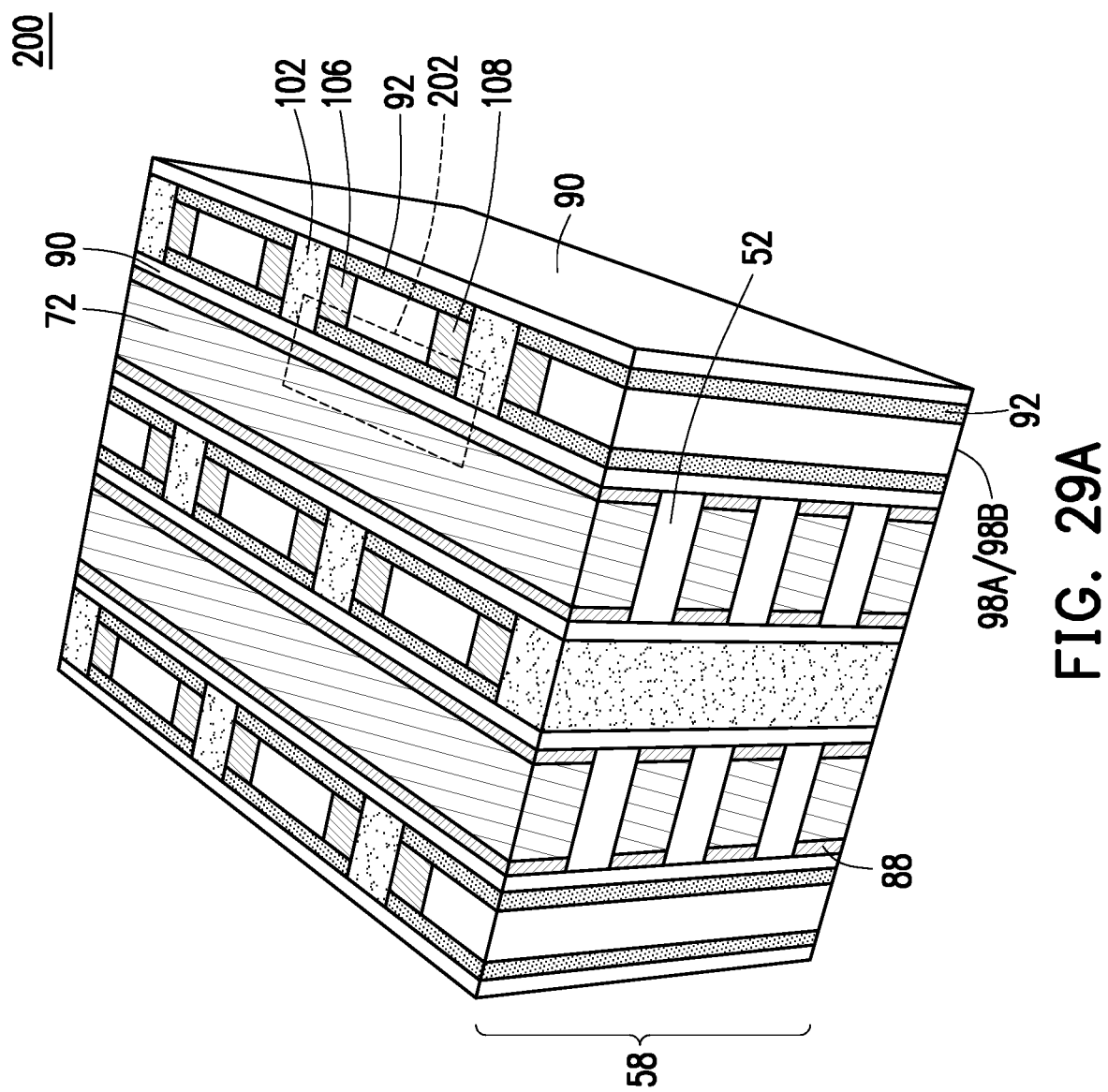
Figure 29B:
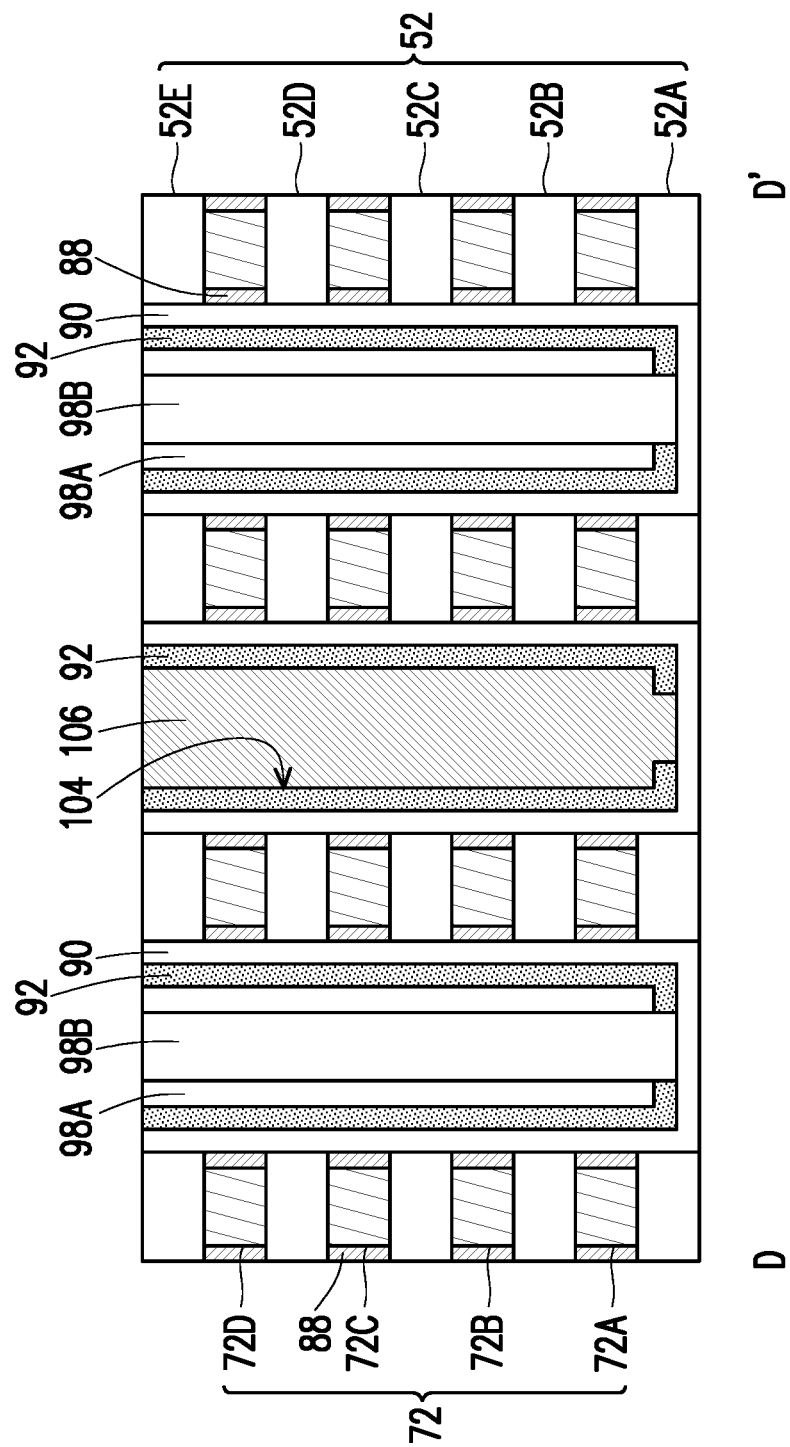

FIGS. 26A through 29B illustrate intermediate stages of manufacturing conductive pillars 106 and 108 (e.g., source/ drain pillars) in the ferroelectric memory device 200. The conductive pillars 106 and 108 may extend along a direction perpendicular to the conductive lines 72 such that individual cells of the ferroelectric memory device 200 may be selected for read and write operations. FIGS. 26A, 27A, 28A and 29A are illustrated in a partial three-dimensional view. In FIGS. 26B and 27B, cross-sectional views are provided along line C-C' of FIG. 1A. In FIGS. 28B and 29B, cross-sectional views are provided along line D-D' of FIG. 1A.

Figure 26A:
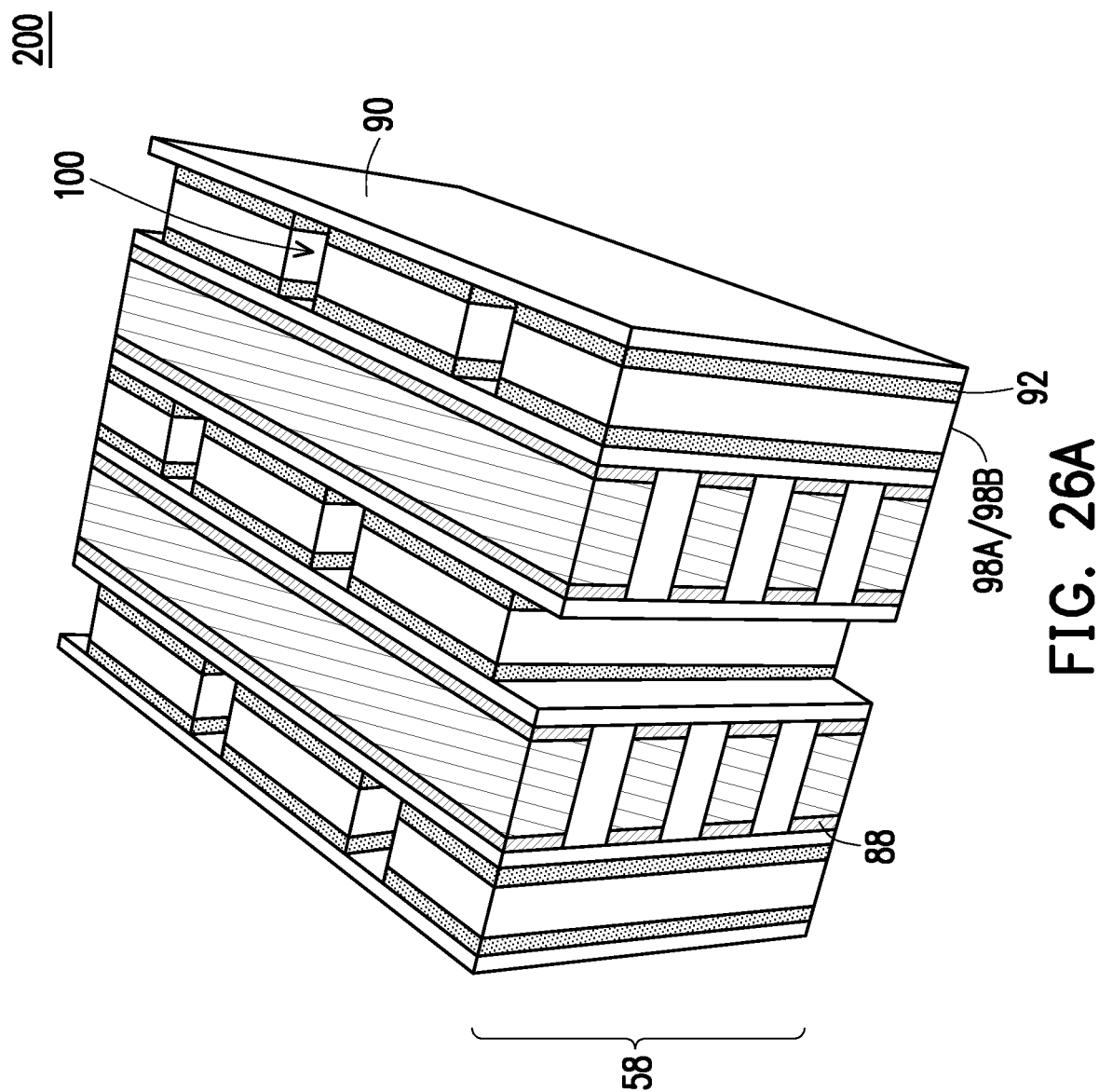
Figure 26B:
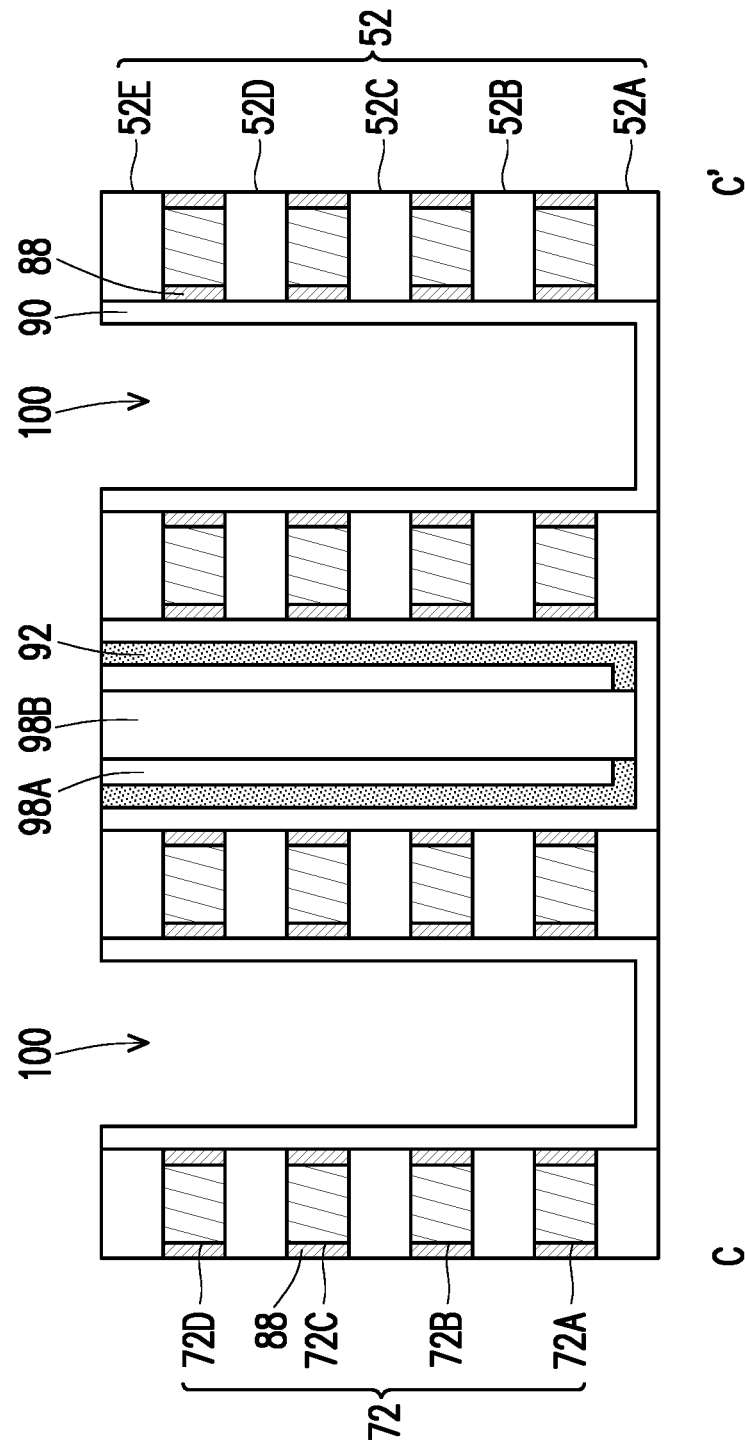

In FIGS. 26A and 26B, trenches 100 are patterned through the channel layer 92 and the dielectric materials 98A/98B. Patterning the trenches 100 may be performed through a combination of photolithography and etching, for example. The trenches 100 may be disposed between opposing sidewalls of the ferroelectric layer 90, and the trenches 100 may physically separate adjacent stacks of memory cells in the ferroelectric memory device 200 (see FIG. 1A).

In FIGS. 27A and 27B, isolation pillars 102 are formed in the trenches 100. In some embodiments, an isolation layer is deposited over the multi-layer stack 58 filling in the trenches 100. The isolation layer may include, for example, silicon oxide, silicon nitride, silicon oxynitride, or the like, which may be deposited by CVD, PVD, ALD, PECVD, or the like. The isolation layer may extend along sidewalls and bottom surfaces of the trenches 100 over the channel layer 92. After deposition, a planarization process (e.g., a CMP, etch back, or the like) may be performed to remove excess portions of the isolation layer. In the resulting structure, top surfaces of the multi-layer stack 58 (e.g., dielectric layer 52E), the ferroelectric layer 90, the channel layer 92, and the isolation pillars 102 may be substantially level (e.g., within process variations). In some embodiments, materials of the dielectric materials 98A/98B and isolation pillars 102 may be selected so that they may be etched selectively relative each other. For example, in some embodiments, the dielectric materials 98A/98B include oxide and the isolation pillars 102 include nitride. In some embodiments, the dielectric materials 98A/98B include nitride and the isolation pillars 102 include oxide. Other materials are also possible.

In FIGS. 28A and 28B, trenches 104 are defined for the subsequently formed the conductive pillars 106 and 108. The trenches 104 are formed by patterning the dielectric materials 98A/98B with a combination of photolithography and etching, for example. In some embodiments, as shown in FIG. 28A, a photoresist 118 is formed over the multi-layer stack 58, the dielectric materials 98A/98B, the isolation pillars 102, the channel layer 92, and the ferroelectric layer 90. In some embodiments, the photoresist 118 is patterned by an acceptable photolithography technique to define openings 120. Each of the openings 120 may expose the corresponding isolation pillar 102 and two separate regions of the dielectric materials 98A/98B beside the isolation pillar 102. In this way, each of the openings 120 may define a pattern of a conductive pillar 106 and an adjacent conductive pillar 108 that are separated by the isolation pillars 102.

Subsequently, portions of the dielectric materials 98A/98B exposed by the openings 120 may be removed by an acceptable etching process, such as by a dry etch (e.g., RIE, NBE, the like), a wet etch, the like, or a combination thereof. The etching may be anisotropic. The etching process may use an etchant that etches the dielectric materials 98A/98B without significantly etching the isolation pillars 102. As a result, even though the openings 120 expose the isolation pillars 102, the isolation pillars 102 may not be significantly removed. Patterns of the trenches 104 may correspond to the conductive pillars 106 and 108 (see FIGS. 29A and 29B). After the trenches 104 are patterned, the photoresist 118 may be removed by ashing, for example.

In FIGS. 29A and 29B, the trenches 104 are filled with a conductive material to form the conductive pillars 106 and 108. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106 and 108. In the resulting structure, top surfaces of the multi-layer stack 58 (e.g., the dielectric layer 52E), the ferroelectric layer 90, the channel layer 92, the conductive pillars 106, and the conductive pillars 108 may be substantially level (e.g., within process variations). In some embodiments, the conductive pillars 106 correspond to and are electrically connected to the bit lines in the memory array, and the conductive pillars 108 correspond to correspond to and are electrically connected to the source lines in the ferroelectric memory device 200.

Thus, stacked memory cells 202 may be formed in the ferroelectric memory device 200, as shown in FIG. 29A. Each memory cell 202 includes a gate electrode (e.g., a portion of a corresponding conductive line 72), a gate dielectric (e.g., a portion of a corresponding ferroelectric layer 90), a channel region (e.g., a portion of a corresponding channel layer 92), and source/drain pillars (e.g., portions of corresponding conductive pillars 106 and 108). The isolation pillars 102 isolates adjacent memory cells 202 in a same column and at a same vertical level. The memory cells 202 may be disposed in an array of vertically stacked rows and columns.

Figure 30A:
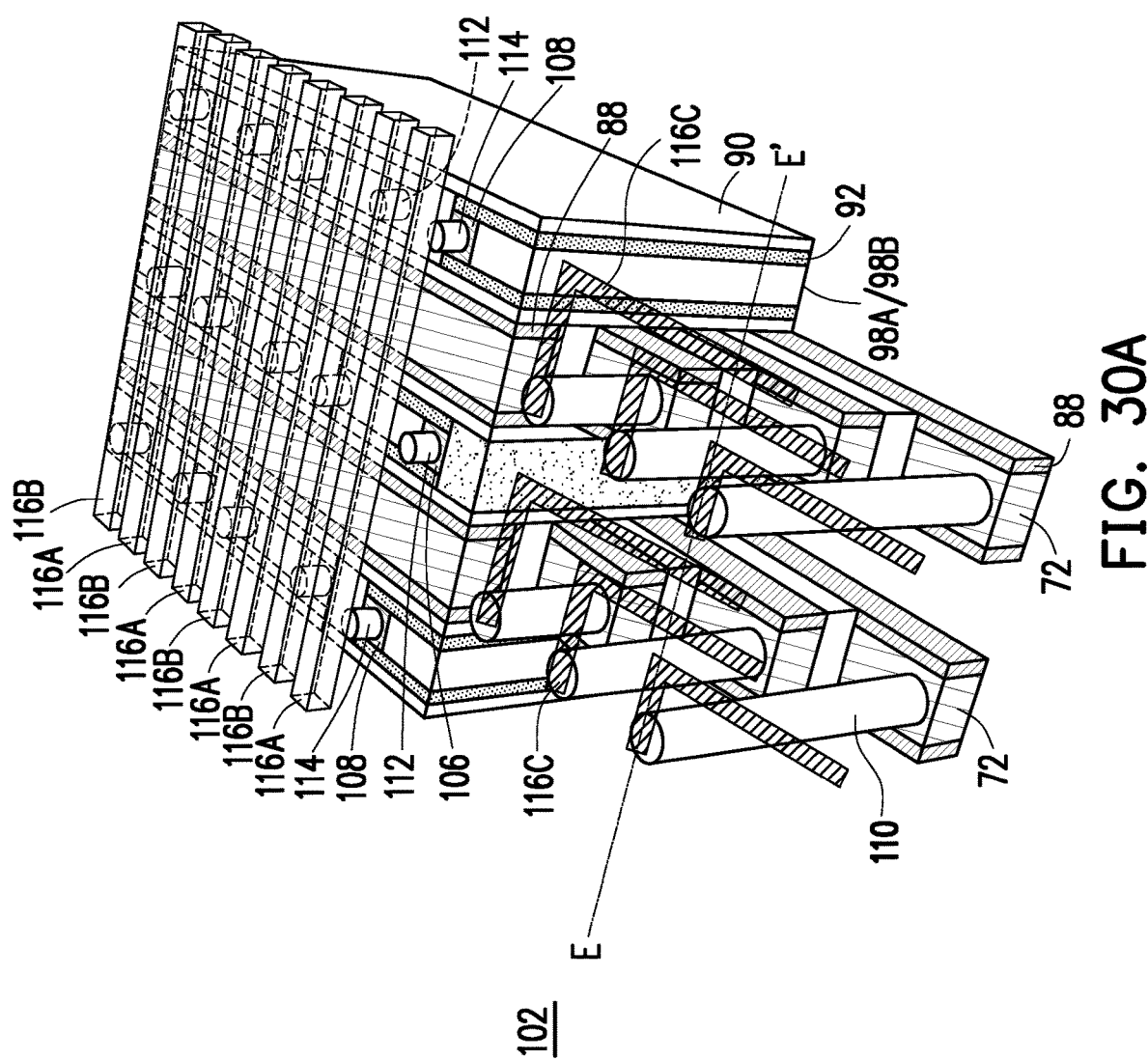
Figure 30B:
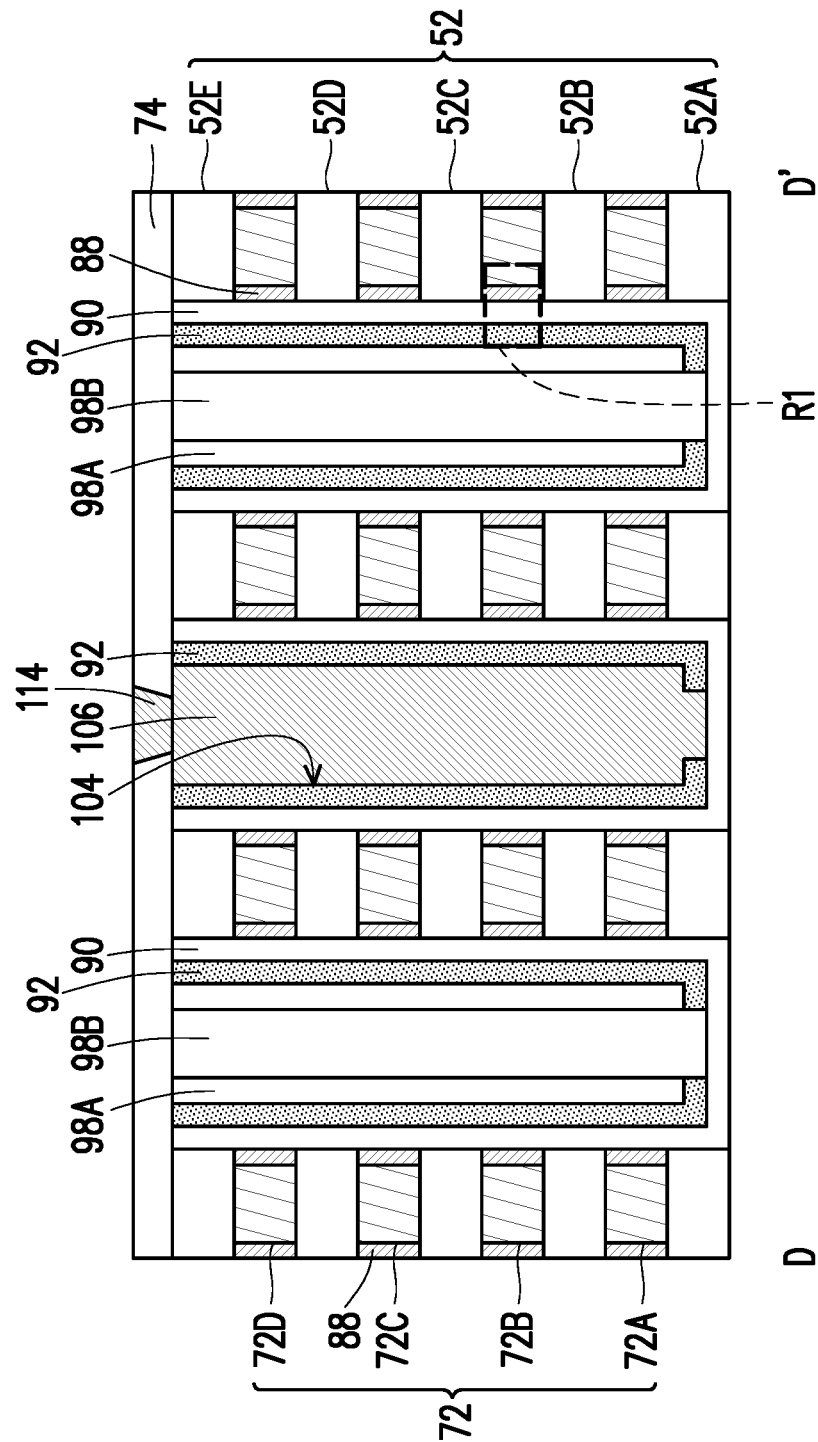
Figure 30C:
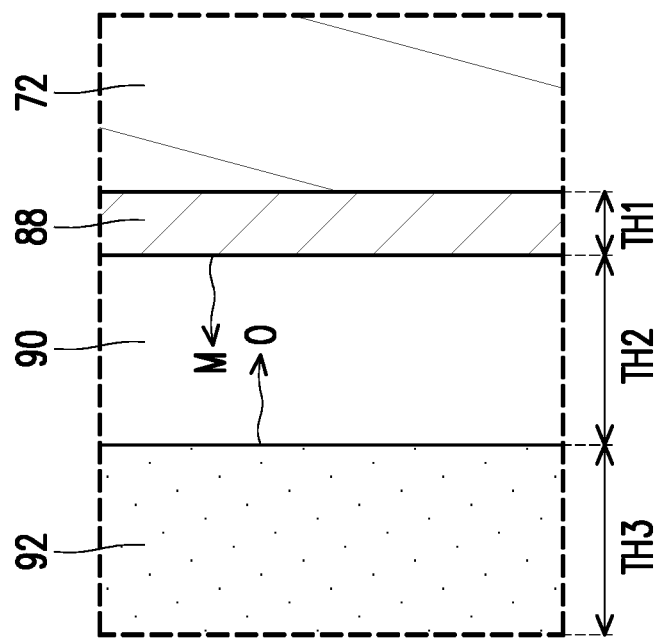
Figure 30D:
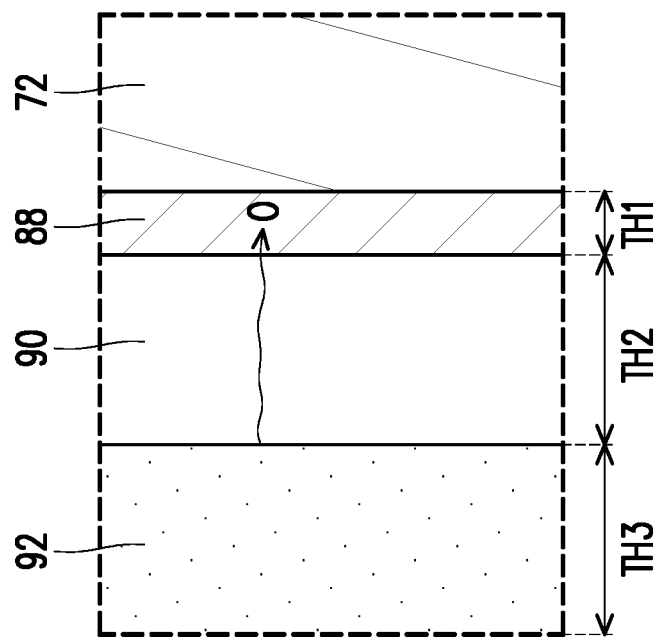
Figure 30E:
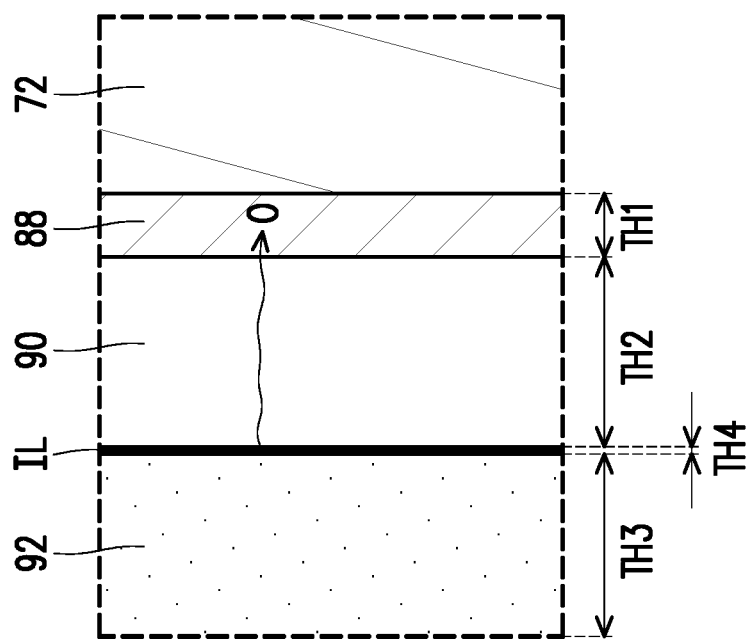
Figure 30F:
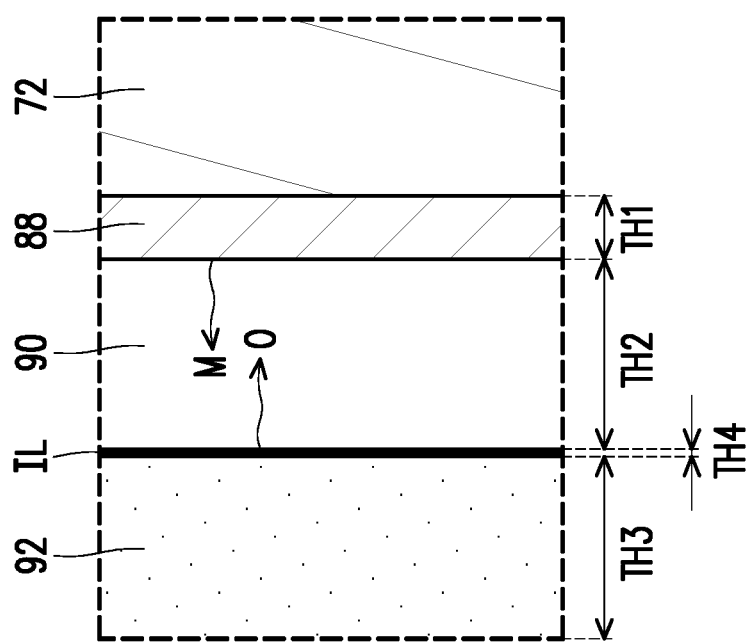
Figure 30G:
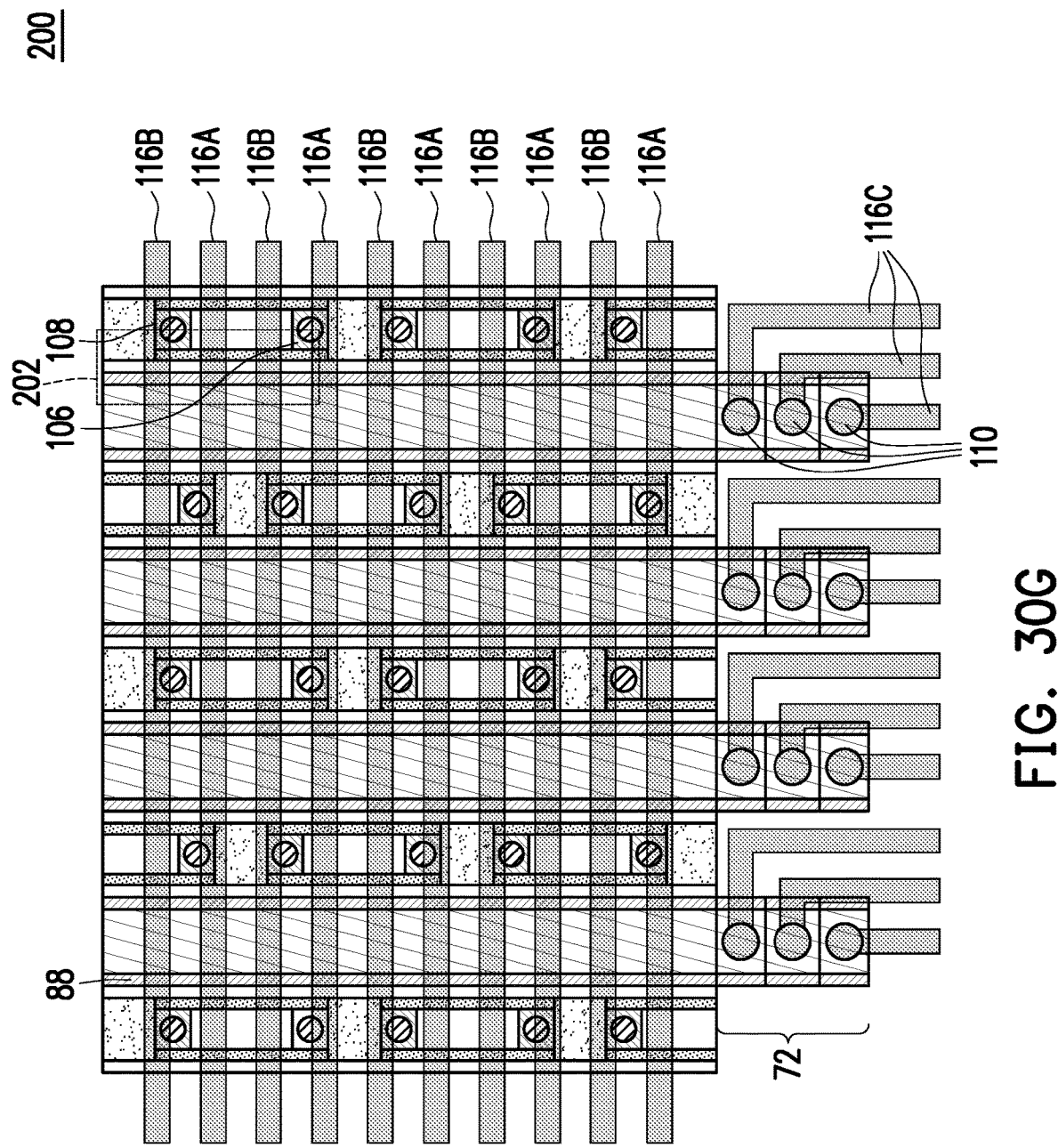
Figure 30H:
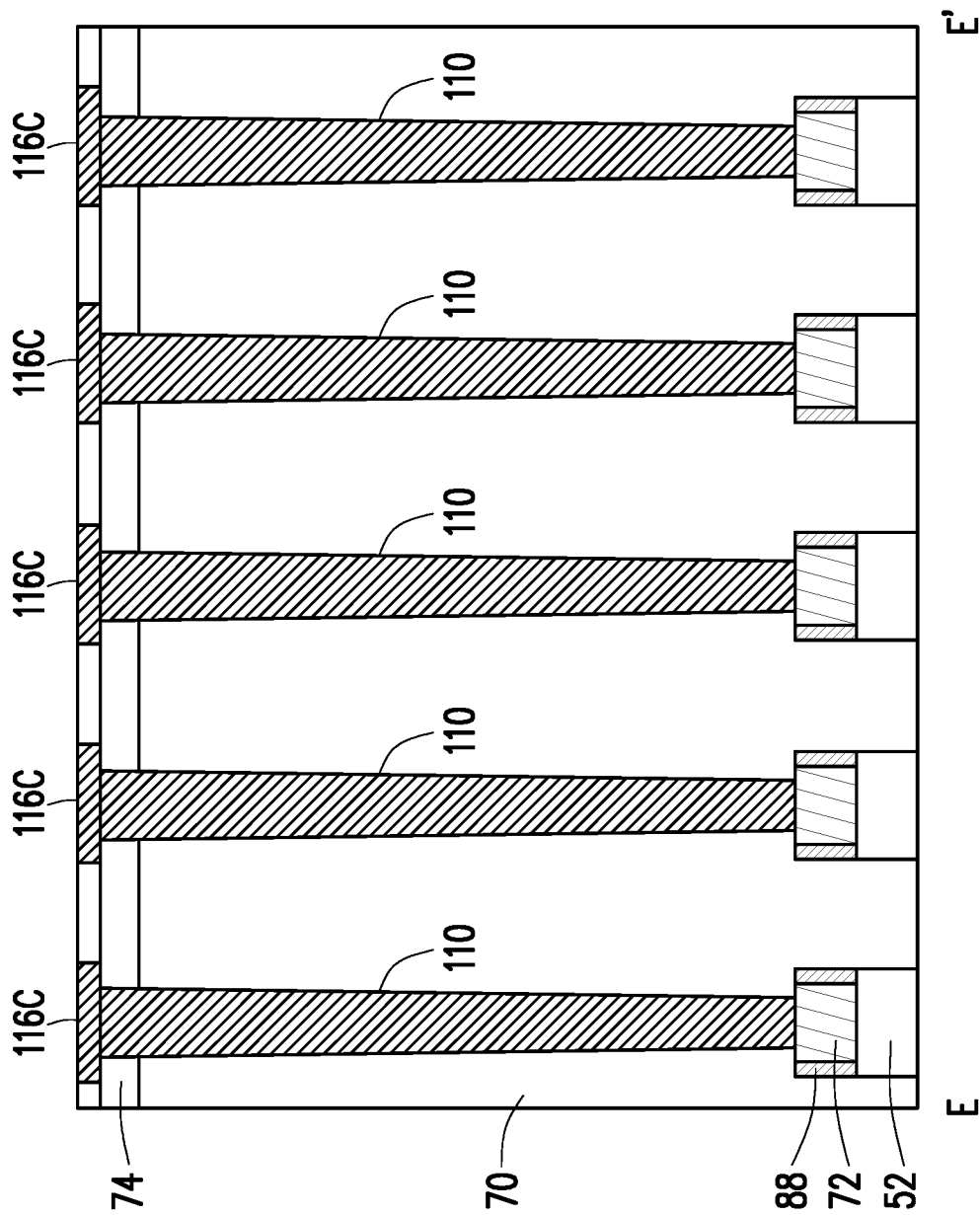
Figure 30I:
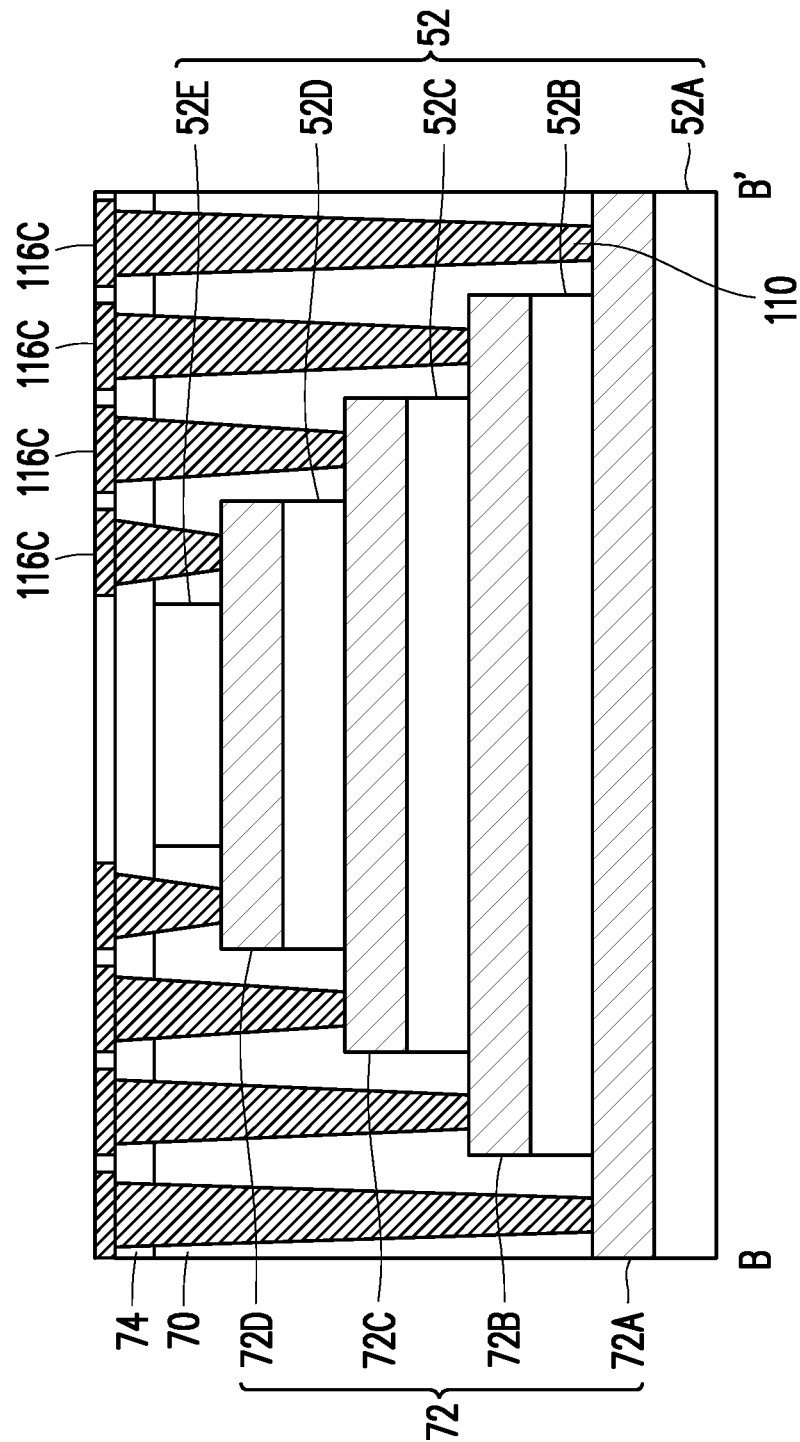

In FIGS. 30A, 30B, 30G, 30H, and 30I, an IMD 74 is formed on top surfaces of the multi-layer stack 58 (e.g., the dielectric layer 52E), the ferroelectric layer 90, the channel layer 92, the conductive pillars 106, and the conductive pillars 108 and the IMD 70. Conductive contacts 110, 112, and 114 are made on the conductive lines 72, the conductive pillars 106, and the conductive pillars 108, respectively. FIG. 30A illustrates a perspective view of the ferroelectric memory device 200. FIG. 30B illustrates a cross-sectional view of the device along line D-D' of FIG. 1A. FIGS. 30C to 30F illustrate different local enlarged views in a region R1 of FIG. 30B. FIG. 30G illustrates a top-down view of the ferroelectric memory device 200. FIG. 30H illustrates a cross-sectional view along the line E-E' of FIG. 30A. FIG. 30I illustrates a cross-sectional view of the device along line B-B' of FIG. 1A.

The IMD 74 may be formed of a dielectric material, and may be deposited by any suitable method, such as CVD, PECVD, flowable CVD (FCVD), or the like. The dielectric materials may include phospho-silicate glass (PSG), borosilicate glass (BSG), boron-doped phospho-silicate glass (BPSG), undoped silicate glass (USG), or the like. In some embodiments, the IMD 74 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD 74 to remove excess dielectric material over the multi-layer stack 58. In some embodiments, the removal process may be a planarization process, such as a chemical mechanical polish (CMP), an etch-back process, combinations thereof, or the like.

In some embodiments, the staircase shape of the conductive lines 72 may provide a surface on each of the conductive lines 72 for the conductive contacts 110 to land on. In some embodiments, forming the conductive contacts 110 may include patterning openings in the IMD 74 and IMD 70 to expose portions of the conductive lines 72 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove the excess material from the surface of the IMD 74. The remaining liner and conductive material form the conductive contacts 110 in the openings.

As also illustrated by the perspective view of FIG. 30A, conductive contacts 112 and 114 may also be made on the conductive pillars 106 and the conductive pillars 108, respectively. The conductive contacts 112, 114 and 110 may be electrically connected to conductive lines 116A, 116B, and 116C, respectively, which connect the memory array to an underlying/overlying circuitry (e.g., control circuitry) and/or signal, power, and ground lines in the semiconductor die. For example, as shown in FIG. 30H, the conductive contacts 110 may extend through the IMD 74 and IMD 70 to electrically connect conductive lines 116C to the conductive lines 72 and the underlying active devices one the substrate. Other conductive contacts or vias may be formed through the IMD 74 to electrically connect the conductive lines 116A and 116B to the underlying active devices one the substrate. Other conductive contacts or vias may extend through the ferroelectric memory device 200, such as through the isolation pillars 102 and the ferroelectric layer 90, and such conductive contacts or vias may be electrically coupled to underlying conductive features, such as the conductive features 322 of the interconnect structure 320. In alternate embodiments, routing and/or power lines to and from the memory array may be provided by an interconnect structure formed over the ferroelectric memory device 200 in addition to or in lieu of the interconnect structure 320. Accordingly, the ferroelectric memory device 200 may be completed.

FIGS. 30C to 30D illustrate local enlarged views of the region R1 of FIG. 30B, so as to describe the relation of the oxygen scavenging layer 88 with respect to the adjacent elements.

In some embodiments, as shown in FIG. 30C, when an oxygen scavenging layer 88 includes Hf, La, Al or a combination thereof, the oxygen scavenging layer 88 may absorb the oxygen from the undesired interfacial layer through a "direct scavenging mechanism". Specifically, a metal element M in the oxygen scavenging layer 88 and an oxygen element O at the interface between the ferroelectric layer 90 and the channel layer 92 are combined/reacted in the high-k ferroelectric layer 90. In other words, the oxygen at the interface between the ferroelectric layer 90 and the channel layer 92 can be absorbed and accordingly eliminated by the high-k layer (direct scavenging).

In other embodiments, as shown in FIG. 30D, when an oxygen scavenging layer 88 includes TiSiN (TSN), TiAl, Ti or a combination thereof, the oxygen scavenging layer 88 may absorb the oxygen from the undesired interfacial layer through a "remote scavenging mechanism". Specifically, an oxygen element O at the interface between the ferroelectric layer 90 and the channel layer 92 is scavenged by the oxygen scavenging layer 88 capping the conductive line 72. In other words, the oxygen at the interface between the ferroelectric layer 90 and the channel layer 92 can be absorbed and accordingly eliminated by the capped or doped gate electrode (remote scavenging). The oxygen scavenging layer 88 is regarded as part of the corresponding gate electrode (e.g., conductive line 72) in some examples.

In some embodiments, as shown in FIG. 30C and FIG. 30D, the oxygen scavenging layer 88 has a thickness TH1 ranging from about 1 to 10 nm, the ferroelectric layer 90 has a thickness TH2 ranging from about 1 to 20 nm, and the channel layer 92 has a thickness TH3 ranging from about 1 to 20 nm. In some embodiments, a thickness ratio of the ferroelectric layer 90 to each of the plurality of oxygen scavenging layers 88 is from about 1:1 to 20:1. In some embodiments, a thickness ratio of the channel layer 92 to each of the plurality of oxygen scavenging layers 88 is from about 1:1 to about 20:1

From another point of view, the oxygen scavenging layer 88 of the disclosure can be selected according to the Gibb's free energy change between two metal elements from the channel layer 92 and the oxygen scavenging layer 88, respectively. For example, the Gibb's free energy at 400° C. of $In_2O_3$ (about −117 kcal/gfw), $Ga_2O_3$ (about −145 kcal/gfw) or ZnO (about −145 kcal/gfw) is greater than the Gibb's free energy at 400° C. of $Al_2O_3$ (about −234 kcal/gfw) or HfO (about −238 kcal/gfw). The Gibb's free energy implies a degree of a simultaneous oxidation of a metal element based on the thermodynamics. The less the Gibb's free energy is, the easier the simultaneous oxidation of a metal element occurs. For example, the Gibb's free energy at 400° C. of $In_2O_3$ (about −117 kcal/gfw) is greater than the Gibb's free energy at 400° C. of HfO (about −238 kcal/gfw), so the Gibb's free energy between the HfO and $In_2O_3$ is negative, suggesting that Hf is an appropriate scavenging element for removing an oxide element from the channel layer 92.

In the embodiments of FIG. 30C and FIG. 30D, the memory cell of the memory device is formed as an interfacial-layer-free device. However, the disclosure is not limited thereto. In other embodiments, as shown in FIG. 30E and FIG. 30F, at least one of the memory cells of the memory device is formed having a very thin interfacial layer IL between the channel layer 92 and the ferroelectric layer 90. The interfacial layer IL of the memory device with an oxygen scavenging layer of the disclosure is much thinner than the conventional interfacial layer of the conventional device without an oxygen scavenging layer. In some embodiments, the interfacial layer IL has a thickness TH4 ranging from about 1 to 5 nm.

Although the embodiments of FIGS. 1 through 30I illustrate a particular pattern for the conductive pillars 106 and 108, other configurations are also possible. For example, in these embodiments, the conductive pillars 106 and 108 have a staggered pattern. However, in other embodiments, the conductive pillars 106 and 108 in a same row of the array are all aligned with each other, as shown in the ferroelectric memory device 200A of FIG. 32.

Figure 31:
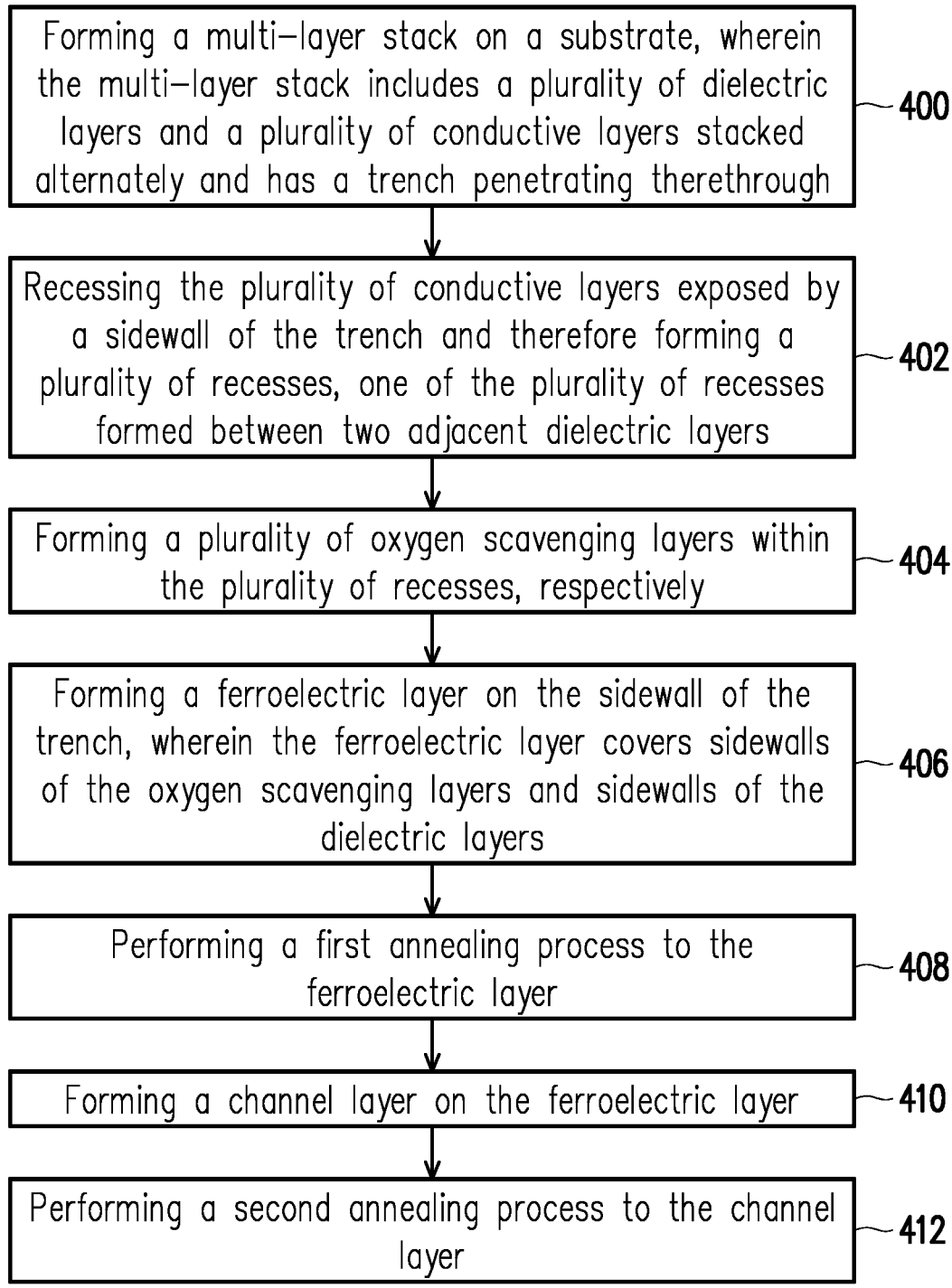
FIG. 31 illustrates a method of forming a ferroelectric memory device in accordance with some embodiments.

FIG. 31 illustrates a method of forming a ferroelectric memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 400, a multi-layer stack is formed on a substrate. The multi-layer stack includes a plurality of dielectric layers and a plurality of conductive layers stacked alternately and has a trench penetrating therethrough. FIG. 13 to FIG. 16B illustrate varying views corresponding to some embodiments of act 400.

At act 402, the plurality of conductive layers exposed by a sidewall of the trench are recessed and a plurality of recesses are therefore formed, and one of the plurality of recesses is formed between two adjacent dielectric layers. In some embodiments, recessing the dielectric layers includes performing an etching process, such as a lateral etching process. FIG. 17A to FIG. 17B illustrate varying views corresponding to some embodiments of act 402.

At act 404, a plurality of oxygen scavenging layers are formed within the plurality of recesses, respectively. In some embodiments, the method of forming the oxygen scavenging layer includes forming an oxygen scavenging material conformally and continuously on a sidewall of the multi-layer stack, and the oxygen scavenging material fills in the recesses. Thereafter, an etching back process is performed to the oxygen scavenging material to remove portions of the oxygen scavenging material on sidewalls of the dielectric layers of the multi-layer stack. FIG. 18A to FIG. 19B illustrate varying views corresponding to some embodiments of act 404.

At act 406, a ferroelectric layer is formed on the sidewall of the trench, wherein the ferroelectric layer covers sidewalls of the oxygen scavenging layers and sidewalls of the dielectric layers. FIG. 20A to FIG. 20B illustrate varying views corresponding to some embodiments of act 406.

At act 408, a first annealing process is performed to the ferroelectric layer. In some embodiments, the temperature range of the second annealing process ranges from about 350° C. to about 450° C. (e.g., 400° C.) so as to achieve a desired crystalline lattice structure for the oxygen scavenging layer. FIG. 20A to FIG. 20B illustrate varying views corresponding to some embodiments of act 408.

At act 410, a channel layer is formed on the ferroelectric layer. FIG. 21A to FIG. 21B illustrate varying views corresponding to some embodiments of act 408.

At act 412, a second annealing process is performed to the channel layer. FIG. 21A to FIG. 21B illustrate varying views corresponding to some embodiments of act 410.

Figure 33:
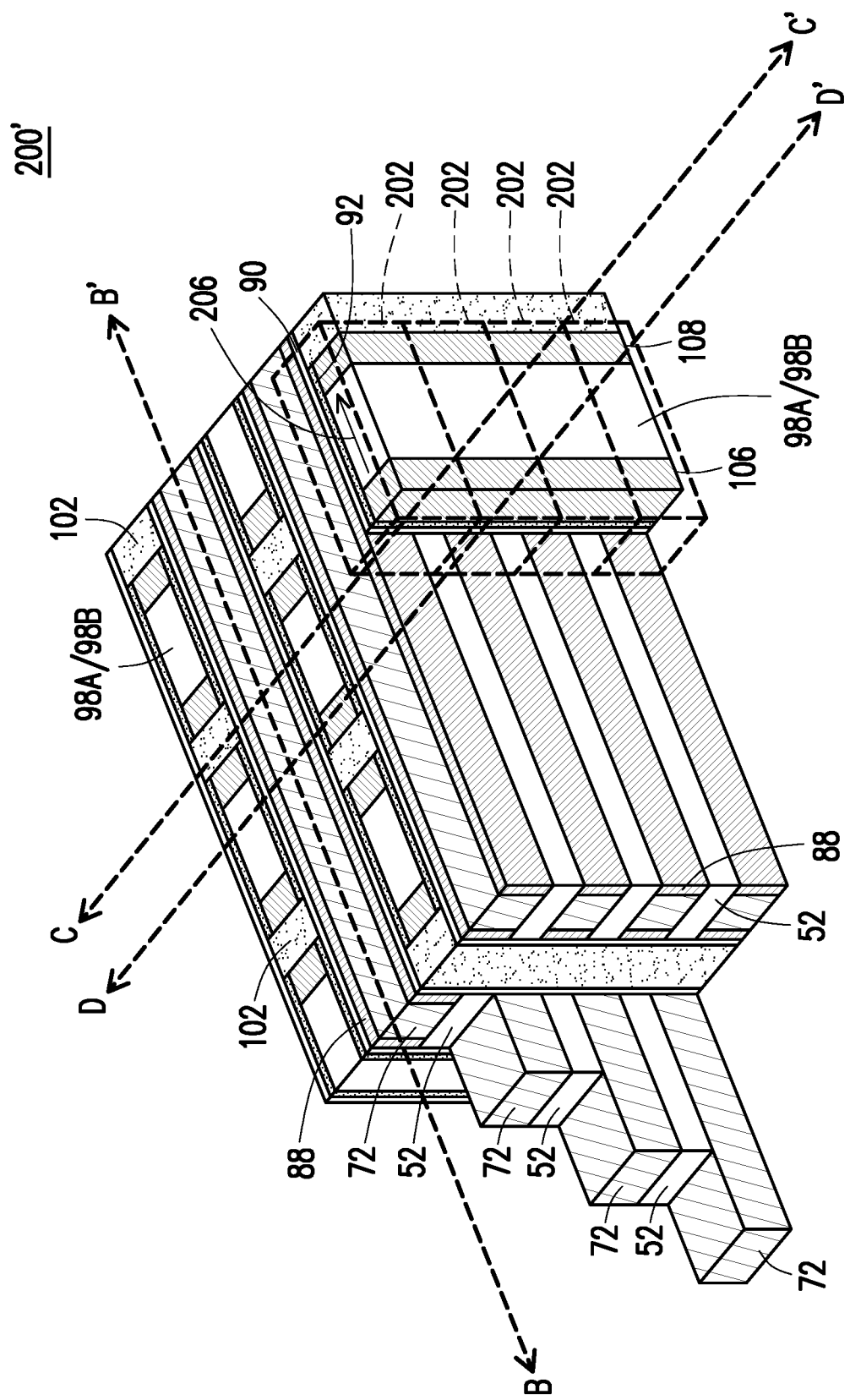
FIG. 33 illustrates a simplified perspective view of a ferroelectric memory device in accordance with some embodiments.

FIG. 33 illustrates a simplified perspective view of a ferroelectric memory device in accordance with some embodiments. The ferroelectric memory device 200' is similar to the ferroelectric memory device 200 of FIG. 1A, but the oxygen scavenging layers 88 are removed from the staircase-shaped region. Specifically, when the memory cells 202 are defined during the processes of FIG. 17A to FIG. 29A, the staircase structure maintains a bulk staircase structure rather than strip-shaped multiple staircase structures described above. Specifically, two bulk staircase structures are disposed at two sides of the memory cell region. After the memory cells 202 are defined, the two bulk staircase structures are divided into multiple strip-shaped staircase structures at two sides of the memory cell region.

The structures of the ferroelectric memory devices of the disclosure are described below with reference to FIG. 1A to FIG. 33.

In some embodiments, a ferroelectric memory device 200/200A/200' includes a multi-layer stack 58, a channel layer 92, a ferroelectric layer 90 and oxygen scavenging layers 88. The multi-layer stack 58 is disposed over a substrate 50 and includes a plurality of conductive layers (e.g., conductive lines 72) and a plurality of dielectric layers 52 stacked alternately. The channel layer 92 penetrates through the plurality of conductive layers (e.g., conductive lines 72) and the plurality of dielectric layers 52. The ferroelectric layer 90 is disposed between the channel layer 92 and each of the plurality of conductive layers (e.g., conductive lines 72) and the plurality of dielectric layers 52. The oxygen scavenging layers 88 include Hf, La, Al, TiSiN, TiAl, Ti or a combination thereof. One oxygen scavenging layer 88 is disposed between the ferroelectric layer 90 and each of the plurality of conductive layers (e.g., conductive lines 72). Each of the oxygen scavenging layers 88 may be a single layer or have a multi-layer structure. In some embodiments, the plurality of oxygen scavenging layers 88 have a thickness of about 1-10 nm.

In some embodiments, as shown in FIG. 20B, ends of the conductive layers (e.g., conductive lines 72) are recessed from ends of the dielectric layers 52. In some embodiments, the sidewalls of the oxygen scavenging layers 88 are substantially flush with the sidewalls of the dielectric layers 52. In some embodiments, the sidewalls of the oxygen scavenging layers 88 are concave or convex with respect to the sidewalls of the dielectric layers 52.

In some embodiments, the ferroelectric memory device is free of an undesired interfacial layer between the channel layer 92 and the ferroelectric layer 90, as shown in FIG. 30C and FIG. 30D. In some embodiments, an interface between the channel layer 92 and the ferroelectric layer 90 is free of oxygen atoms.

In other embodiments, the ferroelectric memory device further includes a very thin interfacial layer IL between the channel layer 92 and the ferroelectric layer 90, and an oxygen content of the interfacial layer IL is greater than an oxygen content of the channel layer 92. In some embodiments, the channel layer 92 includes ZnO, InWO, InGaZnO, InZnO, ITO or a combination thereof, and the interfacial layer IL includes oxygen-rich ZnO, InWO, InGaZnO, InZnO, ITO or a combination thereof. In some embodiments, the interfacial layer IL has a thickness of about 1-5 nm. The interfacial layer IL is so thin that the performance of the ferroelectric memory device is not affected.

In some embodiments, a ferroelectric memory device 200/200A/200' includes a multi-layer stack 58, a plurality of dielectric pillars (e.g., dielectric materials 98A/98B), an oxide semiconductor layer (e.g., channel layer 92), a ferroelectric layer 90 and a plurality of oxygen scavenging layers 88. The multi-layer stack 58 is disposed on a substrate 50 and includes a plurality of gate electrode layers (e.g., conductive lines 72) and a plurality of dielectric layers 52 stacked alternately. The plurality of dielectric pillars (e.g., dielectric materials 98A/98B) are disposed on the substrate 50 and penetrate through the multi-layer stack 58. The oxide semiconductor layer (e.g., channel layer 92) includes a first metal element and is disposed between the multi-layer stack 58 and each of the dielectric pillars (e.g., dielectric materials 98A/98B). The ferroelectric layer 90 is disposed between the oxide semiconductor layer (e.g., channel layer 92) and the multi-layer stack 58. The plurality of oxygen scavenging layers 88 include a second metal element, and one of the plurality of oxygen scavenging layers 88 is disposed between the ferroelectric layer 90 and each of the plurality of gate electrode layers (e.g., conductive lines 72). In some embodiments, a Gibb's free energy of an oxide of the second metal element is less than a Gibb's free energy of an oxide of the first metal element.

In some embodiments, the second metal element includes Hf, La, Al, Ti, Al or a combination thereof. In some embodiments, the oxygen scavenging layers 88 include Hf, La, Al, TiSiN, TiAl, Ti or a combination thereof.

In some embodiments, the first metal element includes Zn, In, W, Ga, Sn or a combination thereof. In some embodiments, the oxide semiconductor layer (e.g., channel layer 92) includes ZnO, InWO, InGaZnO, InZnO, ITO or a combination thereof.

In some embodiments, an oxygen density the plurality of oxygen scavenging layers 88 further includes an oxygen element. In some embodiments, an oxygen density in the plurality of oxygen scavenging layers 88 is increased towards the ferroelectric layer 90. The oxygen scavenging layers 88 are referred to as oxidized oxygen scavenging layers 88 in some examples.

In some embodiments, a ferroelectric memory device 200/200A/200' includes a multi-layer stack 58, a plurality of dielectric pillars (e.g., dielectric materials 98A/98B), a channel layer 92 and a ferroelectric layer 90. The multi-layer stack 58 is disposed on a substrate 50 and including a plurality of gate electrode layers (e.g., conductive lines 72) and a plurality of dielectric layers 52 stacked alternately. The dielectric pillars (e.g., dielectric materials 98A/98B) are disposed on the substrate 50 and penetrate through the multi-layer stack 58. The channel layer 92 is disposed between the multi-layer stack 58 and each of the dielectric pillars (e.g., dielectric materials 98A/98B). The ferroelectric layer 90 is disposed between the channel layer 92 and the multi-layer stack 58, wherein the ferroelectric layer 90 is in contact with each of the gate electrode layers (e.g., conductive lines 72) but separated from each of the dielectric layers 52.

In some embodiments, the ferroelectric memory device 200/200A/200' further includes a plurality of conductive pillars 106 and 108 disposed on the substrate 50 and penetrating through the multi-layer stack 58. In some embodiments, each of the plurality of dielectric pillars (e.g., dielectric materials 98A/98B) has two conductive pillars 106 and 108 disposed at two ends thereof.

Figure 32:
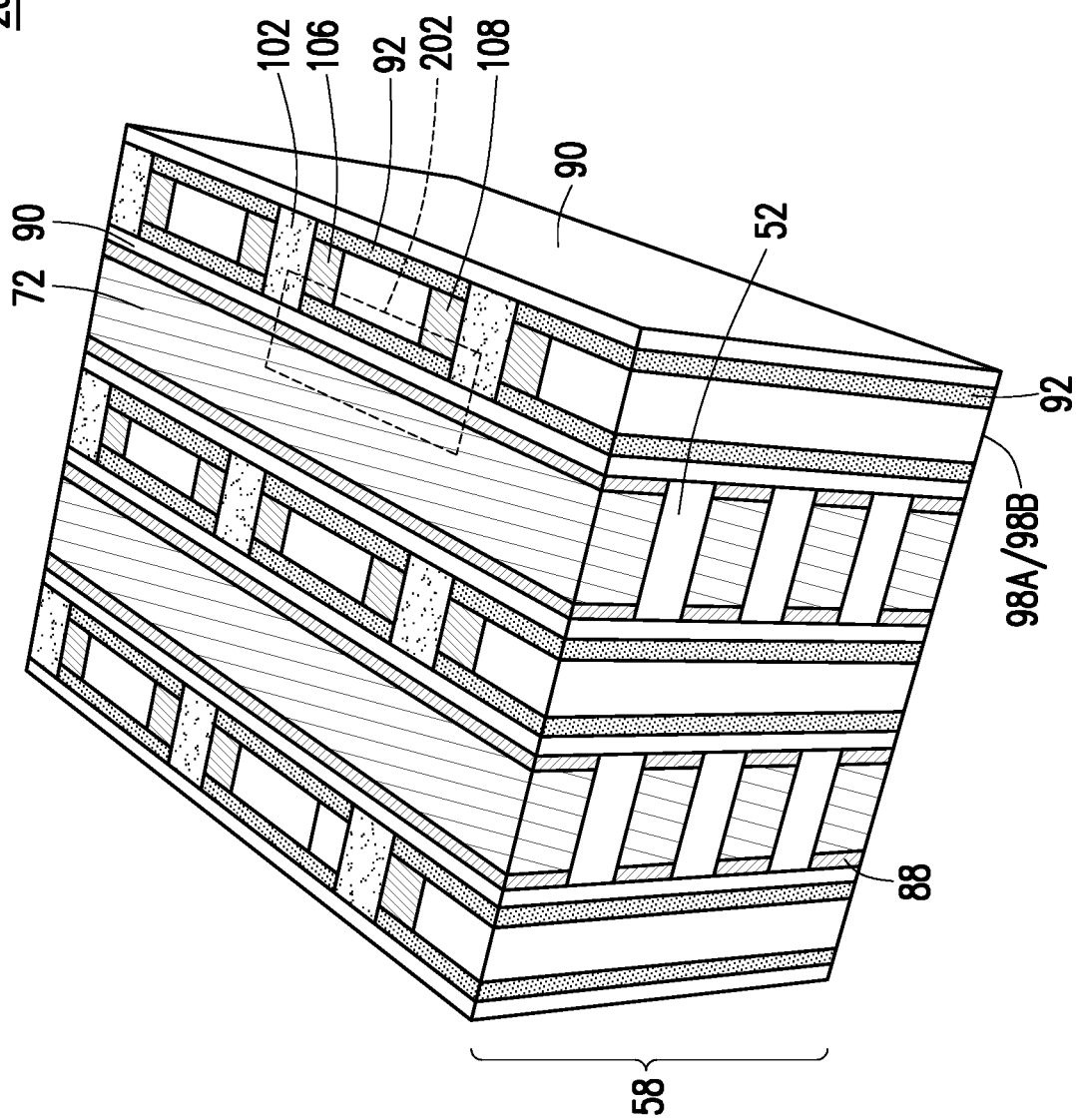
FIG. 32 illustrates a simplified perspective view of a ferroelectric memory device in accordance with some embodiments.

In some embodiments, the dielectric pillars (e.g., dielectric materials 98A/98B) are in a staggered arrangement. Specifically, the dielectric pillars of adjacent columns are arranged in a staggered manner, as shown in FIG. 29A. However, the disclosure is not limited thereto. In some embodiments, the dielectric pillars (e.g., dielectric materials 98A/98B) of adjacent columns are arranged in a regular array and aligned to each other, as shown in FIG. 32.

In some embodiments of the disclosure, the oxygen in the interface between the channel layer (e.g., oxide semiconductor layer) and the ferroelectric layer (e.g., metal oxide layer) can be absorbed and accordingly eliminated by an oxygen scavenging layer disposed between the ferroelectric layer and each conductive gate. Accordingly, an interfacial-layer-free memory device can be achieved and the oxide semiconductor surface channel quality can be improved.

In the above embodiments, the ferroelectric memory device is formed by a "staircase first process" in which the staircase structure is formed before the memory cells are formed. However, the disclosure is not limited thereto. In other embodiments, the ferroelectric memory device may be formed by a "staircase last process" in which the staircase structure is formed after the memory cells are formed.

In the above embodiments, the gate electrodes (e.g., word lines) are formed by depositing sacrificial dielectric layers followed by replacing sacrificial dielectric layers with conductive layers. However, the disclosure is not limited thereto. In other embodiments, the gate electrodes (e.g., word lines) may be formed in the first stage without a replacement step.

Many variations of the above examples are contemplated by the present disclosure. It is understood that different embodiments may have different advantages, and that no particular advantage is necessarily required of all embodiments.

In accordance with some embodiments of the present disclosure, a ferroelectric memory device includes a multi-layer stack, a channel layer, a ferroelectric layer and oxygen scavenging layers. The multi-layer stack is disposed on a substrate and includes a plurality of conductive layers and a plurality of dielectric layers stacked alternately. The channel layer penetrates through the plurality of conductive layers and the plurality of dielectric layers. The ferroelectric layer is disposed between the channel layer and each of the plurality of conductive layers and the plurality of dielectric layers. The oxygen scavenging layers include Hf, La, Al, TiSiN, TiAl, Ti or a combination thereof, and one of the oxygen scavenging layers is disposed between the ferroelectric layer and each of the plurality of conductive layers.

In accordance with alternative embodiments of the present disclosure, a ferroelectric memory device includes a multi-layer stack, a plurality of dielectric pillars, an oxide semiconductor layer, a ferroelectric layer and a plurality of oxygen scavenging layers. The multi-layer stack is disposed on a substrate and includes a plurality of gate electrode layers and a plurality of dielectric layers stacked alternately. The plurality of dielectric pillars are disposed on the substrate and penetrate through the multi-layer stack. The oxide semiconductor layer includes a first metal element and is disposed between the multi-layer stack and each of the dielectric pillars. The ferroelectric layer is disposed between the oxide semiconductor layer and the multi-layer stack. The plurality of oxygen scavenging layers include a second metal element, and one of the plurality of oxygen scavenging layers is disposed between the ferroelectric layer and each of the plurality of gate electrode layers. In some embodiments, a Gibb's free energy of an oxide of the second metal element is less than a Gibb's free energy of an oxide of the first metal element.

In accordance with yet alternative embodiments of the present disclosure, a method of forming a ferroelectric memory device includes following operations. A multi-layer stack is formed on a substrate. The multi-layer stack includes a plurality of dielectric layers and a plurality of conductive layers stacked alternately and has a trench penetrating therethrough. The conductive layers exposed by a sidewall of the trench are recessed, so that a recess is formed between the two adjacent dielectric layers. A plurality of oxygen scavenging layers are formed within the plurality of recesses, respectively. A ferroelectric layer is formed on the sidewall of the trench, wherein the ferroelectric layer covers sidewalls of the oxygen scavenging layers and sidewalls of the dielectric layers. A channel layer is formed on the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric memory device, comprising:
a multi-layer stack disposed on a substrate and comprising a plurality of conductive layers and a plurality of dielectric layers stacked alternately;
a channel layer penetrating through the plurality of conductive layers and the plurality of dielectric layers;
a ferroelectric layer disposed between the channel layer and both of the plurality of conductive layers and the plurality of dielectric layers; and
a plurality of oxygen scavenging layers disposed along sidewalls of the plurality of conductive layers, wherein the plurality of oxygen scavenging layers laterally separate the ferroelectric layer from the plurality of conductive layers.

2. The ferroelectric memory device of claim 1, wherein ends of the conductive layers are recessed from ends of the dielectric layers.

3. The ferroelectric memory device of claim 1, wherein sidewalls of the oxygen scavenging layers are substantially flush with sidewalls of the plurality of dielectric layers.

4. The ferroelectric memory device of claim 1, wherein the plurality of oxygen scavenging layers are respectively disposed between adjacent ones of the plurality of dielectric layers.

5. The ferroelectric memory device of claim 1, wherein the channel layer comprises zinc oxide (ZnO), indium tungsten oxide (InWO), indium gallium zinc oxide (InGaZnO), indium zinc oxide (InZnO), indium tin oxide (ITO), or a combination thereof.

6. The ferroelectric memory device of claim 1, further comprising:
an interfacial layer between the channel layer and the ferroelectric layer, an oxygen content of the interfacial layer being greater than an oxygen content of the channel layer.

7. The ferroelectric memory device of claim 6, wherein the ferroelectric layer continuously and vertically extends past two or more of the plurality of oxygen scavenging layers.

8. A ferroelectric memory device, comprising:
a multi-layer stack disposed on a substrate and comprising a plurality of gate electrode layers and a plurality of dielectric layers stacked alternately;
a plurality of dielectric pillars disposed on the substrate and penetrating through the multi-layer stack;
an oxide semiconductor layer comprising a first metal element and disposed between the multi-layer stack and each of the plurality of dielectric pillars; and
a ferroelectric layer disposed between the oxide semiconductor layer and the multi-layer stack; and
a plurality of oxygen scavenging layers comprising a second metal element, one of the plurality of oxygen scavenging layers disposed between the ferroelectric layer and each of the plurality of gate electrode layers.

9. The ferroelectric memory device of claim 8, wherein the ferroelectric layer continuously extends past two or more of the plurality of oxygen scavenging layers.

10. The ferroelectric memory device of claim 8, further comprising:
a second plurality of dielectric pillars disposed on the substrate and penetrating through the multi-layer stack;
a second oxide semiconductor layer disposed between the multi-layer stack and each of the second plurality of dielectric pillars;
a second ferroelectric layer disposed between the second oxide semiconductor layer and the multi-layer stack; and
second plurality of oxygen scavenging layers disposed between the second ferroelectric layer and each of the plurality of gate electrode layers.

11. The ferroelectric memory device of claim 8, wherein the plurality of oxygen scavenging layers further comprise an oxygen element.

12. The ferroelectric memory device of claim 8, wherein an oxygen density in the plurality of oxygen scavenging layers is increased towards the ferroelectric layer.

13. The ferroelectric memory device of claim 8, wherein a Gibb's free energy of an oxide of the second metal element is less than a Gibb's free energy of an oxide of the first metal element.

14. The ferroelectric memory device of claim 8, wherein the plurality of dielectric layers vertically separate adjacent ones of the plurality of oxygen scavenging layers.

15. The ferroelectric memory device of claim 8, wherein an interface between the oxide semiconductor layer and the ferroelectric layer is substantially free of oxygen atoms.

16. The ferroelectric memory device of claim 8, further comprising:
a plurality of conductive pillars disposed on the substrate and penetrating through the multi-layer stack, wherein each of the plurality of dielectric pillars has two conductive pillars disposed along opposing sides thereof.

17. A ferroelectric memory device, comprising:
a plurality of dielectric layers alternatively stacked with a plurality of conductive layers;
an oxide semiconductor layer disposed along sides of the plurality of conductive layers and the plurality of dielectric layers;
a ferroelectric layer disposed along a sidewall of the oxide semiconductor layer; and
a plurality of oxygen scavenging layers disposed vertically between adjacent ones of the plurality of dielectric layers and laterally between the ferroelectric layer and each of the plurality of conductive layers, wherein a center of a first oxygen scavenger layer of the plurality of oxygen scavenging layers is directly below a lower surface of an overlying one of the plurality of dielectric layers.

18. The ferroelectric memory device of claim 17, wherein the first oxygen scavenger layer physically contacts one of the plurality of conductive layers.

19. The ferroelectric memory device of claim 17, wherein the first oxygen scavenger layer has an outermost sidewall that faces away from a closest one of the plurality of conductive layers, the outermost sidewall of the first oxygen scavenger layer being laterally aligned with an outermost sidewall of the plurality of dielectric layers.

20. The ferroelectric memory device of claim 17, wherein the first oxygen scavenger layer physically contacts the adjacent ones of the plurality of dielectric layers.

* * * * *